(12) United States Patent
Matsui et al.

(10) Patent No.: US 8,305,310 B2
(45) Date of Patent: Nov. 6, 2012

(54) DISPLAY DEVICE AND METHOD OF CONTROLLING THE SAME

(75) Inventors: Masafumi Matsui, Kyoto (JP); Shinya Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/443,233

(22) Filed: Apr. 10, 2012

(65) Prior Publication Data

US 2012/0194576 A1 Aug. 2, 2012

Related U.S. Application Data

(63) Continuation of application No. PCT/JP2010/005466, filed on Sep. 6, 2010.

(51) Int. Cl.
*G09G 3/30* (2006.01)
(52) U.S. Cl. ............................................ 345/78; 345/76
(58) Field of Classification Search .............. 345/76–83, 345/204–215, 690–699; 315/169.1–169.4
See application file for complete search history.

(56) References Cited

U.S. PATENT DOCUMENTS

| | | | |
|---|---|---|---|
| 7,133,012 B2 | 11/2006 | Abe | |
| 7,397,447 B2 * | 7/2008 | Matsumoto | 345/76 |
| 7,525,522 B2 | 4/2009 | Iida et al. | |
| 7,626,565 B2 | 12/2009 | Tsuge | |
| 7,907,137 B2 | 3/2011 | Shirasaki et al. | |
| 8,018,404 B2 | 9/2011 | Ono | |
| 8,054,298 B2 | 11/2011 | Asano et al. | |
| 2004/0233141 A1 * | 11/2004 | Matsumoto | 345/76 |
| 2005/0145891 A1 | 7/2005 | Abe | |
| 2006/0221015 A1 | 10/2006 | Shirasaki et al. | |
| 2006/0232612 A1 | 10/2006 | Tsuge | |
| 2006/0290611 A1 | 12/2006 | Tsuge | |
| 2007/0008250 A1 * | 1/2007 | Hoppenbrouwers et al. | 345/76 |
| 2008/0036708 A1 * | 2/2008 | Shirasaki et al. | 345/76 |
| 2008/0111774 A1 | 5/2008 | Iida et al. | |
| 2008/0246785 A1 * | 10/2008 | Shirasaki et al. | 345/690 |

(Continued)

FOREIGN PATENT DOCUMENTS

JP 2003-186439 7/2003

(Continued)

OTHER PUBLICATIONS

International Search Report, dated Oct. 19, 2010, for parent International Application No. PCT/JP2010/005466.

*Primary Examiner* — Alexander Eisen
*Assistant Examiner* — Patrick F Marinelli
(74) *Attorney, Agent, or Firm* — Greenblum & Bernstein, P.L.C.

(57) ABSTRACT

A display device including pixels has formed therein at least two driving blocks each made up of pixel rows, and includes: a signal line driving circuit that outputs a signal voltage to an output line disposed in each of pixel columns; and a selector circuit that provides a signal voltage outputted from the output line to one of a first signal line and a second signal line which are provided in each of the columns, provides a standard voltage from a standard voltage source to one of the two signal lines, and provides the signal voltage and the standard voltage mutually exclusively to the two signal lines. Each of the pixels includes a current control unit and an organic EL element. Pixels in the k-th driving block are connected to the first signal line and pixels in the (k+1)-th driving block are connected to the second signal line.

10 Claims, 30 Drawing Sheets

U.S. PATENT DOCUMENTS

| | | | |
|---|---|---|---|
| 2009/0002354 A1 | 1/2009 | Toyomura et al. | |
| 2009/0207160 A1* | 8/2009 | Shirasaki et al. | 345/212 |
| 2009/0244055 A1* | 10/2009 | Asano et al. | 345/214 |
| 2010/0007645 A1 | 1/2010 | Ono | |
| 2010/0259531 A1 | 10/2010 | Ono | |
| 2011/0164024 A1 | 7/2011 | Ono | |
| 2011/0181192 A1* | 7/2011 | Ono | 315/169.3 |
| 2011/0285760 A1 | 11/2011 | Ono | |
| 2012/0062618 A1* | 3/2012 | Ono | 345/690 |
| 2012/0169799 A1* | 7/2012 | Ono | 345/690 |

FOREIGN PATENT DOCUMENTS

| | | |
|---|---|---|
| JP | 2006-284716 | 10/2006 |
| JP | 2007-263989 | 10/2007 |
| JP | 2008-122632 | 5/2008 |
| JP | 2008-122633 | 5/2008 |
| JP | 2009-8874 | 1/2009 |
| JP | 2009-15276 | 1/2009 |
| JP | 2009-237041 | 10/2009 |
| WO | 2003/063124 | 7/2003 |
| WO | 2006/104259 | 10/2006 |
| WO | 2008/152817 | 12/2008 |
| WO | 2010/041426 | 4/2010 |
| WO | 2010/100938 | 9/2010 |
| WO | 2010/137268 | 12/2010 |

* cited by examiner

Pixel in odd-numbered block

Pixel in even-numbered block

FIG. 5
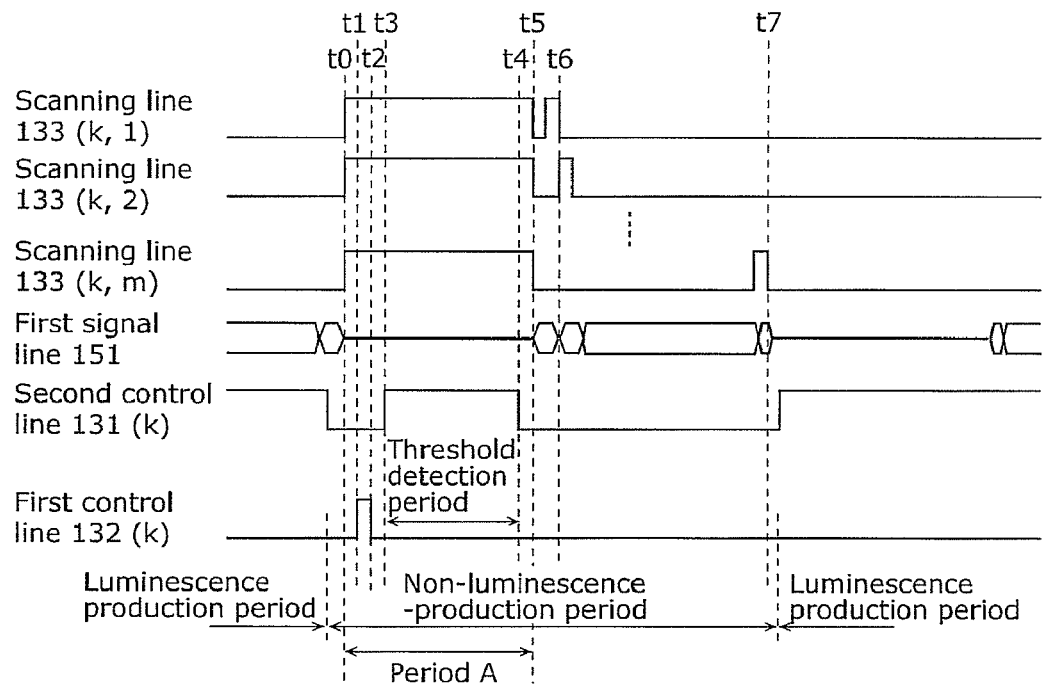
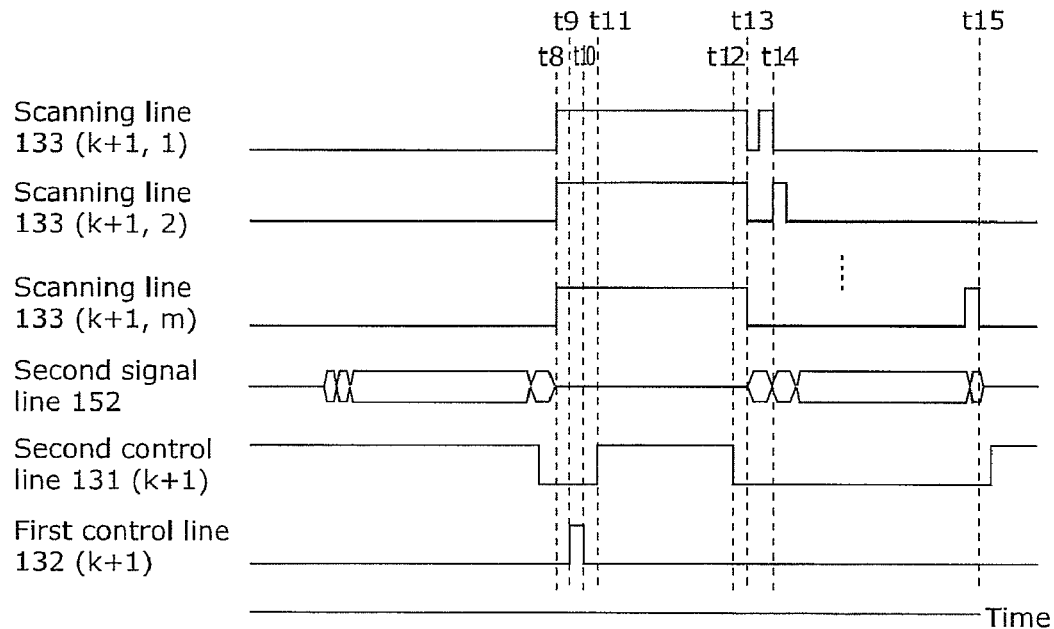

Pixel in odd-numbered block

Pixel in even-numbered block

Pixel in odd-numbered block

Pixel in even-numbered block

Pixel in odd-numbered block

Pixel in even-numbered block

DISPLAY DEVICE AND METHOD OF CONTROLLING THE SAME

CROSS REFERENCE TO RELATED APPLICATION

This is a continuation application of PCT Patent Application No. PCT/JP2010/005466 filed on Sep. 6, 2010, designating the United States of America. The entire disclosure of the above-identified application, including specification, drawings and claims is incorporated herein by reference in its entirety.

BACKGROUND OF THE INVENTION (1) Field of the Invention

The present invention relates to display devices and to methods of controlling the same, and particularly relates to a display device using a current-driven luminescence element and to a method of controlling the same.

(2) Description of the Related Art

Display devices using organic electroluminescence (EL) elements are well-known as display devices using current-driven luminescence elements. An organic EL display device using such self-luminous organic EL elements does not require backlights needed in a liquid crystal display device and is best suited for increasing device thinness. Furthermore, since viewing angle is not restricted, practical application as a next-generation display device is expected. Furthermore, the organic EL elements used in the organic EL display device are different from liquid crystal cells which are controlled according to the voltage applied thereto, in that the luminance of the respective luminescence elements is controlled according to the value of the current flowing thereto.

In the organic EL display device, the organic EL elements included in the pixels are normally arranged in rows and columns. In an organic EL display referred to as a passive-matrix organic EL display, an organic EL element is provided at each crosspoint between row electrodes (scanning lines) and column electrodes (data lines), and such organic EL elements are driven by applying a voltage equivalent to a data signal, between a selected row electrode and the column electrodes.

On the other hand, in an organic EL display device referred to as an active-matrix organic EL display device, a switching thin film transistor (TFT) is provided in each crosspoint between scanning lines and data lines, the gate of a driving element is connected to the switching TFT, the switching TFT is turned ON through a selected scanning line so as to input a data signal from a signal line to the driving element, and an organic EL element is driven by such driving element.

In the passive-matrix organic EL display device, only during the period in which each of the row electrodes (scanning lines) is selected does the organic EL element connected to the selected row electrode produce luminescence. In contrast, in the active-matrix organic EL display device, it is possible to cause the organic EL element to produce luminescence until a subsequent scan (selection). As such, a reduction in the luminance of the display is not incurred even when the number of scanning lines increases. Therefore, the active-matrix organic EL display device can be driven with low voltage and thus allows for reduced power consumption. However, in the active-matrix organic EL display device, due to variation in the characteristics of the driving transistors, the current flowing to the organic EL elements are different among the respective pixels thereby causing differences in luminance even when the same data signal is supplied, and thus there is the disadvantage of the occurrence of luminance unevenness.

In response to this problem, for example, Patent Reference 1 (Japanese Unexamined Patent Application Publication No. 2008-122633) discloses a method of compensating for the variation of characteristics for each pixel using a simple pixel circuit, as a method of compensating for the luminance unevenness caused by the variation in the characteristics of the driving transistors.

FIG. 29 is a block diagram showing the configuration of a conventional display device disclosed in Patent Reference 1. An image display device 500 shown in the figure includes a pixel array unit 502 and a drive unit which drives the pixel array unit 502. The pixel array unit 502 includes scanning lines 701 to 70m disposed on a row basis, and signal lines 601 to 60n disposed on a column basis, pixels 501 each of which is disposed on a part at which both a scanning line and a signal line cross, and power supply lines 801 to 80m disposed on a row basis. Furthermore, the drive unit includes a signal selector 503, a scanning line drive unit 504, and a power supply line drive unit 505.

The scanning line drive unit 504 performs line-sequential scanning of the pixels 501 on a per row basis, by sequentially supplying control signals on a horizontal cycle (1 H) to each of the scanning lines 701 to 70m. The power supply line drive unit 505 supplies, to each of the power supply lines 801 to 80m, power source voltage that switches between a first voltage and a second voltage, in accordance with the line-sequential scanning. The signal selector 503 supplies, to the signal lines 601 to 60n that are in columns, a standard voltage and a signal voltage which serves as an image signal, switching between the two voltages in accordance with the line-sequential scanning.

Here, two each of the respective signal lines 601 to 60n in columns are disposed per column; one of the signal lines supplies the standard voltage and the signal voltage to the pixels 501 in an odd row, and the other of the signal lines supplies the standard voltage and the signal voltage to the pixels 501 in an even row.

FIG. 30 is a circuit configuration diagram for a pixel included in the conventional display device disclosed in Patent Reference 1. It should be noted that the figure shows the pixel 501 in the first row and the first column. The scanning line 701, the power supply line 801, and the signal line 601 are provided to this pixel 501. It should be noted that one out of the two lines of the signal lines 601 is connected to this pixel 501. The pixel 501 includes a switching transistor 511, a driving transistor 512, a holding capacitive element 513, and a luminescence element 514. The switching transistor 511 has a gate connected to the scanning line 701, one of a source and a drain connected to the signal line 601, and the other connected to the gate of the driving transistor 512. The driving transistor 512 has a source connected to the anode of the luminescence element 514 and a drain connected to the power supply line 801. The luminescence element 514 has a cathode connected to a grounding line 515. The holding capacitive element 513 is connected to the source and gate of the driving transistor 512.

In the above-described configuration, the power supply line drive unit 505 switches the voltage of the power supply line 801, from a first voltage (high-voltage) to a second voltage (low-voltage), when the voltage of the signal line 601 is the standard voltage. Likewise, when the voltage of the signal line 601 is the standard voltage, the scanning line drive unit 504 sets the voltage of the scanning line 701 to an "H" level and causes the switching transistor 511 to be in a conductive state so as to apply the standard voltage to the gate of the driving transistor 512 and set the source of the driving transistor 512 to the second voltage which is a reset voltage. With the above-described operation, preparation for the correction of a threshold voltage $V_{th}$ of the driving transistor 512 is completed. Next, in the correction period before the voltage of the signal line 601 switches from the standard voltage to the signal voltage, the power supply line drive unit 505 switches the voltage of the power supply line 801, from the second voltage to the first voltage, and causes a voltage equivalent to the threshold voltage $V_{th}$ of the driving transistor 512 to be held in the holding capacitive element 513. Next, the power supply line drive unit 505 sets the voltage of the switching transistor 511 to the "H" level and causes the signal voltage to be held in the holding capacitive element 513. Specifically, the signal voltage is added to the previously held voltage equivalent to the threshold voltage $V_{th}$ of the driving transistor 512, and held in the holding capacitive element 513. Then, the driving transistor 512 receives a supply of current from the power supply line 801 to which the first voltage is being applied, and supplies the luminescence element 514 with a drive current corresponding to the held voltage.

In the above-described operation, the period of time during which the standard voltage is applied to the respective signal lines is prolonged through the placement of two of the signal lines 601 in every column. This secures the initialization period of the driving transistor 512 and the correction period for holding the voltage equivalent to the threshold voltage $V_{th}$, in the holding capacitive element 513.

FIG. 31 is an operation timing chart for the display device disclosed in Patent Reference 1. The figure describes, sequentially from the top, the signal waveforms of: the scanning line 701 and the power supply line 801 of the first line; the scanning line 702 and the power supply line 802 of the second line; the scanning line 703 and the power supply line 803 of the third line; the signal line allocated to the pixel of an odd row; and the signal line allocated to the pixel of an even row. The scanning signal applied to the scanning lines sequentially shifts 1 line for every 1 horizontal period (1 H). The scanning signal applied to the scanning lines for one line includes two pulses. The time width of the first pulse is long at 1 H or more. The time width of the second pulse is narrow and is part of 1 H. The first pulse corresponds to the above-described initialization period and the threshold voltage correction period, and the second pulse corresponds to a signal voltage sampling period and a mobility correction period. Furthermore, the power source pulse supplied to the power supply lines also shifts 1 line for every 1 H cycle. In contrast, the signal voltage is applied once every 2 H to the respective signal lines, and thus it is possible to ensure that the period of time during which the standard voltage is applied is 1 H or more.

In this manner, in the conventional display device disclosed in Patent Reference 1, even when there is a variation in the threshold voltage $V_{th}$ of the driving transistor 512 for each pixel, by ensuring a sufficient initialization period and threshold voltage correction period, the variation is canceled on a pixel basis, and unevenness in the luminance of an image is inhibited.

SUMMARY OF THE INVENTION

However, in the conventional display device disclosed in Patent Reference 1, there is frequent turning ON and OFF of the signal level of the scanning lines and power supply lines provided to each of the pixel rows. For example, the reset period and the threshold voltage correction period need to be set for each of the pixel rows. Furthermore, when sampling signal voltage from a signal line via a switching transistor, luminescence production periods need to be provided successively. Therefore, the initialization period, the threshold voltage correction timing, and luminescence production timing for each pixel row need to be set. As such, since the number of rows increases with an increase in the area of a display panel, the signals outputted from each driving circuit increases and the frequency for the signal switching thereof rises, and the signal output load of the scanning line driving circuit and the power supply line driving circuit increases.

Furthermore, the increase in the signal lines for each pixel row causes the number of outputs of the signal line driving circuit to increase, thereby causing an increase in the size and cost of the driving circuit and deterioration of manufacturing yield.

Furthermore, in the conventional display device disclosed in Patent Reference 1, the initialization period of the driving transistor and the correction period for the threshold voltage $V_{th}$ is under 2 H, and thus there is a limitation for a display device in which high-precision correction is required.

In view of the aforementioned problem, the present invention has as an object to provide (i) a display device in which a driving transistor initialization period and a period in which the threshold voltage of the driving transistor can be precisely corrected are secured, and driving circuit output load is reduced, and (ii) a method of controlling the display device.

In order to achieve the aforementioned object, a display device according to an aspect of the present invention is a display device including pixels arranged in rows and columns, the display device including: a signal line driving circuit that outputs, to an output line disposed in each of the columns, a signal voltage that determines luminance of the pixels; a first signal line and a second signal line that are disposed in each of the columns, for applying the signal voltage to the pixels; a first selector disposed in each of the columns and configured to selectively apply the signal voltage outputted from the output line to one of the first signal line and the second signal line; a second selector disposed in each of the columns and configured to apply a standard voltage supplied from a standard voltage source, to one of the first signal line and the second signal line; a selector control unit configured to control the first selector and the second selector so that the signal voltage and the standard voltage are applied mutually exclusively to the first signal line and the second signal line; a first power source line and a second power source line; and a scanning line disposed in each of the rows, wherein the pixels compose at least two driving blocks each of which includes at least two of the rows, each of the pixels includes: a luminescence element that includes terminals, one of the terminals being connected to the second power source line, and the luminescence element producing luminescence according to a flow of a signal current corresponding to the signal voltage; and a current control unit connected to the first power source line and the other of the terminals of the luminescence element, and configured to convert the signal voltage applied to the current control unit into the signal current, and hold an initializing voltage or a voltage corresponding to a threshold voltage when the standard voltage is applied to the current control unit, each of the pixels in a k-th driving block of the driving blocks further includes a first switching transistor that includes a gate connected to the scanning line, one of a source and drain connected to the first signal line, and the other of the source and the drain connected to the current control unit, and switchably interconnects the first signal line and the current control unit, k being a positive integer, each of the pixels in a (k+1)-th driving block of the driving blocks further includes a second switching transistor that includes a gate connected to the scanning line, one of a source and a drain connected to the second signal line, and the other of the source and the drain connected to the current control unit, and switchably interconnects the second signal line and the current control unit, and at least one of a threshold voltage detection period and an initialization period is provided in common for the pixels in a same one of the driving blocks, and at least one of the threshold voltage detection period and the initialization period provided in common in the same one of the driving blocks is provided independently for the pixels in different ones of the driving blocks, the threshold voltage detection period being a period during which the threshold voltage is detected when the standard voltage is applied to the current control unit, and the initialization period being a period during which the current control unit is initialized.

According to the display device and the method of controlling the same according to the present invention, the driving transistor initialization periods and the threshold voltage correction periods can be made uniform within a driving block, and thus the initialization period and the correction period can take a large part of a 1-frame period. With this, a precisely corrected drive current flows to the luminescence elements, and thus image display quality improves. In addition, the forming of driving blocks makes it possible to reduce the number of times that the signal level outputted by the driving circuit is switched in the aforementioned periods, and furthermore, with the selector provided between the signal line driving circuit and the signal lines, the number of output lines from the signal line driving circuit can be reduced. This allows for a reduction in driving circuit output load and mounting costs as well as improved manufacturing yield.

BRIEF DESCRIPTION OF THE DRAWINGS

These and other objects, advantages and features of the invention will become apparent from the following description thereof taken in conjunction with the accompanying drawings that illustrate a specific embodiment of the present invention. In the Drawings:

FIG. 5 is a timing chart of an operation of a method for driving the display device according to the first embodiment of the present invention;

DESCRIPTION OF THE PREFERRED EMBODIMENT

Figure 1:
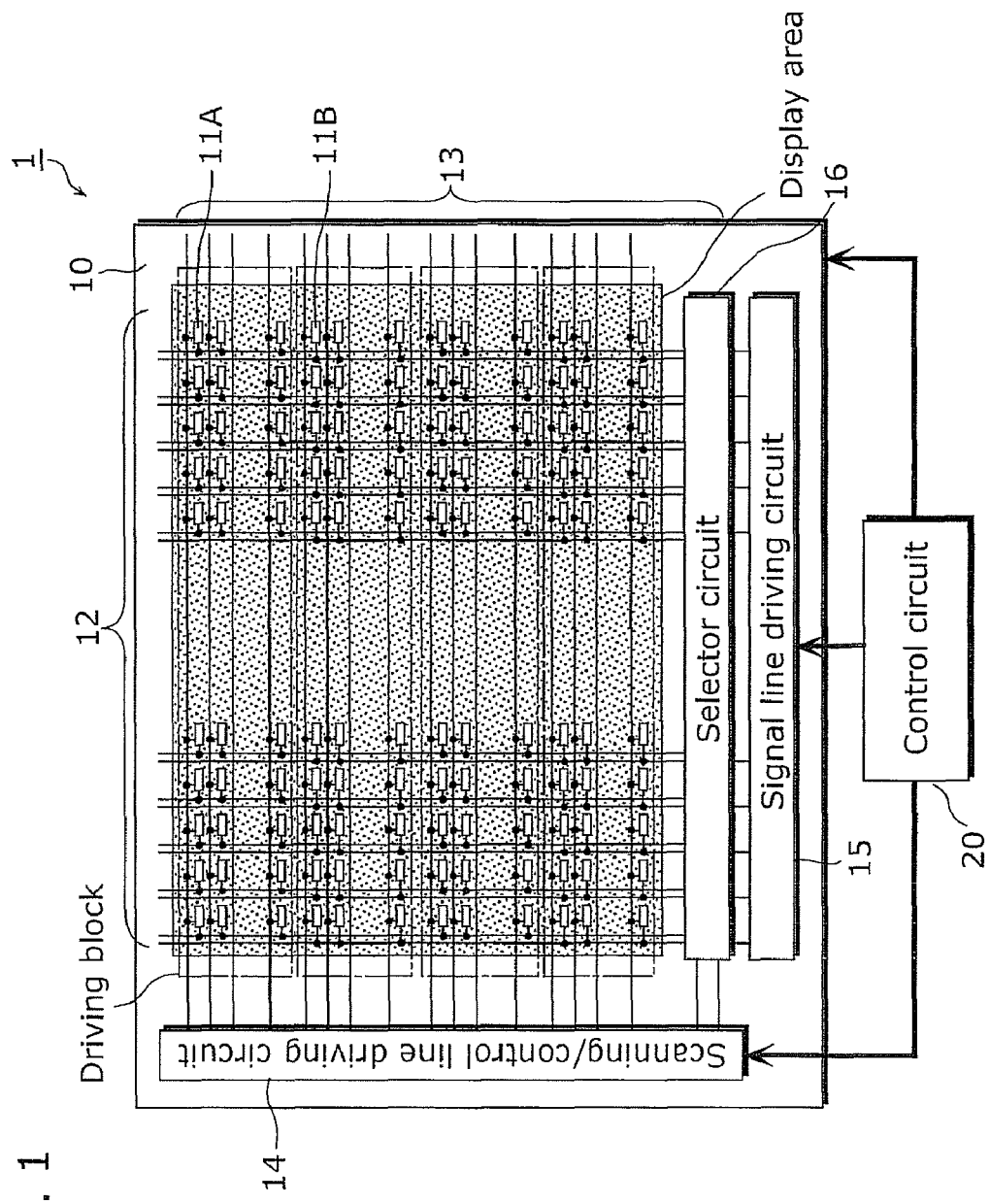
FIG. 1 is a block diagram illustrating an electrical configuration of a display device according to an embodiment of the present invention.

In order to achieve the aforementioned object, a display device according to an aspect of the present invention is a display device including pixels arranged in rows and columns, the display device including: a signal line driving circuit that outputs, to an output line disposed in each of the columns, a signal voltage that determines luminance of the pixels; a first signal line and a second signal line that are disposed in each of the columns, for applying the signal voltage to the pixels; a first selector disposed in each of the columns and configured to apply the signal voltage outputted from the output line to one of the first signal line and the second signal line; a second selector disposed in each of the columns and configured to apply a standard voltage supplied from a standard voltage source, to one of the first signal line and the second signal line; a selector control unit configured to control the first selector and the second selector so that the signal voltage and the standard voltage are applied mutually exclusively to the first signal line and the second signal line; a first power source line and a second power source line; and a scanning line disposed in each of the rows, wherein the pixels compose at least two driving blocks each of which includes at least two of the rows, each of the pixels includes: a luminescence element that includes terminals, one of the terminals being connected to the second power source line, and the luminescence element producing luminescence according to a flow of a signal current corresponding to the signal voltage; and a current control unit connected to the first power source line and the other of the terminals of the luminescence element, and configured to convert the signal voltage applied to the current control unit into the signal current, and hold an initializing voltage or a voltage corresponding to a threshold voltage when the standard voltage is applied to the current control unit, each of the pixels in a k-th driving block of the driving blocks further includes a first switching transistor that includes a gate connected to the scanning line, one of a source and drain connected to the first signal line, and the other of the source and the drain connected to the current control unit, and switchably interconnects the first signal line and the current control unit, k being a positive integer, each of the pixels in a (k+1)-th driving block of the driving blocks further includes a second switching transistor that includes a gate connected to the scanning line, one of a source and a drain connected to the second signal line, and the other of the source and the drain connected to the current control unit, and switchably interconnects the second signal line and the current control unit, and at least one of a threshold voltage detection period and an initialization period is provided in common for the pixels in a same one of the driving blocks, and at least one of the threshold voltage detection period and the initialization period provided in common in the same one of the driving blocks is provided independently for the pixels in different ones of the driving blocks, the threshold voltage detection period being a period during which the threshold voltage is detected when the standard voltage is applied to the current control unit, and the initialization period being a period during which the current control unit is initialized.

According to this aspect, the threshold voltages of the driving transistors in a driving block can be corrected in the same correction period and/or the driving transistors in a driving block can be initialized in the same period and timing. Consequently, the frequency of switching from on to off or off to on of the level of a signal provided from the scanning line, the signal line and the power source line to the pixel circuits can be reduced and accordingly the load on the driving circuit that drives the pixel circuits can be reduced. Furthermore, the grouping into driving blocks and the two signal lines disposed in each pixel column enable a large part of one frame time to be allocated to a threshold voltage correction period and/or initialization period for the driving transistors. Therefore, a highly accurate driving current flows into the pixels and the display quality is improved accordingly.

Furthermore, since a single output line of the signal line driving circuit is provided for the two signal lines disposed in one pixel column, the signal line driving circuit can be reduced in size. The reduction of the number of the output lines can reduce the cost of the driving circuit and improve panel manufacturing yield.

Furthermore, in a display device according to an aspect of the present invention, the first selector may include: a first switch element that switchably interconnects the output line and the first signal line; and a second switch element that switchably interconnects the output line and the second signal line, the second selector may include: a third switch element that switchably interconnects the standard voltage source and the first signal line; and a fourth switch element that switchably interconnects the standard voltage source and the second signal line, and the selector control unit may be configured to control the first selector and the second selector by turning, ON or OFF, the first switch element, the second switch element, the third switch element, and the fourth switch element.

According to this aspect, the first selector selectively provides a signal voltage to one of the first signal line and the second signal line through the use of the two switch elements. The second selector selectively provides a standard voltage to one of the first and second signal lines through the use of the two switch elements. Accordingly, the selector circuit can be implemented with a simple circuit configuration without needing a complicated circuit configuration.

Furthermore, in a display device according to an aspect of the present invention, the selector control unit may be configured to cause the turning ON and OFF of the first switch element and the fourth switch element to be synchronized, cause the turning ON and OFF of the second switch element and the third switch element to be synchronized, and cause the turning ON and OFF of the first switch element and the fourth switch element and the turning ON and OFF of the second switch element and the third switch element to be performed mutually exclusively, by having a common control line serving as a control line for turning the first switch element ON or OFF and a control line for turning the fourth switch element ON or OFF, and having a common control line serving as a control line for turning the second switch element ON or OFF and a control line for turning the third switch element ON or OFF.

According to this aspect, a signal voltage and a standard voltage can be provided mutually exclusively to the first signal line and the second signal line by the selector circuit having a simple circuit configuration. Moreover, the control unit does not need to output control signals individually to the four switch elements but only needs to output a common control signal to the first switch element and the fourth switch element and a common control signal to the second switch element and the third switch element. Accordingly, the output load for switching from on to off or off to on of the level of a signal from the control line to the selector circuit can be reduced.

Furthermore, a display device according to an aspect of the present invention may further include a first control line disposed in each of the rows, and connected to the current control unit, wherein the first control line may be connected to the pixels in the same one of the driving blocks and not connected to the pixels in the different ones of the driving blocks.

According to this aspect, the first control signal can be driven at the same timing in a driving block. Accordingly, the load on the driving circuit that outputs a signal that controls a driving current flowing into pixels is reduced. Furthermore, the grouping into driving blocks and the two signal lines disposed in each pixel column enable a large part of one frame time to be allocated to a control operation period of the current control unit through the first control line. Therefore, a highly accurate driving current flows into the pixels and the display quality is improved accordingly.

Furthermore, a display device according to an aspect of the present invention may further include a second control line disposed in each of the rows, and connected to the current control unit, wherein the current control unit may include: a driving transistor that includes a gate, a source, and a drain, one of the source and the drain being connected to the other of the terminals of the luminescence element, and the driving transistor converting the signal voltage applied between the gate and the source of the driving transistor into the signal current which is a drain current of the driving transistor; a first capacitive element that includes terminals, one of the terminals being connected to the gate of the driving transistor, and the other of the terminals being connected to the source of the driving transistor; a second capacitive element that includes terminals, one of the terminals being connected to the source of the driving transistor, and the other of the terminals being connected to the first control line; and a third switching transistor that includes a gate connected to the second control line, and a source and a drain that are inserted between the first power source line and the other of the terminals of the luminescence element, and switches between ON and OFF states of the drain current of the driving transistor, the other of the source and the drain of the first switching transistor may be connected to the gate of the driving transistor, and the other of the source and the drain of the second switching transistor may be connected to the gate of the driving transistor.

According to this aspect, the current control unit includes a driving transistor which converts a signal voltage to a signal current, a first capacitive element which holds voltages corresponding to a signal voltage and a standard voltage, a second capacitive element which stabilizes the gate and source potentials of the driving transistor, and a third switching transistor which turns on and off a drain current. The circuit configuration of the current control unit, the disposition of the control line, the scanning line, and the signal line in the pixels grouped into driving blocks enable threshold voltages of the driving transistors in the same driving block to be corrected in the same period and at the same timing. Accordingly, the load on the driving circuit that outputs a signal controlling a current path to control a signal voltage is reduced. Furthermore, the grouping into driving blocks and the two signal lines disposed in each pixel column enable a large part of one frame time Tf during which all pixels are refreshed to be allocated to the threshold voltage correction period for the driving transistors. This is because a threshold voltage correction period for the (k+1)-th driving block is provided in a period during which a luminance signal is being sampled in the k-th driving block. Thus, the threshold voltage correction period is divided among the driving blocks, rather than being divided among the pixel rows. Accordingly, as the display area increases, a longer threshold voltage correction period can be set relative to one frame time without reducing the luminescence production duty cycle. Consequently, a driving current based on a signal voltage accurately corrected flows into the luminescence elements, thereby improving display quality. Furthermore, the luminescence production operation of the luminescence elements can be controlled by the third switching transistor independently of the timing of application of a signal voltage to the driving transistors.

Furthermore, in a display device according to an aspect of the present invention, the second control line may be connected to the pixels in the same one of the driving blocks and not connected to the pixels in the different ones of the driving blocks.

According to this configuration, simultaneous luminescence production in the same block can be achieved by simultaneously controlling the third switching transistors in the same block through the second control line. Consequently, the load on the driving circuit which outputs a signal through the second control line is reduced.

Furthermore, a display device according to an aspect of the present invention may further include a second control line disposed in each of the rows, wherein the current control unit may include: a driving transistor that includes a gate, a source, and a drain, one of the source and the drain being connected to the other of the terminals of the luminescence element, and the driving transistor converting the signal voltage applied between the gate and the source of the driving transistor into the signal current which is a drain current of the driving transistor; a third capacitive element that includes terminals, one of the terminals being connected to the gate of the driving transistor, and the other of the terminals being connected to the source of the driving transistor; a fourth capacitive element that includes terminals, one of the terminals being connected to the source of the driving transistor, and the other of the terminals being connected to the first control line; and a fourth switching transistor that includes a gate connected to the second control line, one of a source and a drain connected to the other of the terminals of the third capacitive element, and the other of the source and drain connected to the source of the driving transistor, the other of the source and the drain of the first switching transistor may be connected to the gate of the driving transistor, and the other of the source and the drain of the second switching transistor may be connected to the gate of the driving transistor.

According to this aspect, the current control unit includes a driving transistor which converts a signal voltage to a signal current, a third capacitive element which holds voltages corresponding to a signal voltage and a standard voltage, a fourth capacitive element which stabilizes gate and source potentials of the driving transistor, and a fourth switching transistor which switches between conduction and non-conduction between the source of the driving transistor and the third capacitive element. The circuit configuration of the current control unit, the disposition of the control line, the scanning line, and the signal line in the pixels grouped into driving blocks enable the threshold voltage of the driving transistors in the same driving block to be corrected in the same period and at the same timing. Accordingly the load on the driving circuit which outputs a signal controlling a current path to control a signal voltage is reduced. Furthermore, the grouping into driving blocks and the two signal lines disposed in each pixel column enable a large part of one frame time Tf during which all pixels are refreshed to be allocated to the threshold voltage correction period for the driving transistors. Consequently, a driving current based on a signal voltage accurately corrected flows into the luminescence elements, thereby improving display quality. Moreover, the disposition of the fourth switching transistor enables the third capacitive element to hold a voltage corresponding to an accurate signal voltage.

Furthermore, in a display device according to an aspect of the present invention, the current control unit may include: a driving transistor that includes a gate, a source, and a drain, one of the source and the drain being connected to the first power source line, the other of the source and the drain being connected to the other of the terminals of the luminescence element, and the driving transistor converting the signal voltage applied between the gate and the source of the driving transistor into the signal current; a fifth capacitive element that includes terminals, one of the terminals being connected to the gate of the driving transistor; a fifth switching transistor that includes a gate connected to the scanning line, one of a source and a drain connected to the one of the terminals of the fifth capacitive element, and the other of the source and drain connected to a reference power source line; and a sixth switching transistor that includes a gate connected to the first control line, one of a source and a drain connected to the other of the terminals of the fifth capacitive element, and the other of the source and drain connected to the source of the driving transistor, the one of the source and the drain of the first switching transistor may be connected to the other of the terminals of the fifth capacitive element, and the other of the source and the drain of the first switching transistor may be connected to the first signal line, and the one of the source and the drain of the second switching transistor may be connected to the other of the terminals of the fifth capacitive element, and the other of the source and the drain of the second switching transistor may be connected to the second signal line.

According to this aspect, the current control unit includes a driving transistor which converts a signal voltage to a signal current, a fifth capacitive element which holds voltages corresponding to a signal voltage and a standard voltage, a fifth switching transistor for providing a reference potential to the gate of the driving transistor, and a sixth switching transistor which switches between conduction and non-conduction between the source of the driving transistor and the fifth capacitive element. The circuit configuration of the current control unit, the disposition of the control line, the scanning line, and the signal line in the pixels grouped into driving blocks enable the threshold voltage of the driving transistors in the same driving block to be initialized in the same period and at the same timing. Accordingly the load on the driving circuit which outputs a signal controlling a current path to control a signal voltage is reduced. Furthermore, the grouping into driving blocks and the two signal lines disposed in each pixel column enable a large part of one frame time Tf during which all pixels are refreshed to be allocated to the period for resetting the driving transistors. Consequently, a driving current based on a signal voltage accurately corrected flows into the luminescence elements, thereby improving display quality. Moreover, the disposition of the sixth switching transistor enables the fifth capacitive element to hold a voltage corresponding to an accurate signal voltage.

Furthermore, in a display device according to an aspect of the present invention, the first power source line may be disposed in each of the rows, and applies a first voltage and a second voltage, the first voltage being a voltage lower than the standard voltage, and the second voltage being a voltage higher than the standard voltage, the current control unit may include: a driving transistor that includes a gate, a source, and a drain, one of the source and the drain being connected to the other of the terminals of the luminescence element, the other of the source and the drain being connected to the first power source line, and the driving transistor converting the signal voltage applied between the gate and the source of the driving transistor into the signal current which is a drain current of the driving transistor; a sixth capacitive element that includes terminals, one of the terminals being connected to the gate of the driving transistor, the other of the terminals being connected to the one of the source and the drain of the driving transistor, the sixth capacitive element holding at least a voltage corresponding to the signal voltage or the standard voltage, the other of the source and the drain of the first switching transistor may be connected to the gate of the driving transistor, the other of the source and the drain of the second switching transistor may be connected to the gate of the driving transistor, the display device may further include a control unit configured to control application of the first voltage and the second voltage in at least one of the threshold voltage detection period and the initialization period with a first timing which is the same for the pixels in the same one of the driving blocks, and control the application of the first voltage and the second voltage with a second timing different from the first timing for the pixels in different ones of the driving blocks.

According to this aspect, the current control unit includes a driving transistor which converts a signal voltage to a signal current and a sixth capacitive element which holds voltages corresponding to a signal voltage and a standard voltage. The circuit configuration of the current control unit, and the disposition of the control line, the scanning line, the signal line, and the power source line in the pixels grouped into driving blocks enable the threshold voltage of the driving transistors in the same driving block to be corrected in the same period and at the same timing. Accordingly the load on the driving circuit which outputs a signal controlling a current path to control a signal voltage is reduced. Furthermore, the grouping into driving blocks and the two signal lines disposed in each pixel column enable a large part of one frame time Tf during which all pixels are refreshed to be allocated to the threshold voltage correction period for the driving transistors. Consequently, a driving current based on a signal voltage accurately corrected flows into the luminescence elements, thereby improving display quality.

Furthermore, in a display device according to an aspect of the present invention, the luminescence element may be an electroluminescence (EL) element that produces the luminescence according to the signal voltage.

According to this aspect, grouping into driving blocks and disposition of the selector circuit in an active-matrix organic EL display panel enable large parts of one frame time to be allocated to the initialization period and the threshold voltage correction period. Accordingly, the output load on the driving circuit and cost of the driving circuit can be reduced and the manufacturing yield can be improved.

Furthermore, the present invention can be implemented, not only as a display device including such characteristic units, but also as a display device controlling method having, as steps, the characteristic units included in the display device.

First Embodiment

A first embodiment of the present invention will be described below with reference to drawings.

FIG. 1 is a block diagram illustrating an electrical configuration of a display device according to the first embodiment of the present invention. The display device 1 in FIG. 1 is a display device that has a plurality of pixels arranged in a matrix and includes a display panel 10 and a control circuit 20. The display panel 10 includes a plurality of pixels 11A and 11B, a signal line group 12, a set of control lines 13, a scanning/control line driving circuit 14, a signal line driving circuit 15, and a selector circuit 16.

The pixels 11A and 11B are arranged in a matrix on the display panel 10. Here, the pixels 11A and 11B make up two or more driving blocks each including a plurality of pixel rows. Specifically, the pixels 11A make up a k-th driving block (where k is a natural number) and the pixels 11B make up a (k+1)-th driving block. This means that the pixels 11A make up an odd-numbered driving block and the pixels 11B make up an even-numbered driving block, for example. Here, (k+1) is a natural number equal to or less than N, where N is the number of driving blocks into which the display panel 10 is divided.

The signal line group 12 is made up of a plurality of signal lines disposed in pixel columns. Here, two signal lines (a first signal line 151 and a second signal line 152) are disposed in each pixel column. The pixels in an odd-numbered driving block are connected to a first signal line and the pixels in an even-numbered driving block are connected to a second signal line which is different from the first signal line. In this way, the two signal lines (the first signal line 151 and the second signal line 152) are disposed in each pixel column for providing a standard voltage for detecting threshold voltage of driving transistors and for initializing the driving transistors and signal voltages that determine the luminance of the pixels to the pixels 11A and 11B.

The set of control lines 13 is made up of scanning lines, control lines, and power source lines, each disposed in each pixel.

The scanning/control line driving circuit 14 outputs a scanning signal to each of the scanning lines in the set of control lines 13 and a control signal to each of the control lines in the set of control lines 13 to drive a circuit element of each pixel.

The signal line driving circuit 15 outputs a signal voltage that determines the luminance of the pixels onto an output line provided in each pixel column. Specifically, the signal line driving circuit 15 outputs a signal voltage that determines the luminance of the pixels to each signal line in the signal line group 12 through the selector circuit 16 to drive the circuit elements of the pixels.

The selector circuit 16 has the function of selectively providing a signal voltage outputted from the signal line driving circuit 15 to one of the first signal line and the second signal line and the function of selectively providing a standard voltage provided from a standard-voltage source to one of the first signal line and the second signal line. Furthermore, the selector circuit 16 provides the signal voltage and the standard voltage mutually exclusively to the first signal line and the second signal line. Details will be described later and therefore further description of the elector circuit 16 will be omitted here.

The control circuit 20 controls the timings of output and voltage levels of a scanning signal and a control signal outputted from the scanning/control line driving circuit 14. The control circuit 20 also controls the timing of output of a signal voltage outputted from the signal line driving circuit 15. The control circuit 20 also functions as a selector control unit which controls a signal line selecting operation of the selector circuit 16 with the control signal outputted from the scanning/control line driving circuit 14, so that the signal voltage and the standard voltage are mutually exclusively provided onto the first signal line and the second signal line. Specifically, the control circuit 20 causes the standard voltage to be outputted onto the second signal line while the signal voltage is being outputted onto the first signal line, and causes the standard voltage to be outputted onto the first signal line while the signal voltage is being outputted onto the second signal line.

The control circuit 20 and the scanning/control line driving circuit 14 constitute a control unit which controls operations of the pixels. The control circuit 20 causes at least one of threshold detection in which a standard voltage is applied to each pixel to detect a threshold voltage of the pixel circuit and initialization of each pixel circuit to occur in all the pixels in the same driving block in the same period and causes at least one of threshold detection and initialization that occurs in the same driving block in the same period to occur in different driving blocks in different periods. Here, causing at least one of the threshold detection and the initialization to occur in the same driving block in the same period means that the threshold detection or the initialization is caused to start and end in the pixels in the same driving block at the same start time and the same end time; causing at least one of the threshold detection and the initialization that occur in the same driving block in the same period to occur in different blocks in different periods means that the threshold detection or the initialization in the pixels in different blocks is caused to start and end at different start times and different end times and the threshold detection period and the initialization period are prevented from overlapping each other.

Figure 2A:
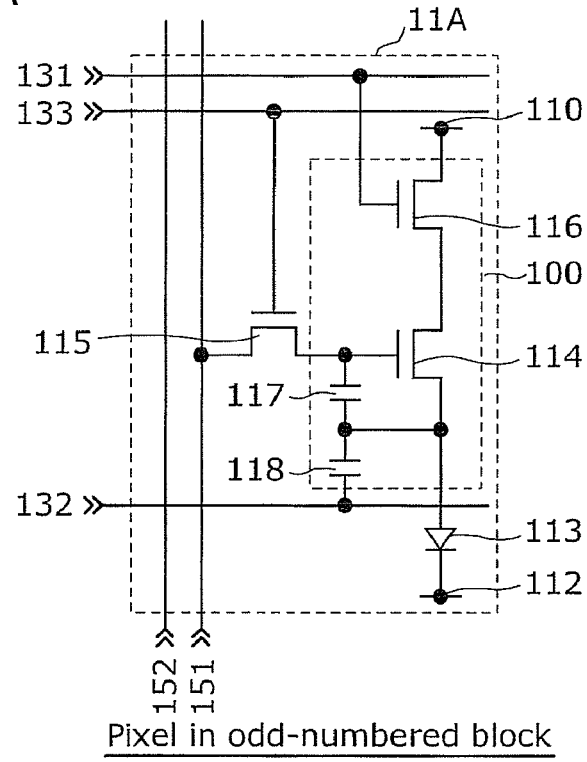
FIG. 2A is a circuit diagram of a pixel in an odd-numbered driving block in the display device according to an embodiment of the present invention.
Figure 2B:
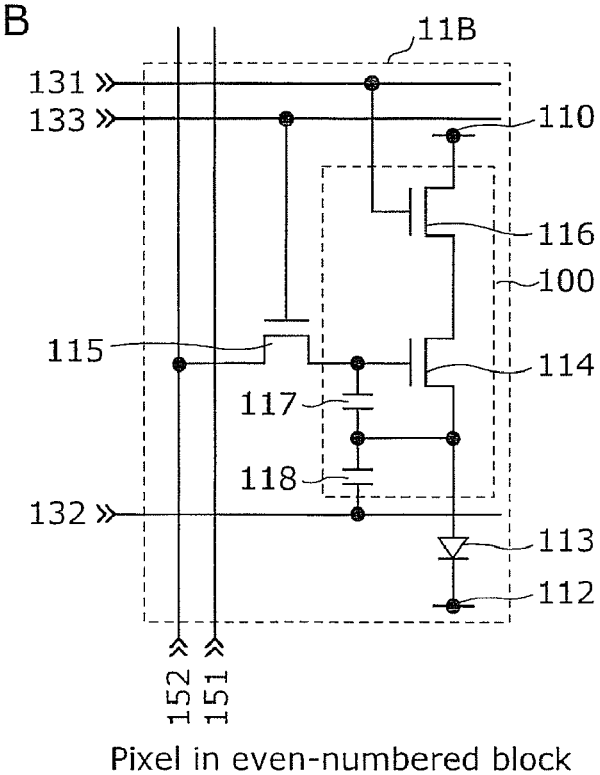
FIG. 2B is a circuit diagram of a pixel in an even-numbered driving block in the display device according to an embodiment of the present invention.

FIG. 2A is a circuit diagram specifically illustrating a pixel in an odd-numbered driving block in a display device according to the first embodiment of the present invention. FIG. 2B is a circuit diagram specifically illustrating a pixel in an even-numbered driving block in the display device according to the first embodiment of the present invention. Each of the pixels 11A and 11B depicted in FIGS. 2A and 2B includes an organic Electro Luminescence (EL) element 113, a driving transistor 114, switching transistors 115 and 116, holding capacitors 117 and 118, a second control line 131, a first control line 132, a scanning line 133, a first signal line 151, and a second signal line 152. Here, the driving transistor 114, the switching transistor 116, and the holding capacitors 117 and 118 make up a current control unit 100.

The current control unit 100 is connected to a power source line 112, the other terminal of the organic EL element 113, and the first control line 132 and converts a signal voltage to a signal current. Specifically, the current control unit 100 is connected to a power source line 110, which is a first power source line, an anode of the organic EL element 113, the second control line 131, the first control line 132, and one of source and drain terminals of the switching transistor 115. This configuration allows the current control unit 100 to have the function of converting a signal voltage provided through the first signal line 151 or the second signal line 152 to a signal current, which is a source-drain current of the driving transistor 114.

The organic EL element 113 has one terminal connected to the power source line 112 and produces luminescence when a signal current corresponding to a signal voltage flows through the organic EL element 113. Specifically, the organic EL element 113 is a luminescence element having a cathode connected to the power source line 112, which is a second power source line, and an anode connected to the source of the driving transistor 114, and produces luminescence when a driving current of the driving transistor 114 flows through the organic EL element 113.

The driving transistor 114 is included in the current control unit in the present invention. The driving transistor 114, one of a source and drain of which is connected to the other end of the organic EL element 113, converts a signal voltage applied between the gate and source to a signal current, which is a drain current. Specifically, when a voltage corresponding to a signal voltage is applied between the gate and source, the driving transistor 114 converts the voltage to a drain current corresponding to the voltage. The drain current is provided to the organic EL element 113 as a driving current. The driving transistor 114 is implemented by an n-type thin-film transistor (n-type TFT), for example.

The switching transistor 115 is a third switching transistor having a gate electrode connected to the scanning line 133. One of a source and a drain of the switching transistor 115 is connected to the first signal line 151 and the other of the source and drain is connected to the current control unit. The switching transistor 115 switches between conduction and non-conduction between the first signal line 151 and the current control unit. Specifically, the gate is connected to the scanning line 133 and one of the source and the drain is connected to the gate of the driving transistor 114. In the pixels 11A in an odd-numbered driving block, the other of the source and the drain is connected to the first signal line 151 so that the switching transistor 115 functions as a first switching transistor; in the pixels 11B in an even-numbered driving block, the other of the source and the drain is connected to the second signal line 152 so that the switching transistor 115 functions as a second switching transistor.

The switching transistor 116 is a third switching transistor having a gate connected to the second control line 131. One of a source and a drain of the switching transistor 116 is connected to the power source line 110, which is a positive power source line. The switching transistor 116 has the function of turning on and off the drain current of the driving transistor 114.

It should be noted that the source and the drain of the switching transistor 116 are preferably connected between the power source line 110 and the anode of the organic EL element 113. This arrangement enables the drain current of the driving transistor 114 to be turned on and off. The switching transistors 115 and 116 are implemented by n-type thin-film transistors (n-type TFTs), for example.

The holding capacitor 117 is a first capacitive element that has one terminal connected to the gate of the driving transistor 114 and another terminal connected to the source of the driving transistor 114.

The holding capacitor 117 has the function of holding a charge corresponding to a signal voltage provided through the first signal line 151 or the second signal line 152 and controlling a signal current provided from the driving transistor 114 to the organic EL element 113 for example after the switching transistor 115 turns off.

The holding capacitor 118 is a second capacitive element connected between the other terminal of the holding capacitor 117 and the first control line 132. In a steady state, the holding capacitor 118 first holds a source potential of the driving transistor 114 and information on the source potential remains at a node between the holding capacitor 117 and the holding capacitor 118 even when a signal voltage is applied from the switching transistor 115. It should be noted that the source potential at this point in time is a threshold voltage of the driving transistor 114. When subsequently the timing between the holding of the signal voltage and production of luminescence varies among pixel rows, a gate voltage of the driving transistor 114 is fixed because the potential at the other terminal of the holding capacitor 117 is fixed. On the other hand, a source potential of the driving transistor 114 is already in the steady state. Accordingly, the holding capacitor 118 has the function of holding the source potential of the driving transistor 114.

The second control line 131 is disposed in each pixel row and is shared by all the pixels in the same driving block, but is independent among different driving blocks. Here, the second control line 131 is shared by all the pixels in the same driving block means that one control signal outputted from the scanning/control line driving circuit 14 is provided onto the second control lines 131 in the same driving block at the same time. For example, in the same driving block, one control line connected to the scanning/control line driving circuit 14 branches into second control lines 131 each being disposed in each pixel row. That the second control line 131 is independent among different driving blocks means that individual control signals outputted from the scanning/control line driving circuit 14 are provided to a plurality of driving blocks. For example, the second control line 131 in each driving block is connected to the scanning/control line driving circuit 14 separately from the other second control lines 131. Specifically, the second control line 131 is connected to the scanning/control line driving circuit 14 and to the pixels that belong to pixel rows that include the pixels 11A and 11B. Thus, the second control line 131 has the function of providing timings of turning on and off the drain current of the driving transistor 114.

The first control line 132 is disposed in each pixel row and is shared by all pixels in the same driving block, but is independent among different driving blocks. Specifically, the first control line 132 is connected to the scanning/control line driving circuit 14 and to each of the pixels that belong to the pixel rows including the pixels 11A and 11B. This allows the first control line 132 to have the function of preparing conditions for detecting the threshold voltage of the driving transistor 114 by a voltage level change.

The scanning line 133 has the function of providing timing of holding a signal voltage or a standard voltage for detecting the threshold voltage of the driving transistor 114 in the pixels that belong to the pixel rows including the pixels 11A and 11B.

The first signal line 151 and the second signal line 152 are connected to the selector circuit 16 and to each of the pixels that belong to the pixel rows including the pixels 11A and 11B, respectively, and have the function of providing a standard voltage for detecting the threshold voltage of the driving transistor 114 and a signal voltage that determines luminance.

It should be noted that while not depicted in FIGS. 2A and 2B, the power source line 110 and the power source line 112 each are also connected to other pixels and to voltage sources.

A circuit configuration and function of the selector circuit 16 will be described below in detail.

Figure 3:
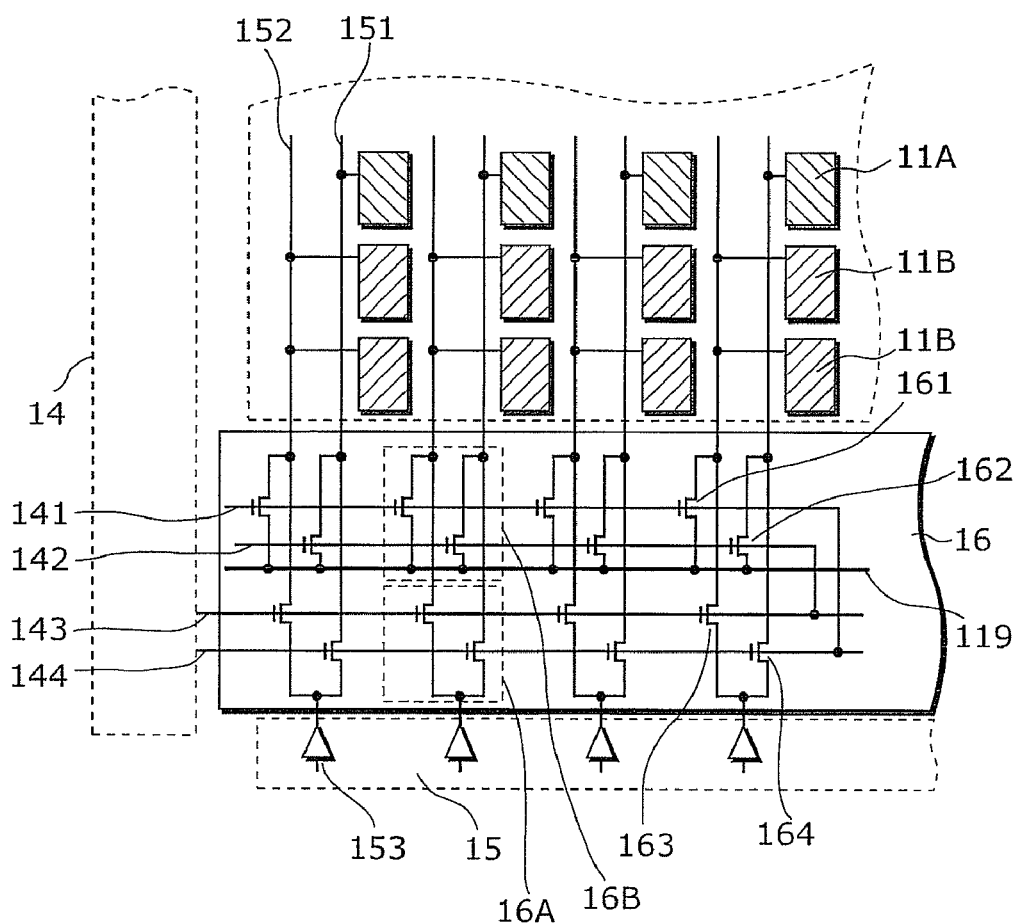
FIG. 3 is a circuit diagram of a selector circuit and its neighboring circuits in the display device according to an embodiment of the present invention.

FIG. 3 is a circuit diagram of a selector circuit of the display device according to an embodiment of the present invention and its neighboring circuitry. The selector circuit 16 illustrated in FIG. 3 includes switching transistors 161 to 164, each provided for each pixel column. The signal line driving circuit 15 includes data drivers 153, each provided for each pixel row. The data driver 153 is an integrated circuit (IC) that outputs a signal voltage corresponding to an input signal from the control circuit 20 to a pixel column connected to the data driver 153. It should be noted that if each pixel is made up of an R (red) subpixel, a B (blue) subpixel, and a G (green) subpixel, the selector circuit 16 includes switching transistors 161 to 164, each provided for each subpixel, and the signal line driving circuit 15 includes data drivers 153, each provided for each subpixel column.

Also depicted in FIG. 3 are some of the pixels of the display panel 10. Two rows make up one driving block. FIG. 3 depicts only the pixels 11B (in two rows) in a last block and the pixels 11A (in only one row) in the last but one block.

Each of the switching transistors 161 is a fourth switch element having a gate connected to a control line 141. One of a source and a drain of the switching transistor 161 is connected to the second signal line 152 and the other of the source and drain is connected to a standard voltage line 119.

Each of the switching transistors 162 is a third switch element having a gate connected to a control line 142. One of a source and a drain of the switching transistor 162 is connected to the first signal line 151 and the other of the source and the drain is connected to the standard voltage line 119.

The standard voltage line 119 is connected to a standard voltage source of the display device 1 and is disposed near or inside the selector circuit 16. If the standard voltage is 0 V, for example, the standard voltage source and standard voltage line 119 may be omitted and switching transistors 161 and 162 may be connected to the power source line 112, instead of the standard voltage line 119. In that case, the mounting cost and area can be reduced.

The switching transistors 161 and 162 make up a second selector 16B which is disposed for each pixel column and selectively provides a standard voltage provided from the standard voltage source to one of the first signal line 151 and the second signal line 152.

Each of the switching transistors 163 is a second switch element having a gate connected to a control line 143. One of a source and a drain of the switching transistor 163 is connected to the second signal line 152 and the other of the source and the drain is connected to the data driver 153.

Each of the switching transistors 164 is a first switch element having a gate connected to a control line 144. One of a source and a drain of the switching transistor 164 is connected to the first signal line 151 and the other of the source and drain is connected to the data driver 153.

The switching transistors 163 and 164 make up a first selector 16A which is disposed for each pixel column and selectively provides a signal voltage outputted from the signal line driving circuit 15 to one of the first signal line 151 and the second signal line 152.

Here, the control line 141 and the control line 144 in this embodiment are connected to each other to form one common control line. The control line 142 and the control line 143 are connected to each other to form one common control line. Accordingly, one control signal is outputted from the scanning/control line driving circuit 14 to the control line 141 and the control line 144 at the same time to turn on and off the switching transistors 161 and 164 in synchronization. Similarly, one control signal is outputted from the scanning/control line driving circuit 14 to the control line 142 and the control line 143 at the same time to turn on and off the switching transistors 162 and 163 in synchronization. Furthermore, the scanning/control line driving circuit 14 changes mutually exclusively the voltage level of the control signal provided to the control line 141 and the control line 144 and the voltage level of the control signal provided to the control line 142 and the control line 143 to turn on/off the set of the switching transistors 161 and 164 and turn on/off the set of the switching transistors 162 and 163 mutually exclusively. As a result, the signal voltage and the standard voltage are provided to the first signal line 151 and the second signal line 152 mutually exclusively. A driving method of the selector circuit 16 will be detailed later with reference to FIGS. 8, 9A, and 9B.

In a conventional signal line driving circuit, as many data driver ICs and output lines as the number of signal lines needed to be disposed and signal voltages of the signal lines needed to be independently driven. According to the present invention, only one output line of the signal line driving circuit 15 is provided for the two signal lines disposed for each pixel column because the selector circuit 16 is disposed between the signal line driving circuit 15 and the signal line group 12. Thus, the size of the signal line driving circuit 15 can be reduced and, thanks to the reduction of the numbers of data drivers 153 and output lines, the cost for mounting the driving circuit can be reduced and the manufacturing yield can be improved.

It should be noted that the control line 141 and the control line 144 may be individually controlled by the scanning/control line driving circuit 14 rather than being unified into a common control line, and the control line 142 and the control line 143 may be individually controlled by the scanning/control line driving circuit 14 rather than being unified into a common control line. In this case, the scanning/control line driving circuit 14 outputs a control signal to the control line 141 and a control signal to the control line 144 in synchronization with each other to turn on and off the switching transistors 161 and 164 in synchronization with each other. Similarly, the scanning/control line driving circuit 14 outputs a control signal to the control line 142 and a control signal to the control line 143 in synchronization with each other to turn on and off the switching transistors 162 and 163 in synchronization with each other.

Connections of the second control lines 131, the first control lines 132, the scanning lines 133, the first signal lines 151, and the second signal lines 152 among the pixels will be described below.

Figure 4:
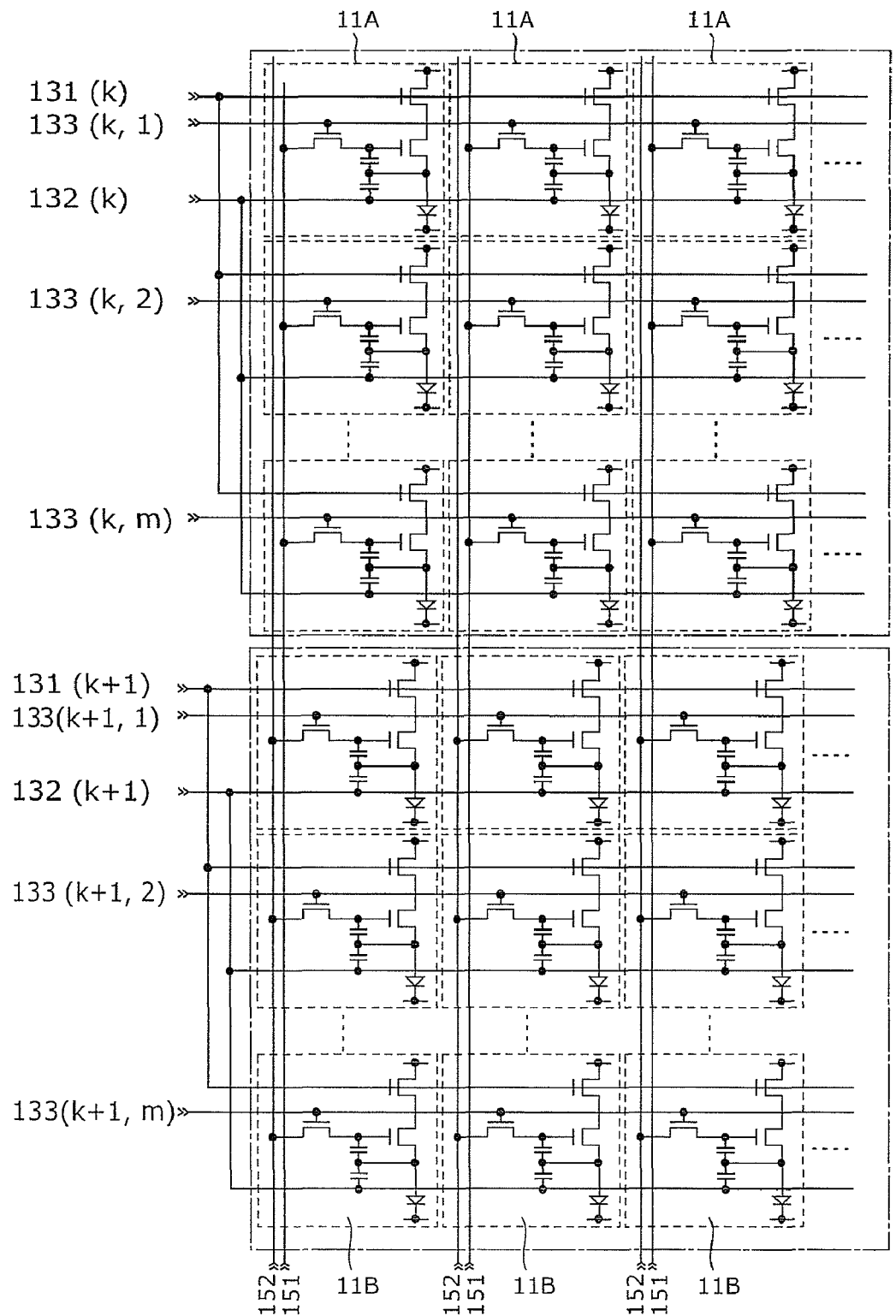
FIG. 4 is a circuit diagram illustrating a portion of a display panel of a display device according to a first embodiment of the present invention.

FIG. 4 is a circuit diagram illustrating a portion of the display panel of the display device according to the first embodiment of the present invention. FIG. 4 illustrates two adjacent driving blocks, control lines, scanning lines, and signal lines. The control lines, the scanning lines, and the signal lines are denoted by a reference numeral followed by (block number, row number in the block) or a reference numeral followed by (block number) in the figure and the following description.

As described earlier, a driving block is made up of a plurality of pixel rows and two or more driving blocks exist in the display panel 10. For example, each of the driving blocks depicted in FIG. 4 is made up of m pixel rows.

In the k-th driving block depicted in the upper part of FIG. 4, a second control line 131 (k) is connected to the gate of the switching transistor 116 of every pixel 11A in the driving block in common. A first control line 132 (k) is connected to the holding capacitor 118 of every pixel 11A in the driving block in common. On the other hand, scanning lines 133 (k, 1) to 133 (k, m) are connected individually to pixel rows. Connections similar to those in the k-th driving block are made in the (k+1)-th driving block depicted in the lower part of FIG. 4. However, the second control line 131 (k) connected to the k-th driving block and the second control line 131 (k+1) connected to the (k+1)-th driving block are different from each other and individual control signals are outputted from the scanning/control line driving circuit 14 to the second control lines 131 (k) and 131 (k+1). Furthermore, the first control line 132 (k) connected to the k-th driving block and the first control line 132 (k+1) connected to the (k+1)-th driving block are different from each other and individual control signals are outputted from the scanning/control line driving circuit 14 to the first control lines 132 (k) and 132 (k+1).

In the k-th driving block, the first signal line 151 is connected to one of the source and drain of the switching transistor 115 of every pixel 11A in the driving block. In the (k+1)-th driving block, on the other hand, the second signal line 152 is connected to one of the source and drain of the switching transistor 115 of every pixel 11B in the driving block.

Grouping into driving blocks as described above reduces the number of second control lines 131 for controlling on and off of application of a voltage to the drains of the driving transistors 114. The grouping into driving blocks also reduces the number of the first control lines 132 for controlling $V_{th}$ detection circuits which detect the threshold voltage $V_{th}$ of the driving transistors 114. Accordingly, the number of outputs of the scanning/control line driving circuit 14 which outputs a driving signal onto the control lines is reduced and therefore the circuit size can be reduced.

A method for controlling the display device 1 according to this embodiment will now be described with reference to FIG. 5. Here, a control method for the display device having the specific circuit configuration depicted in FIGS. 2A and 2B will be described in detail.

Figure 6:
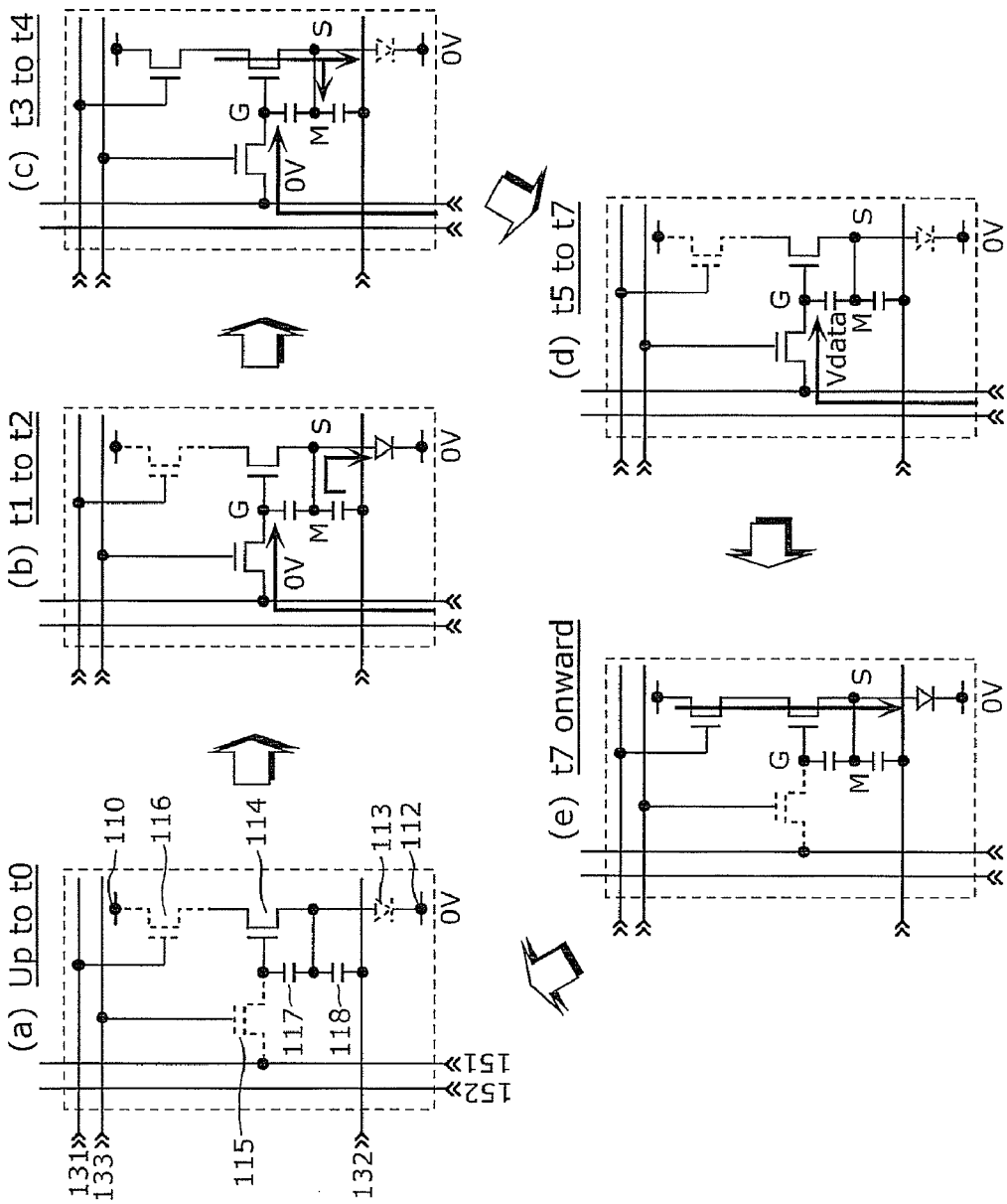
FIG. 6 is a state transition diagram of a pixel of the display device according to the first embodiment of the present invention.
Figure 7:
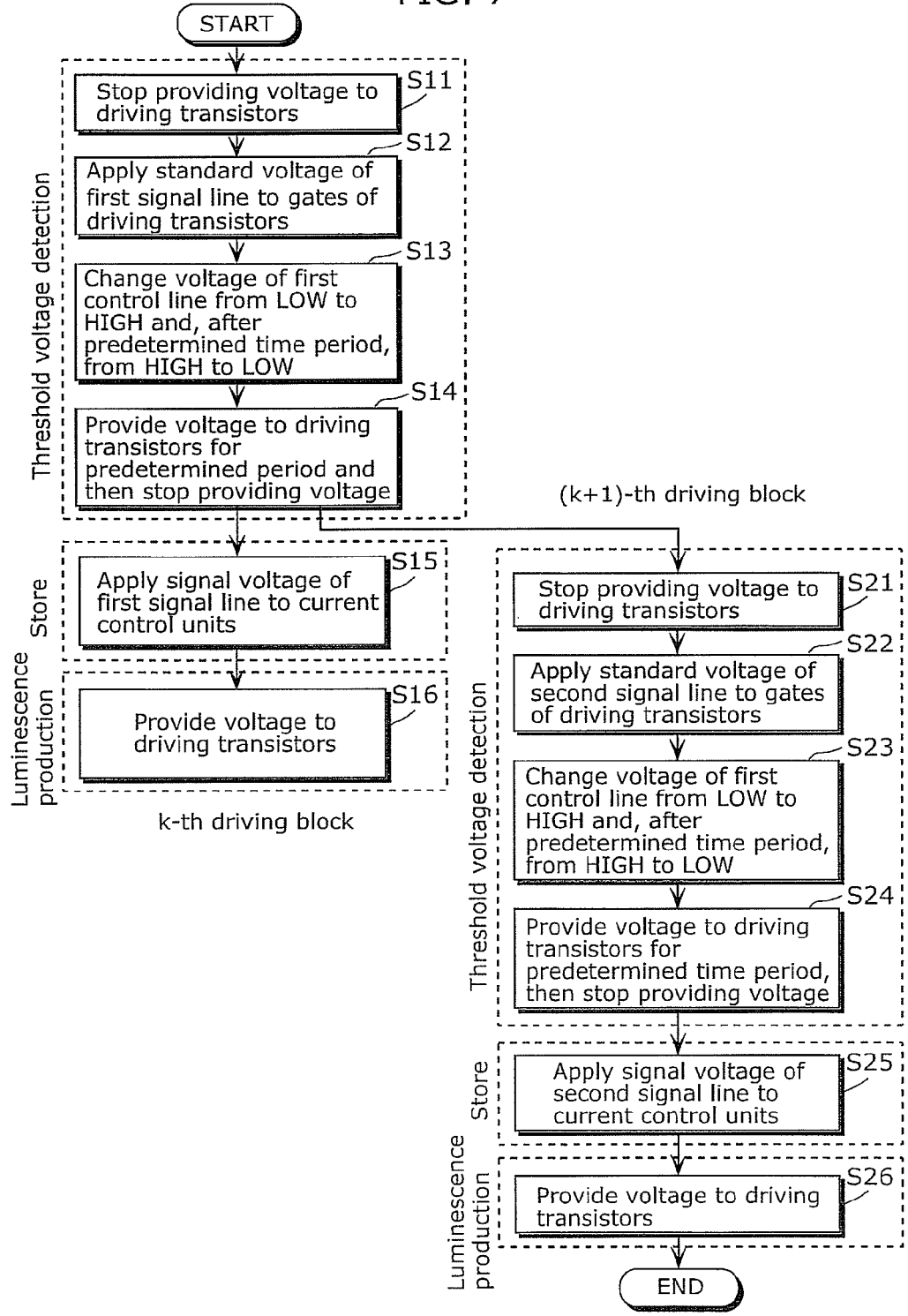
FIG. 7 is a flowchart of an operation of the display device according to the first embodiment of the present invention.

FIG. 5 is a timing chart of an operation of a method for driving the display device according to the first embodiment of the present invention. The horizontal axis of the timing chart represents time. Shown in the timing chart in rows are, in order from top, waveforms of voltages appearing on the scanning lines 133 (k, 1), 133 (k, 2), and 133 (k, m), the first signal line 151, the second control line 131 (k), and the first control line 132 (k) in the K-th driving block. Following these are waveforms of voltages appearing on the scanning lines 133 (k+1, 1), 133 (k+1, 2), and 133 (k+1, m), the second signal line 152, the second control line 131 (k+1), and the first control line 132 (k+1) in the (k+1)-th driving block. FIG. 6 is a state transition diagram of a pixel of the display device according to the first embodiment of the present invention. FIG. 7 is a flowchart of an operation of the display device according to the first embodiment of the present invention.

First, immediately before time to, the voltage levels of the scanning lines 133 (k, 1) to 133 (k, m) are all LOW and the voltage levels of the first control line 132 (k) and the second control line 131 (k) are also LOW. At the instant when the second control line 131 (k) is forced to LOW, the switching transistors 116 turn off as illustrated in FIG. 6(a). This optically quenches the organic EL elements 113 and simultaneous production of luminescence in the pixels in the k-th driving block ends and a non-luminescence-production period in the k-th driving block starts.

Then, at time t0, the scanning/control line driving circuit 14 changes the voltage levels of the scanning lines 133 (k, 1) to 133 (k, m) from LOW to HIGH at the same time to turn on the switching transistors 115. At this point in time, the second control line 131 (k) has already become LOW to turn off the switching transistor 116 (S11 of FIG. 7) and the signal line driving circuit 15 has changed the voltage of the first signal line 151 from a signal voltage to a standard voltage to turn off the driving transistor 114 (S12 of FIG. 7).

Here, a method for using the selector circuit 16 to change a voltage of the first signal line 151 from the signal voltage to the standard voltage will be described.

Figure 8:
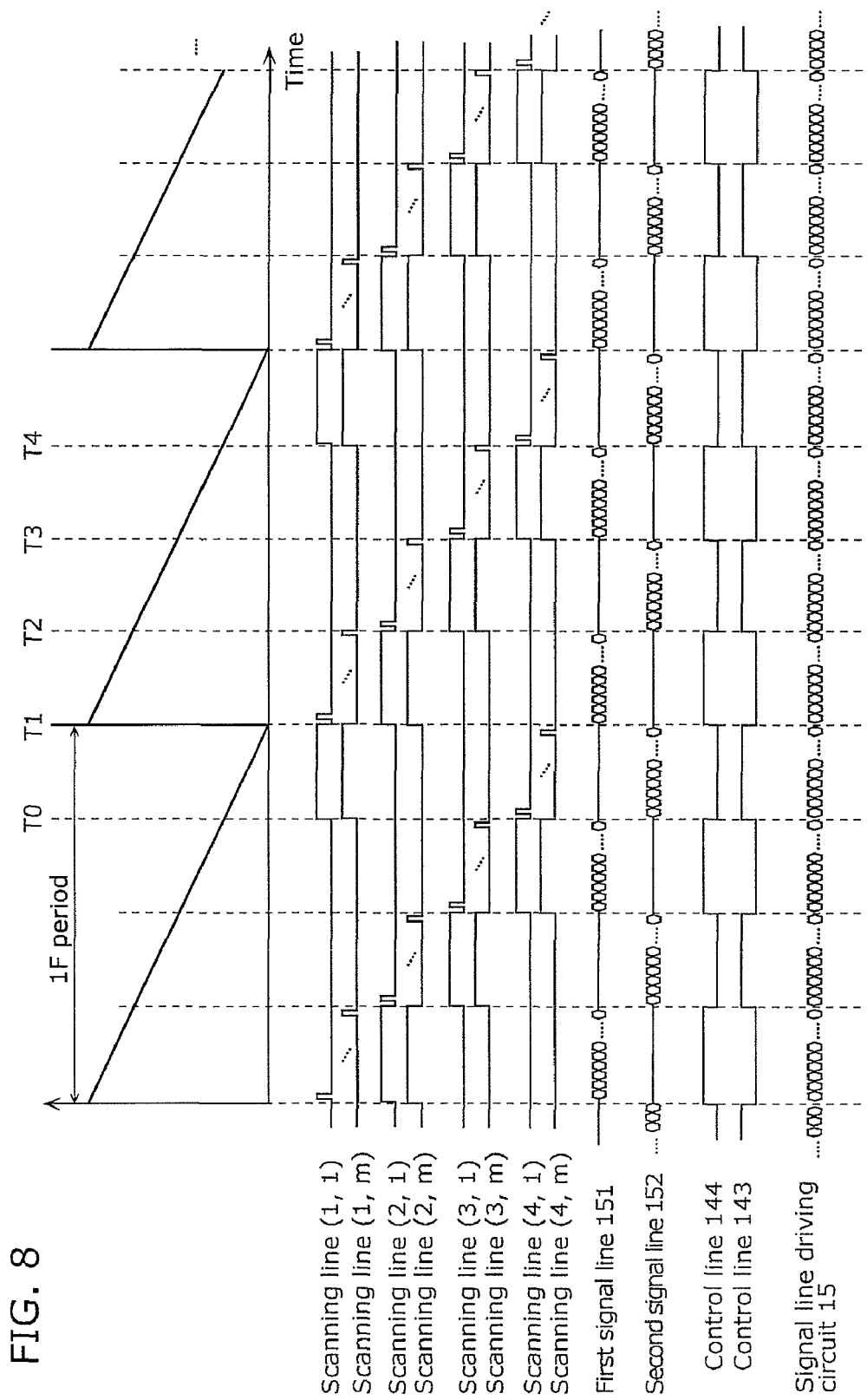
FIG. 8 is a timing chart of an operation for driving a selector circuit according to an embodiment of the present invention.
Figure 9A:
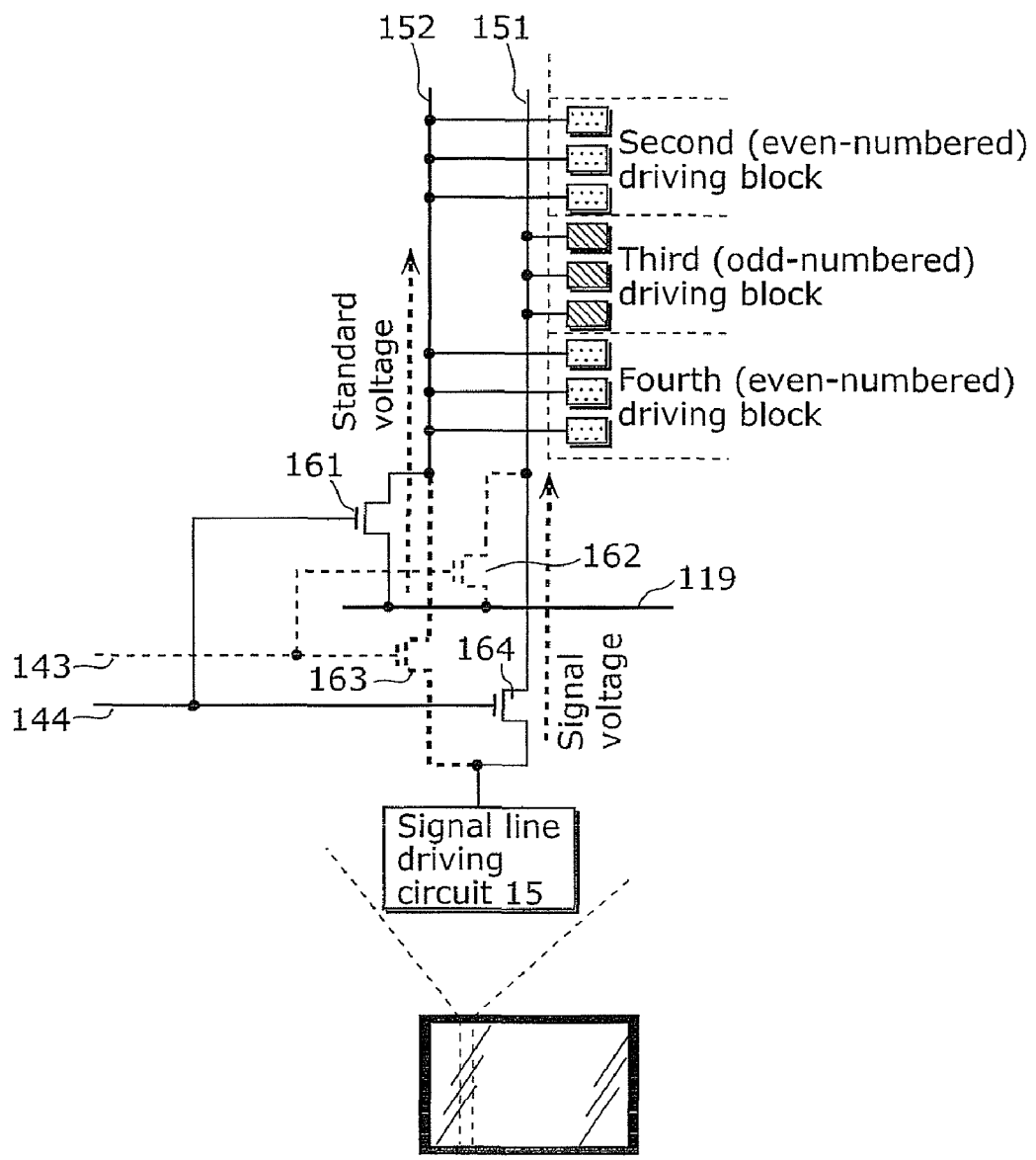
FIG. 9A is a state transition diagram of the selector circuit in the period from T1 to T2 illustrated in FIG. 8.
Figure 9B:
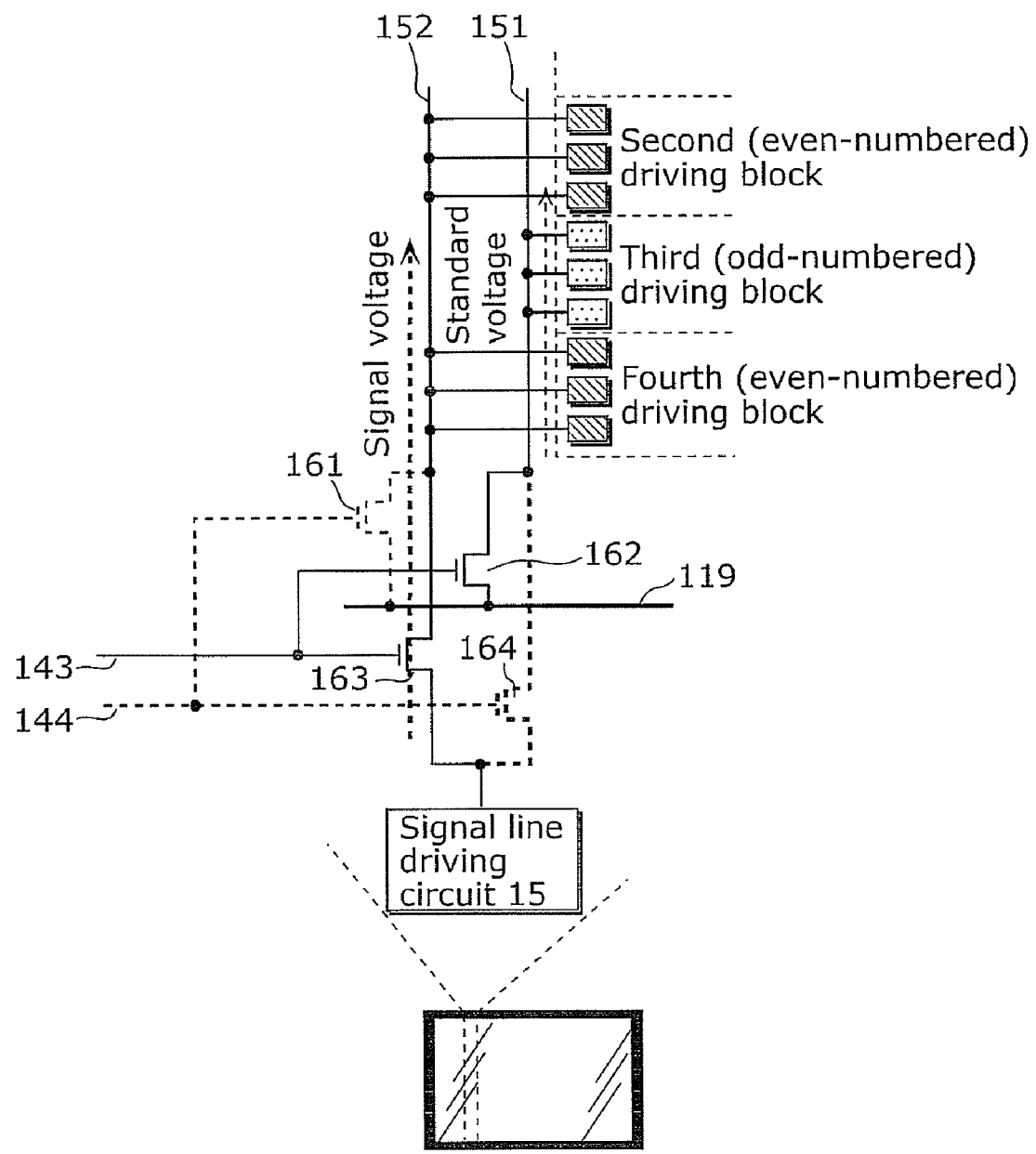
FIG. 9B is a state transition diagram of the selector circuit in the period from T0 to T1 illustrated in FIG. 8.

FIG. 8 is a timing chart of an operation for driving the selector circuit according to the first embodiment of the present invention. The horizontal axis of the timing chart represents time. Shown in the timing chart in rows are, in order from top, waveforms of voltages appearing on scanning lines 133 (1, 1) and 133 (1, m) in a first driving block, scanning lines 133 (2, 1) and 133 (2, m) in a second driving block, scanning lines 133 (3, 1) and 133 (3, m) in a third driving block, scanning lines 133 (4, 1) and 133 (4, m) in a fourth driving block, a first signal line 151, a second signal line 152, a control line 143, a control line 144, and the signal line driving circuit 15. FIG. 9A is a state transition diagram of the selector circuit in the period from T1 to T2 in FIG. 8. FIG. 9B is a state transition diagram of the selector circuit in the period from T0 to T1 in FIG. 8. For the sake of making the operation of the selector circuit clearly understandable, it is assumed in FIG. 8 that there are four driving circuits.

The period from T0 to T1 in FIG. 8 corresponds to a threshold voltage detection period in the first driving block, the period from T1 to T2 corresponds to a threshold voltage detection period in the second driving block, the period from T2 to T3 corresponds to a threshold voltage detection period in the third driving block, and the period from T3 to T4 corresponds to a threshold voltage detection period in the fourth driving block. Accordingly, the voltage level of the scanning lines 133 (1, 1) to 133 (1, m) is HIGH in the period from T0 to T1, the voltage level of the scanning line 133 (2, 1) to 133 (2, m) is HIGH in the period T1 to T2, the voltage level of the scanning lines 133 (3, 1) to 133 (3, m) in the period from T2 to T3 is HIGH, and the voltage level of the scanning lines 133 (4, 1) to 133 (4, m) in the period from T3 to T4 is HIGH. In parallel with this, the control line 144 is at a LOW level and the control line 143 is at a HIGH level in the period from T0 to T1 and the period from T2 to T3 to allow the first signal line 151 carry a standard voltage. In the period from T1 to T2 and the period from T3 to T4, on the other hand, the control line 144 is HIGH and the control line 143 is LOW to allow the second signal line 152 to carry the standard voltage. It should be noted that the signal line driving circuit 15 is constantly outputting a signal voltage.

Times T0 and T2 in FIG. 8 correspond to time t0 in FIG. 5. At time T0, the voltage level of the scanning lines 133 (1, 1) to 133 (1, m) is simultaneously changed from LOW to HIGH. At time T2, the voltage level of the scanning lines 133 (3, 1) to 133 (3, m) is simultaneously changed from LOW to HIGH. At the points in time, the scanning/control line driving circuit 14 changes the voltage level of the control line 144 from HIGH to LOW and changes the voltage level of the control line 143 from LOW to HIGH. The changes of the voltage level at times T0 and T2 place the selector circuit 16 at one pixel column in the state illustrated in FIG. 9B. Specifically, the switching transistors 162 and 163 whose gates are connected to the control line 143 is turned on and the switching transistors 161 and 164 whose gates are connected to the control line 144 are turned off. As a result, the voltage of the first signal line 151 to which the pixels 11A in the first driving block and the third driving block are connected changes to a standard voltage and the voltage of the second signal line 152 changes to a signal voltage at the times T0 and T2.

As a result, at time t0 in FIG. 5, the standard voltage is applied to the gate of every driving transistor 114 of the k-th driving block.

Then, at time t1, the scanning/control line driving circuit 14 changes the voltage level of the first control line 132 (k) from LOW to HIGH. After a predetermined time period has elapsed, at time t2, the scanning/control line driving circuit 14 changes the voltage level to LOW (S13 of FIG. 7). At this point in time, the voltage level of the control line 131 (k) is held LOW. Accordingly, the potential difference between the source electrode S (M) of the driving transistor 114 and the cathode electrode of the organic EL element 113 gradually approaches the threshold voltage of the organic EL element 113. It is assumed here that the standard voltage and the potential on the power source line 112 is 0 V, for example, the potential difference (VgH−VgL) between the HIGH voltage level (VgH) and LOW voltage level (VgL) of the first control line 132(k) is ΔVreset, the capacitance value of the holding capacitor 118 is C2, and the capacitance and the threshold voltage of the organic EL element 113 are $C_{EL}$ and $V_T(EL)$, respectively. Then, at the instant when the voltage level of the first control line 132 (k) is changed from LOW to HIGH, the potential Vs at the source electrode S (M) of the driving transistor 114 becomes approximately equal to the sum of the voltage divided by C2 and $C_{EL}$ plus $V_T(EL)$:

[Math. 1]

$$V_S \approx \frac{C_2}{C_2 + C_{EL}} \Delta V_{reset} + V_{T(EL)} \quad \text{(Formula 1)}$$

Then, self-discharge of the organic EL element 113 occurs as illustrated in FIG. 6(b) and accordingly Vs gradually approaches $V_T(EL)$ in a steady state. That is, Vs→$V_T(EL)$.

Then, at time t2, the scanning/control line driving circuit 14 changes the voltage level of the first control line 132 (k) from HIGH to LOW to bias Vs as:

[Math. 2]

$$V_S = V_{T(EL)} - \frac{C_2}{C_1 + C_2 + C_{EL}} \Delta V_{reset} < -V_{th} \quad \text{(Formula 2)}$$

Here, $\Delta_{reset}$ has been set such that the change of the voltage level of the first control line 132 (k) from HIGH to LOW causes a gate-source voltage Vgs higher than the threshold voltage $V_{th}$ of the driving transistor 114 to appear between the gate and source of the driving transistor 114. That is, the potential difference appearing at the holding capacitor 117 is set at a value that enables the threshold voltage of the driving transistor 114 to be detected. Thus, preparation for a threshold voltage detection stage is completed.

Then, at time t3, the scanning/control line driving circuit 14 changes the voltage level of the second control line 131 (k) from LOW to HIGH to turn on the switching transistor 116. As a result, the driving transistor 114 turns on to allow a drain current to flow into the holding capacitors 117 and 118 and the organic EL element 113, which is in the off state, as illustrated in FIG. 6 (c). Then, Vs defined by Formula 2 gradually approaches $-V_{th}$. As a result, the gate-source voltage of the driving transistor 114 is held in the holding capacitors 117 and 118 and the organic EL element 113. It should be noted that at this point in time the potential at the anode electrode of the organic EL element 113, that is, the potential at the source electrode of the driving transistor 114, is lower than $-V_{th}$ (<0) and the potential at the cathode of the organic EL element 113 is 0 V, thus the organic EL element 113 is reverse biased. Therefore, the organic EL element 113 does not produce luminescence but functions as a capacitor $C_{EL}$.

In the period from time t3 to time t4, the circuit of the pixel 11A enters and stays in a steady state and a voltage equivalent to the threshold voltage $V_{th}$ of the driving transistor 114 is held in the holding capacitors 117 and 118. Note that since current flowing to cause the holding capacitors 117 and 118 to hold the voltage equivalent to the threshold voltage $V_{th}$ is small, it takes time for the circuit to be placed in the steady state. The longer the time period, the more stabilized the voltage held in the holding capacitor 117 becomes. By providing a sufficiently long time for this period, accurate voltage compensation can be achieved.

Then, at time t4, the scanning/control line driving circuit 14 changes the voltage level of the second control line 131 (k) from HIGH to LOW (S14 of FIG. 7). This discontinues the supply of current to the driving transistor 114. At this point in time, a voltage equivalent to the threshold voltage $V_{th}$ of the driving transistors 114 is simultaneously held in the holding capacitors 117 and 118 of all pixels 11A in the k-th driving block.

Then, at time t5, the scanning/control line driving circuit 14 simultaneously changes the voltage level of the scanning lines 133 (k, 1) to 133 (k, m) from HIGH to LOW to turn off the switching transistor 115.

Thus, in the period from time t0 to time t5, correction of the threshold voltage $V_{th}$ of the driving transistors 114 is performed simultaneously in the k-th driving block.

Then, in the period from time t5 to time t7, the scanning/control line driving circuit 14 changes the voltage level of the scanning lines 133 (k, 1) to 133 (k, m) from LOW to HIGH to LOW in sequence to turn on the switching transistors 115 in one pixel at a time in order of pixel row. At this time, the signal line driving circuit 15 changes the voltage of the first signal line 151 from a standard voltage to a signal voltage Vdata (S15 of FIG. 7).

Here, a method for using the selector circuit 16 to change the voltage of the first signal line 151 from the standard voltage to the signal voltage will be described.

Times T1 and T3 in FIG. 8 correspond to time t5 in FIG. 5. At time T1, the voltage level of the scanning lines 133 (1, 1) to 133 (1, m) is simultaneously changed from HIGH to LOW. At time T3, the voltage level of the scanning lines 133 (3, 1) to 133 (3, m) is simultaneously changed from HIGH to LOW. At these points in time, the scanning/control line driving circuit 14 changes the voltage level of the control line 144 from LOW to HIGH and changes the voltage level of the control line 143 from HIGH to LOW. The changes of the voltage level at time T1 and T3 places the selector circuit 16 at one pixel column in the state as illustrated in FIG. 9A. Specifically, the switching transistors 162 and 163 whose gates are connected to the control line 143 are turned off and the switching transistors 161 and 164 whose gates are connected to the control line 144 are turned on.

As a result, the voltage of the second signal line 152 to which the pixels 11B in the second and fourth driving blocks are connected changes to the standard voltage and the voltage of the first signal line 151 changes to the signal voltage at times T1 and T3. As a result, the signal voltage Vdata is applied to the gate of the driving transistor 114 at time t5 in FIG. 5 as illustrated in FIG. 6(d). At this point in time, the potential $V_M$ (=Vs) at a contact M between the holding capacitors 117 and 118 is equal to the amount of change ΔVdata of the signal voltage divided by C1 and C2 plus $-V_{th}$, which is Vs potential at time t4:

[Math. 3]

$$V_M = \frac{C_1}{C_1 + C_2 + C_{EL}} \Delta V_{data} - V_{th} = \frac{C_1}{C_1 + C_2 + C_{EL}} V_{data} - V_{th} \quad \text{(Formula 3)}$$

Specifically, the potential difference Vgs held in the holding capacitor 117 is the difference between Vdata and the potential defined by Formula 3, as follows:

[Math. 4]

$$V_{gs} = \frac{C_2 + C_{EL}}{C_1 + C_2 + C_{EL}} V_{data} + V_{th} \quad \text{(Formula 4)}$$

That is, a sum voltage that is the sum of a voltage according to the signal voltage Vdata and a voltage equivalent to the threshold voltage $V_{th}$ of the driving transistor 114 held previously is held in the holding capacitor 117.

In this way, store of a corrected signal voltage is performed, one pixel row after another in the k-th driving block during the period from time t5 to time t7.

Then, after time t7, the voltage level of the second control line 131 (k) is changed from LOW to HIGH (S16 of FIG. 7). As a result, a driving current according to the sum voltage flows in the organic EL element 113. That is, luminescence production is started simultaneously in all the pixels 11A in the k-th driving block.

In this way, the organic EL elements 113 in the k-th driving block simultaneously produce luminescence after time t7. Here, the drain current $i_d$ flowing through the driving transistor 114 can be expressed using a voltage value that is equal to Vgs defined by Formula 4 minus the threshold voltage $V_{th}$ of the driving transistor 114 as follows:

[Math. 5]

$$i_d = \frac{\beta}{2}\left(\frac{C_2 + C_{EL}}{C_1 + C_2 + C_{EL}} V_{data}\right) \quad \text{(Formula 5)}$$

Here, $\beta$ is a characteristic parameter relating to mobility. It can be seen from Formula 5 that the drain current $i_d$ for causing the organic EL element 113 to produce luminescence is independent of the threshold voltage $V_{th}$ of the driving transistor 114.

Since the pixel rows are grouped into driving blocks, the threshold voltages $V_{th}$ of the driving transistors 114 in the same driving block are compensated for at the same time. The organic EL elements 113 in the same driving block also simultaneously produce luminescence. Accordingly, the driving currents of the driving transistors 114 in the same driving block can be turned on and off in synchronization and the current paths of the driving current from the sources onward can also be controlled in synchronization in the same driving block. Thus, the first control line 132 and the second control line 131 can be shared in the same driving block.

While the scanning lines 133 (k, 1) to 133 (k, m) are individually connected to the scanning/control line driving circuit 14, these scanning lines are driven by a driving pulse at the same timing in the threshold voltage compensation period. Therefore, increase of the frequency of the pulse signal outputted from the scanning/control line driving circuit 14 can be minimized and output load on the driving circuit can be reduced accordingly. Furthermore, since the selector circuit 16 changes mutually exclusively the voltage level of the control signal provided to the control line 144 and the voltage level of the control signal provided to the control line 143 to mutually exclusively turn on/off the switching transistors 161 and 164 and the switching transistors 162 and 163, the signal voltage and the standard voltage are mutually exclusively provided to the first signal line 151 and the second signal line 152. Therefore, only one output line of the signal line driving circuit 15 needs to be provided for two signal lines disposed in each pixel column. Accordingly, the size of the signal line driving circuit 15 can be reduced. The reduction of the number of data drivers 153 and the number of output lines reduces the cost for mounting of the driving circuit and improves manufacturing yield.

Figure 30:
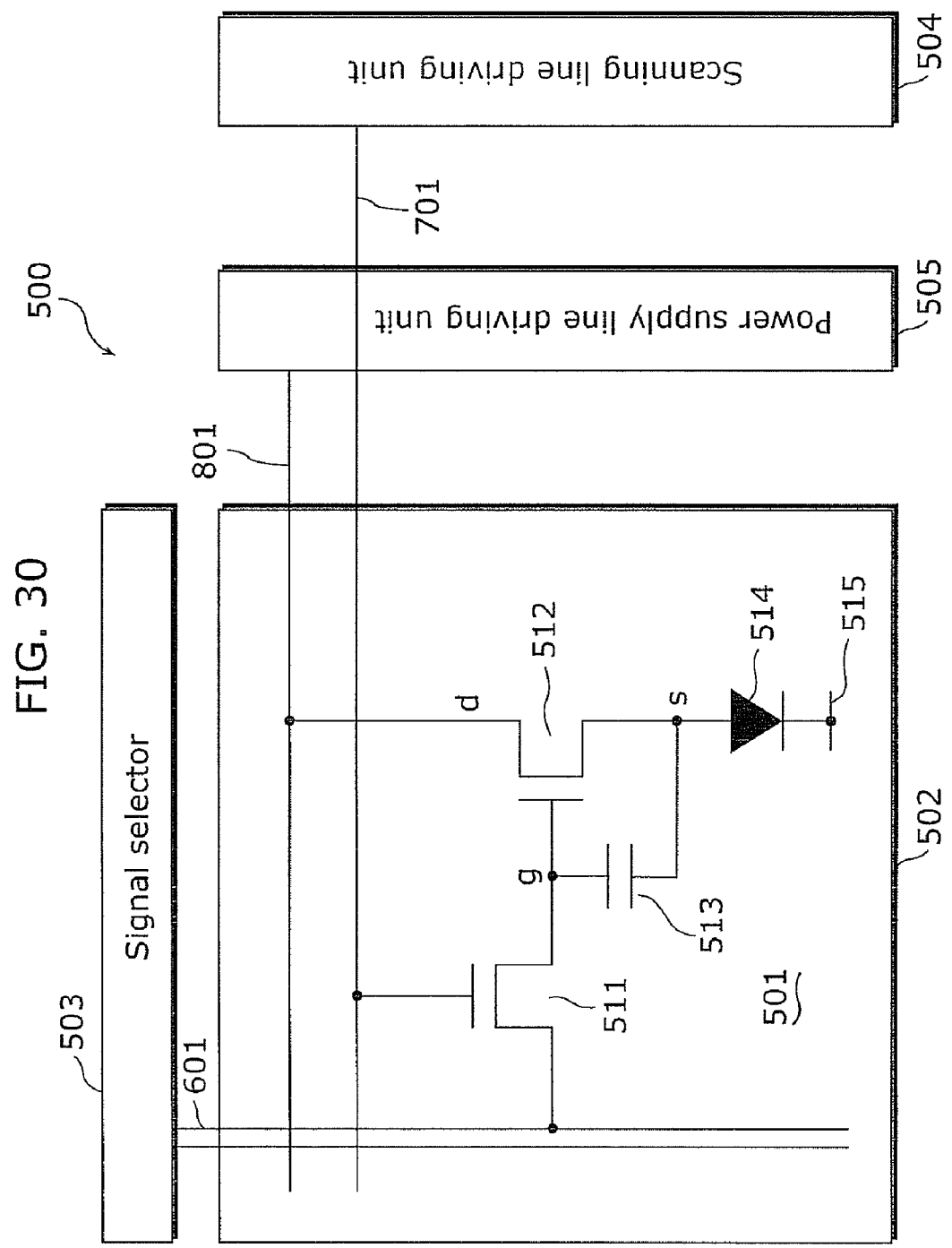
FIG. 30 is a circuit diagram of a pixel of the conventional display device described in Japanese Unexamined Patent Application Publication No. 2008-122633.
Figure 31:
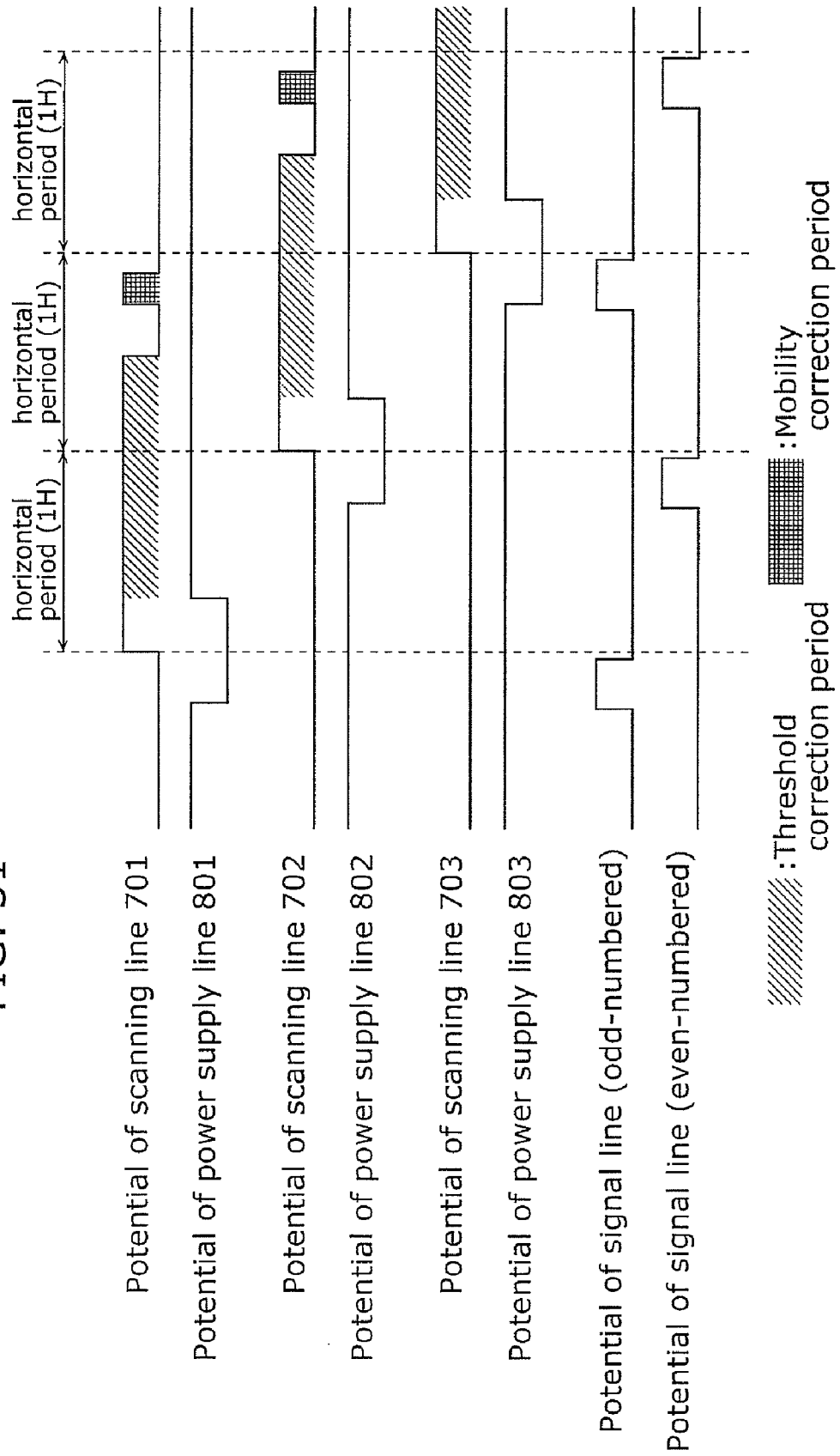
FIG. 31 is a timing chart of an operation of the display device described in Japanese Unexamined Patent Application Publication No. 2008-122633.

On the other hand, it is difficult for the conventional display device 500 described in Japanese Unexamined Patent Application Publication No. 2008-122633 to accomplish the driving method that places only a low output load on the driving circuit described above. The pixel circuit illustrated in FIG. 30 compensates for a threshold voltage $V_{th}$ of a driving transistor 512. However, after a voltage equivalent to the threshold voltage is held in a holding capacitor 513, the source potential at the driving transistor 512 varies and does not stabilize. Accordingly, in the display device 500, after the threshold voltage $V_{th}$ is held, the sum voltage of the threshold voltage $V_{th}$ plus a signal voltage needs to be immediately stored. Furthermore, a luminescence production operation needs to be performed immediately after the store because the sum voltage is also affected by source potential variations. That is, in the conventional display device 500, the threshold voltage compensation, the signal voltage store, and the luminescence production operation need to be performed in each pixel row and the pixels 501 as illustrated in FIG. 30 cannot be grouped into driving blocks.

In contrast, each of the pixels 11A and 11B of the display device 1 in the present invention has a switching transistor 116 attached to the drain of its driving transistor 114 as described above. Since this arrangement stabilizes the potentials at the gate and source of the driving transistor 114, the time from store of a voltage through threshold voltage correction to store of a signal voltage in addition to the voltage, or the time from the store of the signal voltage to luminescence production can be arbitrarily set for each pixel row. This circuit configuration enables grouping into driving blocks, which enables the threshold voltage correction in the same driving block to occur in the same period and luminescence production in the same driving block to occur in the same period.

Here, a duty cycle of luminescence production, which is defined by a threshold voltage detection period, of the display device with driving blocks according to the present invention will be compared with that of the conventional display device using two signal lines described in Japanese Unexamined Patent Application Publication No. 2008-122633.

Figure 10:
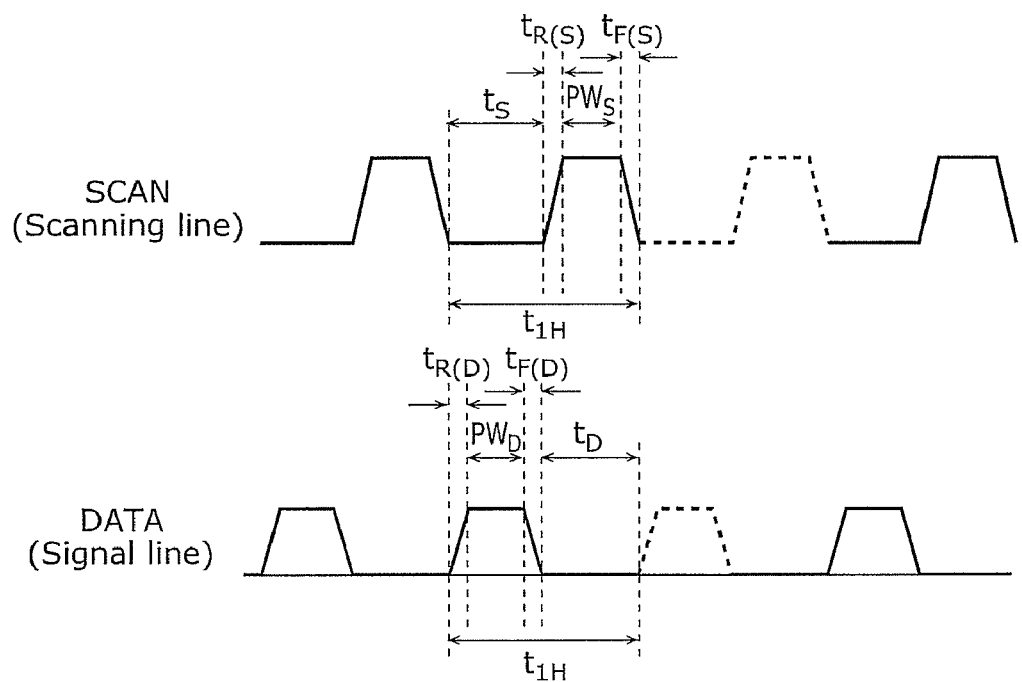
FIG. 10 is a diagram illustrating waveform characteristics of a scanning line and a signal line.

FIG. 10 is a diagram illustrating waveform characteristics of a scanning line and a signal line. The threshold voltage $V_{th}$ detection period in one horizontal period $t_{1H}$ of each pixel row is equivalent to a period $PW_S$ in which the scanning line is in the on state. One horizontal period $t_{1H}$ for the signal line includes a signal voltage supply period $PW_D$ and a standard voltage supply period $t_D$. One horizontal period $t_{1H}$ can be expressed as:

[Math. 6]

$$t_{1H} = t_D + PW_D + t_{R(D)} + t_{F(D)} \quad \text{(Formula 6)}$$

where $t_{R(s)}$ and $t_{F(s)}$ are the rise time and fall time of $PW_S$, respectively, and $t_{R(D)}$ and $t_{F(D)}$ of $PW_D$ are the rise time and fall time of $PW_D$.

Assume $PW_D = t_D$, then

[Math. 7]

$$t_D + PW_D + t_{R(D)} + t_{F(D)} = 2t_D + t_{R(D)} + t_{F(D)} \quad \text{(Formula 7)}$$

from Formulas 6 and 7,

[Math. 8]

$$(t_{1H} - t_{R(D)} - t_{F(D)}) \quad \text{(Formula 8)}$$

The $V_{th}$ detection period needs to start and end within a standard voltage generation period. Assume that a maximum possible $V_{th}$ detection time is ensured, then

[Math. 9]

$$t_D = PW_s + t_{R(s)} + t_{F(s)} \quad \text{(Formula 9)}$$

From Formulas 8 and 9,

[Math. 10]

$$PW_s = (t_{1H} - t_{R(D)} - t_{F(D)} - 2t_{R(S)} - 2t_{F(s)})/2 \quad \text{(Formula 10)}$$

is obtained.

Using Formula 10, the duty cycles of luminescence production of panels that have a vertical resolution of 1080 scanning lines (plus 30 blanking lines) and are driven with 120 Hz will be compared as an example.

Since one horizontal period $t_{1H}$ of the conventional display device 500 using two signal lines is twice as long as one horizontal period of a display device using a single signal line, $t_{1H} = \{1 \text{ second}/(120 \text{ Hz} \times 1110 \text{ lines})\} \times 2 = 7.5 \text{ μS} \times 2 = 15 \text{ μS}$. Here, substituting $t_{R(D)} = t_{F(D)} = 2 \text{ μS}$ and $t_{R(S)} = t_{F(S)} = 1.5 \text{ μS}$ in Formula 10 yields a $V_{th}$ detection period $PW_s$ of 2.5 μS.

Here, assuming that a $V_{th}$ detection period required for providing a sufficiently high degree of accuracy is 1000 μS, then the horizontal periods required for the $V_{th}$ detection are at least 1000 μS/2.5 μS=400 as non-luminescence-production periods. Therefore, the luminescence production duty cycle of the conventional display device 500 using two signal lines is (1110 horizontal periods–400 horizontal periods)/1110 horizontal periods=less than 64%.

The luminescence production duty cycle of the display device using driving blocks according to the present invention will be determined next. Assuming that a $V_{th}$ detection period of 1000 μS is required for ensuring a sufficient degree of accuracy as in the conditions described above, period A (threshold detection preparation period+threshold detection period) illustrated in FIG. 5 is equivalent to the 1000 μS period in the case of block driving. Since the non-luminescence-production period in 1 frame includes period A and the storing period, the non-luminescence-production period of one frame in this case is at least 1000 μS×2=2000 μS. Therefore, the luminescence production duty cycle of the display device using driving blocks according to the present invention is (1 frame time–2000 μS)/1 frame time. Assigning (1 second/120 Hz) to 1 frame time yields less than 76%.

The comparison given above shows that by combining block driving with the conventional display device that uses two signal lines as in the present invention can provide a longer luminescence production duty cycle when the same threshold detection period is set. Thus, a long-life display device with a sufficiently high luminance and a lower output load on the driving circuit can be implemented.

Conversely, it can be appreciated that when the same luminescence production duty cycle is set for the conventional display device that uses two signal lines and the display device that incorporates block driving according to the present invention, the display device in the present invention can provide a longer threshold detection period.

The description returns to the method for controlling the display device 1 according to this embodiment.

At time t8, on the other hand, threshold voltage correction for the driving transistors 114 in the (k+1)-th driving block starts. Immediately before time t8, the voltage level of the scanning lines 133 (k+1, 1) to 133 (k+1, m) are all LOW and the voltage levels of the first control lines 132 (k+1) and the second control line 131 (k+1) are also LOW. Upon changing the voltage level of the second control line 131 (k+1) to LOW, the switching transistors 116 are turned off. As a result, the organic EL elements 113 are optically quenched and all the pixels in the (k+1)-th driving block simultaneously discontinue producing luminescence and a non-luminescence-production period in the (k+1)-th driving block starts.

Then, at time t8, which approximately coincides with time t5, the scanning/control line driving circuit 14 simultaneously changes the voltage level of the scanning lines 133 (k+1, 1) to 133 (k+1, m) from LOW to HIGH to turn on the switching transistors 115. Note that at this point in time, the voltage level of the second control line 131 (k+1) is already LOW and the switching transistors 116 are in the off state (S21 of FIG. 7). Furthermore, at this point in time, the signal line driving circuit 15 has changed the voltage of the second signal line 152 from a signal voltage to a standard voltage (S22 of FIG. 7).

Here, a method for using the selector circuit 16 to change the voltage of the second signal line 152 from the signal voltage to the standard voltage will be described.

Times T1 and T3 in FIG. 8 correspond to time t8 in FIG. 5. At time T1, the voltage level of the scanning lines 133 (2, 1) to 133 (2, m) are simultaneously changed from LOW to HIGH. At time T3, the voltage level of the scanning lines 133 (4, 1) to 133 (4, m) are simultaneously changed from LOW to HIGH. Furthermore, at these points in time, the scanning/control line driving circuit 14 changes the voltage level of the control line 144 from LOW to HIGH and changes the voltage level of the control line 143 from HIGH to LOW. The changes of the voltage levels at time T1 and T3 place the selector circuit 16 at one pixel column in a circuit state as illustrated in FIG. 9A. Specifically, the switching transistors 162 and 163 whose gates are connected to the control line 143 are turned off and the switching transistors 161 and 164 whose gates are connected to the control line 144 are turned on. As a result, the voltage of the second signal line 152 to which the pixels 11B in the second driving block and the fourth driving block are connected changes to the standard voltage at times T1 and T3, whereas the voltage of the first signal line 151 changes to the signal voltage.

As a result, the standard voltage is applied to the gates of all driving transistors 114 in the driving (k+1)-th driving block at time t8 in FIG. 5.

Then, at time t9, the scanning/control line driving circuit 14 changes the voltage level of the first control line 132 (k+1) from LOW to HIGH and, after a predetermined time period has elapsed, at time t10, changes the voltage level to LOW (S23 of FIG. 7). It should be noted that the voltage level of the second control line 131 (k+1) at this point in time is held LOW and therefore the potential difference between the source electrode S(M) of the driving transistor 114 and the cathode electrode of the organic EL element 113 starts to gradually approach the threshold voltage of the organic EL element 113. As a result, the potential difference held in the holding capacitor 117 in the current control unit 100 reaches a level that enables the threshold voltage of the driving transistor 114 to be detected. Thus, preparation for a threshold voltage detection stage is completed.

Then, at time t11, the scanning/control line driving circuit 14 changes the voltage level of the second control line 131 (k+1) from LOW to HIGH to turn on the switching transistor 116. As a result the driving transistor 114 turns on to allow a drain current to flow into the holding capacitors 117 and 118 and the organic EL element 113, which is in the off state. At this point in time, the gate-source voltage of the driving transistor 114 is held in the holding capacitors 117 and 118 and the organic EL element 113. It should be noted that at this point in time the potential at the anode electrode of the organic EL element 113, that is, the potential at the source electrode of the driving transistor 114, is lower than $-V_{th}$ (<0) and the potential at the cathode of the organic EL element 113 is 0 V, thus the organic EL element 113 is reverse biased. Therefore, the organic EL element 113 does not produce luminescence but functions as a capacitor $C_{EL}$.

In the period from time t11 to time t12, the circuit of the pixel 11B enters and stays in a steady state and a voltage equivalent to the threshold voltage $V_{th}$ of the driving transistor 114 is held in the holding capacitors 117 and 118. Note that the longer the time period, the more accurately the threshold voltage $V_{th}$ held in the holding capacitors 117 and 118 is detected. By providing a sufficiently long time for this period, accurate voltage compensation can be achieved.

Then, at time t12, the scanning/control line driving circuit 14 simultaneously changes the voltage level of the scanning lines 133 (k+1, 1) to 133 (k+1, m) from HIGH to LOW to turn off the switching transistors 115 (S24 of FIG. 7). At this point in time, a voltage equivalent to the threshold voltage $V_{th}$ of the driving transistors 114 is simultaneously held in the holding capacitors 117 of all pixels 11B in the (k+1)-th driving block.

Then, at time t13, the scanning/control line driving circuit 14 change the voltage level of the second control line 131 (k+1) from HIGH to LOW.

In this way, the threshold voltages $V_{th}$ of the driving transistors 114 in the (k+1)-th driving block are simultaneously corrected in the period from time t11 to time t12.

Then, after time t13, the scanning/control line driving circuit 14 starts changing the voltage level of the scanning lines 133 (k+1, 1) to 133 (k+1, m) from LOW to HIGH to LOW in sequence to turn on the switching transistors 115 in one pixel row a time in order of pixel row. At the same time, the signal line driving circuit 15 changes the voltage of the second signal line 152 from a standard voltage to a signal voltage (S25 of FIG. 7).

A method for using the selector circuit 16 to change the voltage of the second signal line 152 from the standard voltage to the signal voltage will be described below.

Times T2 and T4 in FIG. 8 correspond to time t13 in FIG. 5. At time T2, the voltage level of the scanning lines 133 (2, 1) to 133 (2, m) is simultaneously changed from HIGH to LOW. At time T4, the voltage level of the scanning lines 133 (4, 1) to 133 (4, m) is simultaneously changed from HIGH to LOW. At this time, the scanning/control line driving circuit 14 changes the voltage level of the control line 144 from LOW to HIGH and changes the voltage level of the control line 143 from HIGH to LOW. The changes in voltage level at times T2 and T4 place the selector circuit 16 at one pixel column in a circuit state as illustrated in FIG. 9B. Specifically, the switching transistors 162 and 163 whose gates are connected to the control line 143 turn on and the switching transistors 161 and 164 whose gates are connected to the control line 144 turn off. As a result, the voltage of the second signal line 152 to which the pixels 11B in the second driving block and the fourth driving block 4 are connected changes to the signal voltage at times T2 and T4, whereas the voltage of the first signal line 151 changes to the standard voltage.

As a result, the signal voltage is applied to the gates of the driving transistors 114 at time t13 in FIG. 5. At this point in time, the sum voltage of a voltage according to the signal voltage Vdata and a voltage equivalent to the threshold voltage $V_{th}$ of the driving transistor 114 previously held is held in the holding capacitor 117.

Thus, after time t13, the corrected signal voltage is stored in the (k+1)-th driving block, one pixel row after another.

Then, after time t15, the voltage level of the second control line 131 (k+1) is changed from LOW to HIGH (S26 of FIG. 7). As a result, a driving current corresponding to the sum voltage described above flows in the organic EL elements 113. That is, all the pixels 11B in the (k+1)-th driving block simultaneously start producing luminescence.

In this way, the organic EL elements 113 in the (k+1)-th driving block simultaneously produce luminescence after time t15.

The operation described above is performed on the (k+2)-th driving block and subsequent driving blocks in the display panel 10 in sequence.

Figure 11:
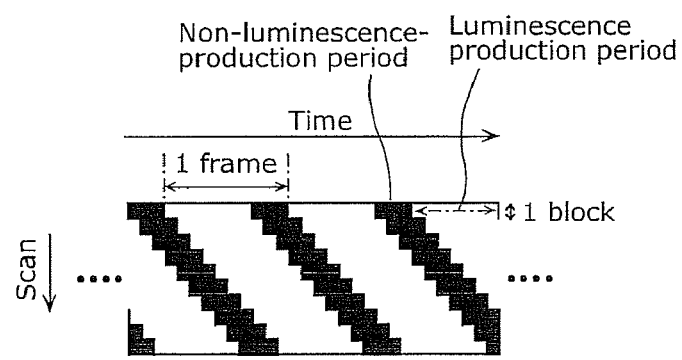
FIG. 11 is a state transition diagram of a driving block which is producing luminescence by a driving method according to an embodiment of the present invention.

FIG. 11 is a state transition diagram of driving blocks that are producing luminescence according to the driving method of the first embodiment of the present invention. FIG. 11 illustrates luminescence production periods and non-luminescence-production periods of each driving block in a pixel column. The vertical axis represents a plurality of driving blocks and the horizontal axis represents elapsed time. Here, a non-luminescence-production period includes a threshold voltage correction period and a signal voltage storing period described above.

According to the method for controlling the display device according to the first embodiment of the present invention, a luminescence production period is set in the same driving block at the same time. Accordingly, the luminescence production periods appear stepwise from driving block to driving block with respect to a row scanning direction.

In this way, pixel circuits in each of which the switching transistor 116 and the holding capacitor 118 are disposed, the selector circuit disposed between the signal line driving circuit 15 and the signal line group 12, the disposition of the control lines, scanning lines and signal lines in the pixels grouped into driving blocks and in the selector circuit, and the control method described above enable the threshold voltage of the driving transistors 114 in the same driving block to be corrected in the same period and at the same timing. Furthermore, a luminescence production period can be caused to occur in the same period and timing in the same driving block. Moreover, the provision of the selector circuit can reduce the number of outputs from the signal line driving circuit 15. The reduction of the number of outputs reduces loads on the scanning/control line driving circuit 14 which outputs a signal controlling conduction and non-conduction of the switch elements and a signal controlling current paths, and loads on the signal line driving circuit 15 which controls a signal voltage, as well as the costs of the driving circuit, and improves panel manufacturing yield. Furthermore, grouping into driving blocks and the two signal lines disposed for each pixel columns enable a larger part of one frame time Tf in which all pixels are refreshed to be allocated to a threshold voltage correction period for the driving transistors 114. This is because a threshold voltage correction period for the (k+1)-th driving block is provided in a period during which a luminance signal is being sampled in the k-th driving block. Thus, the threshold voltage correction period is divided among the driving blocks, rather than being divided among the pixel rows. Accordingly, even the display area is increased, a long threshold voltage correction period can be set relative to one frame time without substantially increasing the number of outputs of the scanning/control line driving circuit 14 and without decreasing the luminescence production duty cycle.

Consequently, a driving current based on an accurately corrected signal voltage flows into the luminescence elements, thereby improving display quality.

For example, if the display panel 10 is divided into N driving blocks, the threshold voltage correction period that is provided for each pixel is Tf/N at the maximum. In contrast, if threshold voltage correction periods are set at different timings for M different pixel rows (M>>N), the threshold voltage correction period that is provided for each pixel is Tf/M at the maximum. If two signal lines as those described in Japanese Unexamined Patent Application Publication No. 2008-122633 are disposed for each pixel column, the threshold voltage correction period provided is 2Tf/M at the maximum.

Furthermore, grouping into driving blocks enables the second control line which controls on and off of application of a voltage to the drains of the driving transistors 114 and the first control line which controls a current path of the driving current from the sources onward can be shared in the same driving block. Accordingly, the number of control lines from the scanning/control line driving circuit 14 is reduced and therefore load on the driving circuit is reduced.

For example, in the conventional display device 500 described in Japanese Unexamined Patent Application Publication No. 2008-122633, two control lines (a power supply line and a scanning line) are disposed for each pixel row. If the display device 500 includes M pixel rows, a total of 2M control lines are provided.

In contrast, in the display device 1 according to the first embodiment of the present invention, one scanning line per pixel row and two control lines per driving block are provided from the scanning/control line driving circuit 14. Accordingly, if the display device 1 includes M pixel rows, a total of (M+2N) control lines (including scanning lines) are provided.

When the display area is increased and the number of pixel rows increases accordingly, M will be much greater than N. In that case, the number of control lines of the display device 1 according to the present invention can be reduced to about half the number of control lines of the conventional display device 500.

Second Embodiment

A second embodiment of the present invention will be described with reference to drawings.

Figure 12:
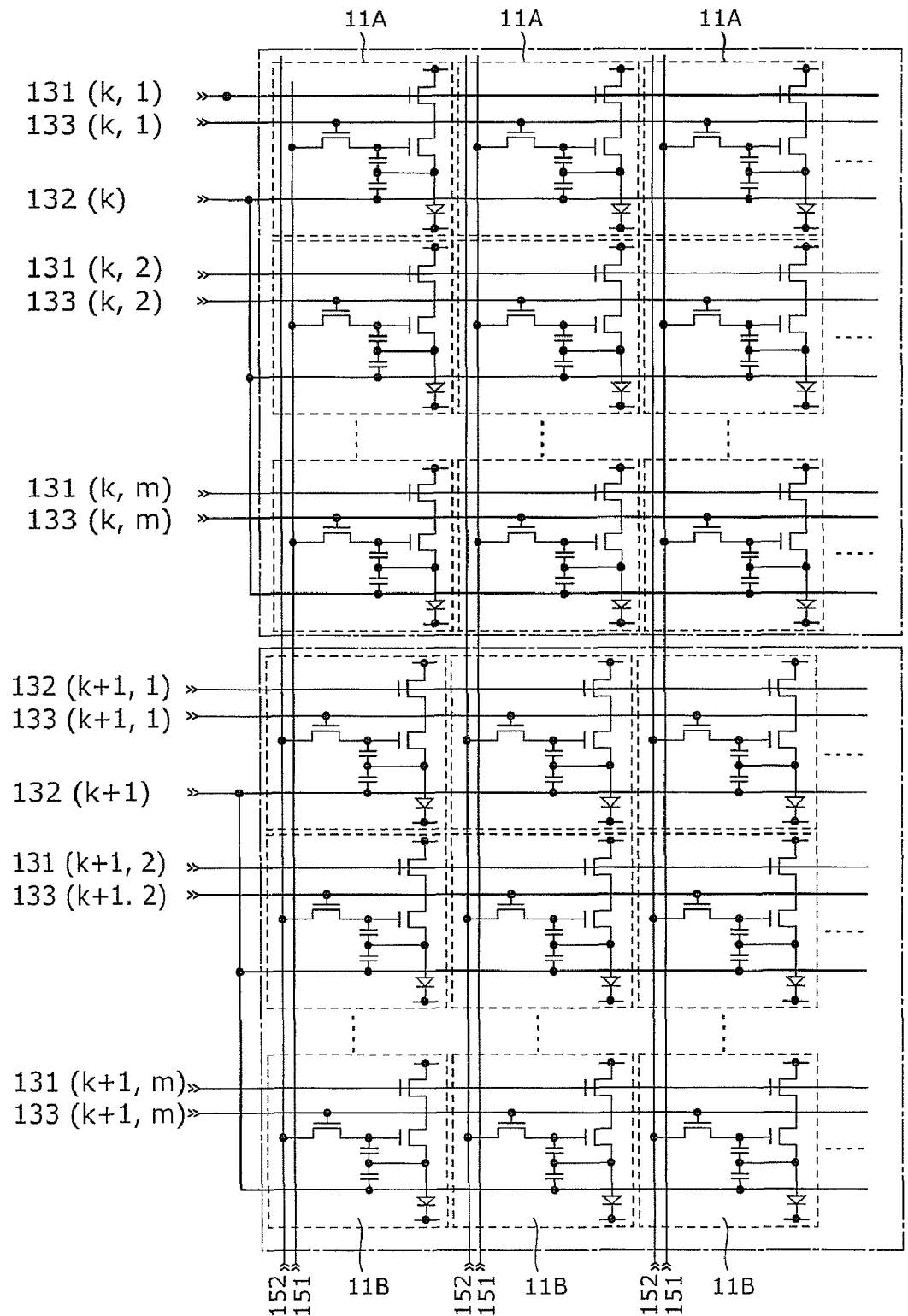
FIG. 12 is a circuit diagram illustrating a portion of a display panel of a display device according to a second embodiment of the present invention.

FIG. 12 is a circuit diagram illustrating a portion of a display panel of a display device according to the second embodiment of the present invention. FIG. 12 illustrates two adjacent driving blocks, control lines, scanning lines, and signal lines. The control lines, the scanning lines, and the signal lines are denoted by a reference numeral followed by (block number, row number in the block) or a reference numeral followed by (block number) in the figure and the following description.

Each pixel of the display device illustrated in FIG. 12 has the same circuit configuration that of the display device 1 according to the first embodiment. The only difference from the display device 1 of the first embodiment is that a second control line 131 in the display device of the second embodiment is not communized in each driving block but a second control line 131 in each pixel row is connected to a scanning/control line driving circuit 14, not shown. In the following description, the same elements as those of the display device 1 according to the first embodiment will be omitted and only differences from the first embodiment will be described.

In the k-th driving block illustrated in the upper part of FIG. 12, second control lines 131 (k, 1) to 131 (k, m) are disposed in each pixel row in the driving block and are each individually connected to a gate of a switching transistor 116 of each pixel 11A. A first control line 132 (k) is connected to holding capacitors 118 of all pixels 11A in the driving block in common. On the other hand, scanning lines 133 (k, 1) to 133 (k, m) are each individually connected to each pixel row. In the (k+1)-th driving block illustrated in the lower part of FIG. 12, connections similar to those of the k-th driving block are made. However, a first control line 132 (k+1) connected to the (k+1)-th driving block is a control line different from the first control line 132 (k) connected to the k-th driving block and individual control signals are outputted from a scanning/control line driving circuit 14.

In the k-th driving block, a first signal line 151 is connected to one of a source or a drain of a switching transistor 115 of every pixel 11A in the diving block. On the other hand, in the (k+1)-th driving block, a second signal line 152 is connected to one of a source and a drain of a switching transistor 115 of every pixel 11B in the driving block.

As described earlier, grouping into driving blocks reduces the number of first control lines 132 which control $V_{th}$ detection circuits. Accordingly, load on the scanning/control line driving circuit 14 which outputs driving signals to the control lines is reduced.

Furthermore, in this embodiment, as in the embodiment in FIG. 1, an output line of a signal line driving circuit 15 is connected to the first signal line 151 and the second signal line 152 through a selector circuit 16.

A method for controlling the display device according to this embodiment will be described with reference to FIG. 13.

Figure 13:
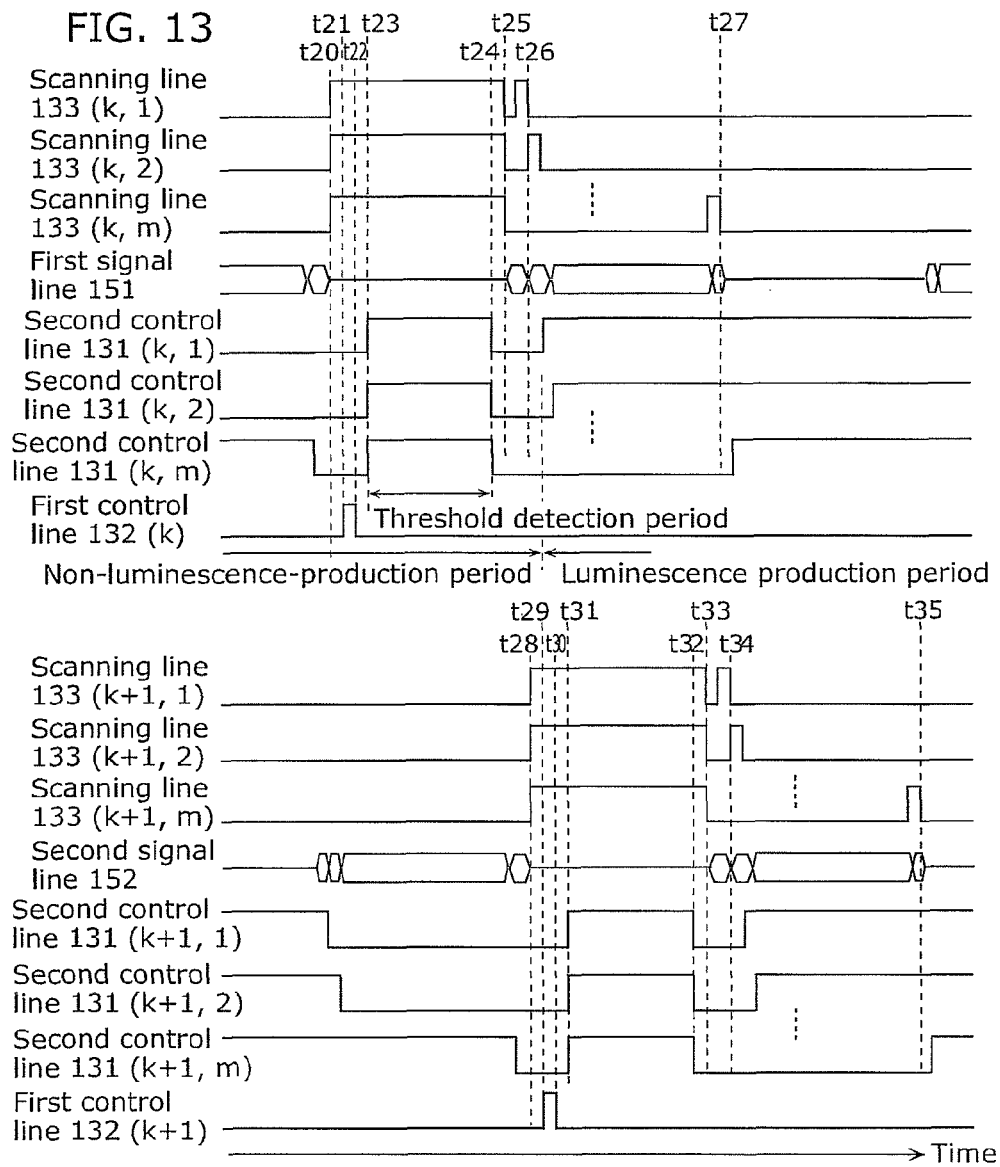
FIG. 13 is a timing chart of an operation of a method for driving the display device according to the second embodiment of the present invention.

FIG. 13 is a timing chart of an operation of a display device driving method according to the second embodiment of the present invention. The horizontal axis of the timing chart represents time. Shown in FIG. 13 in rows are, in order from top, waveforms of voltages appearing on the scanning lines 133 (k, 1), 133 (k, 2), and 133 (k, m), a first signal line 151, the second control lines 131 (k, 1) and 131 (k, m), and the first control line 132 (k) in the K-th driving block. Following these are waveforms of voltages appearing on the scanning lines 133 (k+1, 1), 133 (k+1, 2), and 133 (k+1, m), the second signal line 152, the second control lines 131 (k+1, 1) and 131 (k+1, m), and the first control line 132 (k+1) in the (k+1)-th driving block.

The driving method according to this embodiment differs from the driving method according to the first embodiment illustrated in FIG. 5 only in that a signal voltage storing period and a luminescence production period are set for each pixel row, rather than causing luminescence production in the same period in the same driving block.

First, immediately before time t20, the voltage level of all of the scanning lines 133 (k, 1) to 133 (k, m) are LOW and the voltage level of the first control line 132 (k) and the second control lines 131 (k,1) to 131 (k, m) are also LOW. As illustrated in FIG. 6(a), upon changing the voltage level of the second control lines 131 (k, 1) to 131 (k, m) to LOW, the switching transistor 116 turns off. As a result, organic EL elements 113 are optically quenched and the pixels in each pixel row in the k-th driving block simultaneously discontinue producing luminescence. At the same time, a non-luminescence-production period in the k-th driving block starts.

Then, at time t20, the scanning/control line driving circuit 14 simultaneously changes the voltage level of the scanning lines 133 (k, 1) to 133 (k, m) from LOW to HIGH to turn on the switching transistors 115. Note that at this point in time, the second control lines 131 (k, 1) to 131 (k, m) are already LOW to turn off switching transistors 116 (S11 of FIG. 7). Also at this point in time, a signal line driving circuit 15 changes the voltage of a first signal line 151 from a signal voltage to a standard voltage (S12 of FIG. 7).

Here, a method for using the selector circuit 16 to change the voltage of the first signal line 151 from the signal voltage to the standard voltage will be described.

FIG. 8 is a timing chart of an operation for driving the selector circuit according to the second embodiment of the present invention. Times T0 and T2 in FIG. 8 correspond to time t20 in FIG. 13. At time T0, the voltage level of the scanning lines 133 (1, 1) to 133 (1, m) are simultaneously changed from LOW to HIGH. At time T2, the voltage level of the scanning lines 133 (3, 1) to 133 (3, m) are simultaneously changed from LOW to HIGH. At this point in time, the scanning/control line driving circuit 14 also changes the voltage level of the control line 144 from HIGH to LOW and changes the voltage level of the control line 143 from LOW to HIGH. The changes in the voltage levels at time T0 and T2 place the selector circuit 16 at one pixel column in a circuit state as illustrated in FIG. 9B. Specifically, switching transistors 162 and 163 whose gates are connected to the control line 143 are turned on and switching transistors 161 and 164 whose gates are connected to the control line 144 are turned off. As a result, the voltage of the first signal line 151 to which the pixels 11A in the first driving block and the third driving block are connected changes to a standard voltage at times T0 and T2, whereas the voltage of the second signal line 152 changes to a signal voltage.

As a result, the standard voltage is applied to the gates of all driving transistors 114 in the k-th driving block at time t20 in FIG. 13.

Then, at time t21, the scanning/control line driving circuit 14 changes the voltage level of the first control line 132 (k) from LOW to HIGH and, after a predetermined time period has elapsed, at time t22, changes the voltage level to LOW (S13 of FIG. 7). It should be noted that the voltage level of the second control lines 131 (k, 1) to 131 (k, m) is held LOW at this point in time and therefore the potential difference between the source electrode S(M) of the driving transistor 114 and the cathode electrode of the organic EL element 113 gradually approaches the threshold voltage of the organic EL element 113. The potential Vs at the source electrode S (M) of the driving transistor 114 at time t22 is defined by Formula 2 given in the first embodiment. As a result, the potential difference appearing at the holding capacitor 117 in the current control unit 100 reaches a level that enables the threshold voltage of the driving transistor 114 to be detected. Thus, preparation for a threshold voltage detection stage is completed.

Then, at time t23, the scanning/control line driving circuit 14 simultaneously changes the voltage level of the second control lines 131 (k, 1) to 131 (k, m) from LOW to HIGH to turn on the switching transistors 116. As a result, the driving transistor 114 turns on to allow a drain current to flow into the holding capacitors 117 and 118 and the organic EL element 113, which is in the off state. At this point in time, the Vs defined by Formula 2 starts to gradually approach $-V_{th}$. As a result, the gate-source voltage of the driving transistor 114 is held in the holding capacitors 117 and 118 and the organic EL element 113. It should be noted that at this point in time the potential at the anode electrode of the organic EL element 113, that is, the potential at the source electrode of the driving transistor 114, is lower than $-V_{th}$ ($<0$) and the potential at the cathode of the organic EL element 113 is 0 V, thus the organic EL element 113 is reverse biased. Therefore, the organic EL element 113 does not produce luminescence but functions as a capacitor $C_{EL}$.

In the period from time t23 to time t24, the circuits of the pixels 11A are placed in a steady state and a voltage equivalent to the threshold voltage $V_{th}$ of the driving transistors 114 is held in the holding capacitors 117 and 118. It should be noted that since current flowing to cause the holding capacitors 117 and 118 to hold the voltage equivalent to the threshold voltage $V_{th}$ is small, it takes time for the circuits to be placed in the steady state. The longer the time, the more stabilized the voltage held in the holding capacitor 117 and 118 becomes. By providing a sufficiently long time for this period, accurate voltage compensation can be achieved.

Then, at time t24, the scanning/control line driving circuit 14 simultaneously changes the voltage level of the second control lines 131 (k, 1) to 131 (k, m) from HIGH to LOW (S14 of FIG. 7). This discontinues the supply of current to the driving transistors 114. At this point in time, a voltage equivalent to the threshold voltage $V_{th}$ of the driving transistors 114 is simultaneously held in the holding capacitors 117 and 118 of all pixels 11A in the k-th driving block.

Then, at time t25, the scanning/control line driving circuit 114 simultaneously changes the voltage level of the scanning lines 133 (k, 1) to 133 (k, m) from HIGH to LOW to turn off the switching transistors 115.

Thus, in the period from time t20 to time t25, correction of the threshold voltage $V_{th}$ of the driving transistors 114 is performed in the k-th driving block at the same time.

After time t5, the scanning/control line driving circuit 14 changes the voltage level of the scanning lines 133 (k, 1) to 133 (k, m) from LOW to HIGH to LOW in sequence to turn on the switching transistors 115 in one pixel row at a time in order of pixel row. At this point in time, the signal line driving circuit 15 changes the signal voltage of the first signal line 151 from a standard voltage to a signal voltage $V_{data}$ (S15 of FIG. 7).

Here, a method for using the selector circuit 16 to change the voltage of the first signal line 151 from the standard voltage to the signal voltage will be described.

Times T1 and T3 in FIG. 8 correspond to time t25 in FIG. 13. At time T1, the voltage level of the scanning lines 133 (1, 1) to 133 (1, m) is simultaneously changed from HIGH to LOW. At time T3, the voltage level of the scanning lines 133 (3, 1) to 133 (3, m) is simultaneously changed from HIGH to LOW. At this point in time, the scanning/control line driving circuit 14 changes the voltage level of the control line 144 from LOW to HIGH and the voltage level of the control line 143 from HIGH to LOW. The changes of the voltage level at time T1 and T3 places the selector circuit 16 at one pixel column in the circuit state as illustrated in FIG. 9A. Specifically, switching transistors 162 and 163 whose gates are connected to the control line 143 are turned off and switching transistors 161 and 164 whose gates are connected to the control line 144 are turned on. As a result, the voltage of the second signal line 152 to which the pixels 11B in the second and fourth driving blocks are connected changes to the standard voltage and the voltage of the first signal line 151 changes to the signal voltage at times T1 and T3.

This causes the signal voltage Vdata to be applied to the gate of the driving transistor 114 at time t25 in FIG. 13. At this point in time, the potential Vgs held in the holding capacitor 117 is equal to the difference between $V_{data}$ and the potential defined by Formula 3 given in the first embodiment, that is, Vgs defined by the relationship expressed by Formula 4. Specifically, a sum voltage that is the sum of a voltage according to the signal voltage $V_{data}$ and a voltage equivalent to the threshold voltage $V_{th}$ of the driving transistor 114 held previously is held in the holding capacitor 117.

After the voltage level of the scanning line 133 (k, 1) changes from LOW to HIGH to LOW as described above, the scanning/control line driving circuit 14 changes the voltage level of the second control line 131 (k, 1) from LOW to HIGH. The operation is repeated, one pixel row after another.

In this way, after time t25, storing of the corrected signal voltage and luminescence production are performed in the k-th driving block, one pixel row after another.

After time t26, production of luminescence by the organic EL elements 113 is performed in the k-th driving block, one pixel row after another. Here, the drain current id flowing through the driving transistor 114 is defined by Formula 5 using the voltage $V_{gs}$ defined by Formula 4 given in the first embodiment minus the threshold voltage $V_{th}$ of the driving transistor 114. It can be seen from Formula 5 that the drain current id for causing the organic EL element 113 to produce luminescence is independent of the threshold voltage $V_{th}$ of the driving transistor 114.

As has been described above, by grouping the pixel rows into driving blocks, compensation for the threshold voltages $V_{th}$ of the driving transistors 114 in the same driving block is performed at the same time. This enables synchronization of control of the current path of the driving current from the sources onward in the same driving block. Accordingly, the first control line 132 can be communized in the same driving block.

While the scanning lines 133 (k, 1) to 133 (k, m) are individually connected to the scanning/control line driving circuit 14, these scanning lines are driven by a driving pulse at the same timing in the threshold compensation period. Therefore, increase of the frequency of the pulse signal outputted from the scanning/control line driving circuit 14 can be minimized and output load on the driving circuit can be reduced accordingly.

Furthermore, since the selector circuit 16 changes mutually exclusively the voltage level of the control signal provided to the control line 144 and the voltage level of the control signal provided to the control line 143 to mutually exclusively turn on/off the switching transistors 161 and 164 and the switching transistors 162 and 163, the signal voltage and the standard voltage are mutually exclusively provided to the first signal line 151 and the second signal line 152. Therefore, only one output line of the signal line driving circuit 15 needs to be provided for two signal lines disposed in each pixel column. Accordingly, the size of the signal line driving circuit 15 can be reduced. The reduction of the number of data drivers 153 and the number of output lines reduces the cost for mounting of the driving circuit and improves manufacturing yield.

For the same reason as described in the first embodiment, this embodiment has the advantage that a longer luminescence production duty cycle can be ensured than the conventional display device using two signal lines described in Japanese Unexamined Patent Application Publication No. 2008-122633.

Accordingly, a long-life display device with a sufficiently high luminance and a lower output load on the driving circuit can be implemented.

It can be appreciated that when the same luminescence production duty cycle is set for the conventional display device that uses two signal lines and the display device that incorporates block driving according to the present invention, the display device in the present invention can provide a longer threshold detection period.

Operation of the (k+1)-th driving block in the period from time t28 to time t35 is the same as that of the k-th driving block and therefore description of the operation will be omitted.

The operation described above is performed on the (k+2)-th and the subsequent driving blocks in the display panel 10 in sequence.

Figure 14:
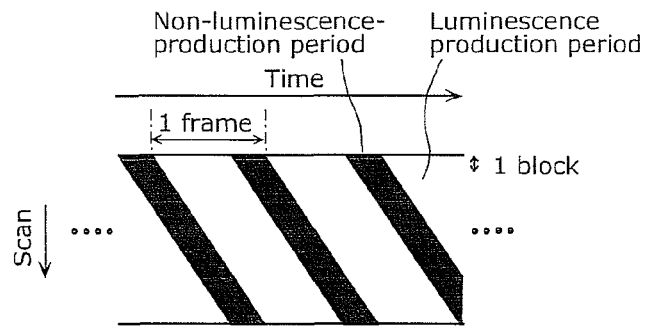
FIG. 14 is a state transition diagram of a driving block which is producing luminescence by the driving method according to the second embodiment of the present invention.

FIG. 14 is a state transition diagram of driving blocks that are producing luminescence according to the driving method of the second embodiment of the present invention. FIG. 14 illustrates luminescence production periods and non-luminescence-production periods of each driving block in a pixel column. The vertical axis represents a plurality of driving blocks and the horizontal axis represents elapsed time. Here, a non-luminescence-production period includes a threshold voltage correction period described above.

According to the display device control method according to the second embodiment of the present invention, a luminescence production period is set for the pixel rows in sequence in the same driving block. Accordingly, the luminescence production periods appear continuously from driving block to driving block with respect to a row scanning direction.

In this way, in the second embodiment, as in the first embodiment, pixel circuits in each of which the switching transistor 116 and the holding capacitor 118 are disposed, the selector circuit disposed between the signal line driving circuit 15 and the signal line group 12, the disposition of the control lines, scanning lines and signal lines in the pixels grouped into driving blocks, and the control method described above enable the threshold voltage of the driving transistors 114 in the same driving block to be corrected in the same period and at the same timing. Moreover, the provision of the selector circuit can reduce the number of outputs from the signal line driving circuit 15. The reduction of the number of outputs reduces loads on the scanning/control line driving circuit 14 which outputs a signal controlling conduction and non-conduction of the switch elements and a signal controlling current paths, and loads on the signal line driving circuit 15 which controls a signal voltage, as well as the costs of the driving circuit, and improves panel manufacturing yield. Furthermore, grouping into driving blocks and the two signal lines disposed for each pixel row enable a larger part of one frame time Tf in which all pixels are refreshed to be allocated to a threshold voltage correction period for the driving transistors 114. This is because a threshold voltage correction period for the (k+1)-th driving block is provided in a period during which a luminance signal is being sampled in the k-th driving block. Thus, the threshold voltage correction period is divided among the driving blocks, rather than being divided among the pixel rows. Accordingly, as the display area is increased, the threshold voltage correction period can be increased relative to one frame time without decreasing the luminescence production duty cycle. Consequently, a driving current based on an accurately corrected signal voltage flows into the luminescence elements, thereby improving display quality.

For example, if the display panel 10 is divided into N driving blocks, the threshold voltage correction period that is provided for each pixel is Tf/N at the maximum.

Third Embodiment

Another embodiment of the present invention will be described below with reference to drawings.

An electrical configuration of a display device according to this embodiment is similar to the configuration illustrated in FIG. 1 with the only difference being the circuit configuration of each pixel.

Specifically, the display device according to this embodiment includes a display panel 10 and a control circuit 20. The display panel 10 includes a plurality of pixels 21A and 21B, which will be described later, a signal line group 12, a set of control lines 13, a scanning/control line driving circuit 14, a signal line driving circuit 15, and a selector circuit 16.

In the following, description of the same components as those of the first and second embodiments will be omitted and only components relating to the pixels 21A and 21B will be described.

The pixels 21A and 21B are arranged in a matrix on the display panel 10. Here, the pixels 21A and 21B make up two or more driving blocks each including a plurality of pixel rows. The pixels 21A make up an odd-numbered driving block and the pixels 21B make up an even-numbered driving block.

Figure 15A:
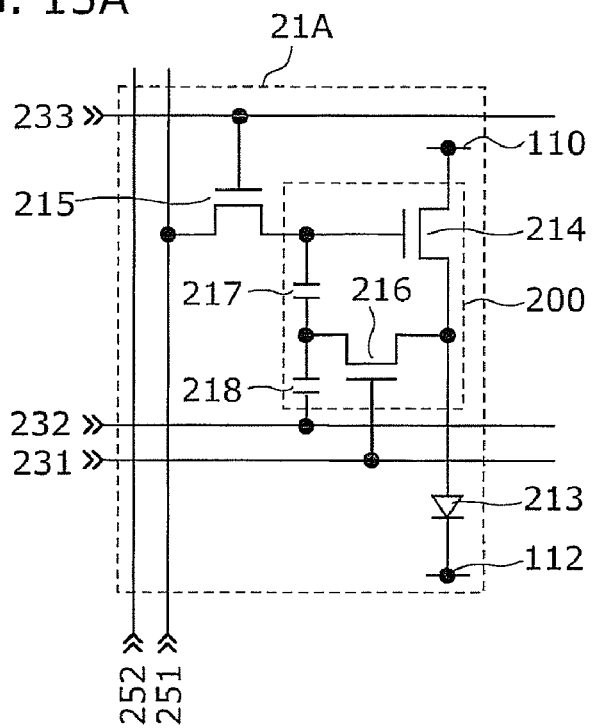
FIG. 15A is a circuit diagram specifically illustrating a pixel in an odd-numbered driving block in an display device according to a third embodiment of the present invention.
Figure 15B:
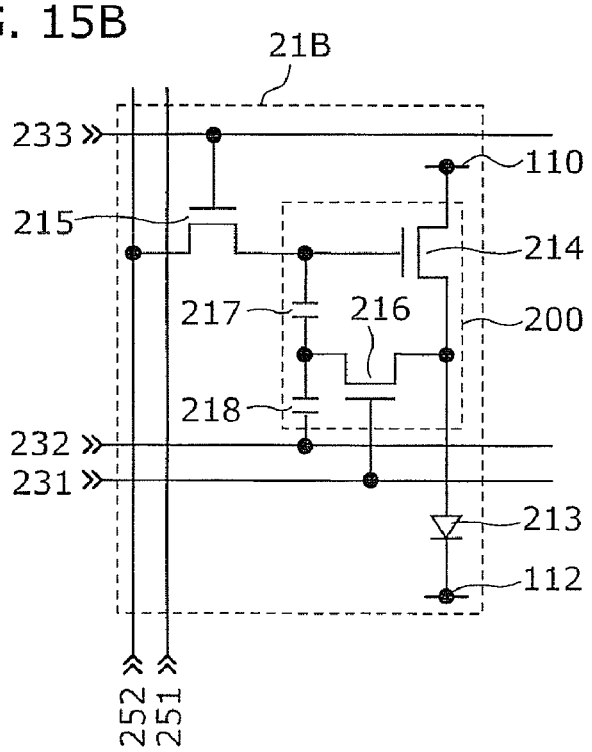
FIG. 15B is a circuit diagram specifically illustrating a pixel in an even-numbered driving block in the display device according to the third embodiment of the present invention.

FIG. 15A is a circuit diagram specifically illustrating a pixel in an odd-numbered driving block in the display device according to the third embodiment of the present invention. FIG. 15B is a circuit diagram specifically illustrating a pixel in an even-numbered driving block in the display device according to the third embodiment of the present invention. The pixel circuits illustrated in FIGS. 15A and 15B differ from the pixel circuits of the first embodiment illustrated in FIGS. 2A and 2B in that a switching transistor 216 is attached instead of the switching transistor 116. Similarly, the current control unit 200 differs from the current control unit 100 according to the first embodiment in that a switching transistor 216 is attached instead of the switching transistor 116. Description of the same components as those of the display device illustrated in FIGS. 2A and 2B will be omitted here.

Each of organic EL elements 213 in FIGS. 15A and 15B is a luminescence element for example having a cathode connected to a power source line 112, which is a negative power source line, and an anode connected to a source of a driving transistor 214, and produces luminescence when a driving current of the driving transistor 214 flows through the organic EL element 213.

The switching transistor 216 is a fourth switching transistor having a gate connected to a second control line 231. One of a source and a drain of the switching transistor 216 is connected to one terminal of a holding capacitor 217 and the other of the source and the drain is connected to the source of the driving transistor 214. The switching transistor 216 has the function of causing the holding capacitor 217 to hold a voltage corresponding to an accurate signal voltage by turning off during a period in which the signal voltage from a signal line is stored. On the other hand, during a threshold voltage detection period and a luminescence production period, the switching transistor 216 turns on to connect the source of the driving transistor 214 to the holding capacitor 217, which is a third capacitive element, and to a holding capacitor 218, which is a fourth capacitive element, to cause the holding capacitor 217 to hold a charge accurately corresponding to a threshold voltage and a signal voltage and to cause the driving transistor 214 to supply a driving current in which the voltage held in the holding capacitor 217 is reflected to the luminescence element.

The second control line 231 is connected to a scanning/control line driving circuit 14 and to the pixels belonging to a pixel row including the pixels 21A and 21B. Thus, the second control line 231 has the function of producing a state for bringing the source of the driving transistor 214 and a node between the holding capacitor 217 and the holding capacitor 218 into or out of conduction.

A first control line 232 is connected to the scanning/control line driving circuit 14 and to the pixels belonging to the pixel row including the pixels 21A and 21B. Thus, the first control line 232 has the function of switching a voltage level to prepare conditions for detecting the threshold voltage of the driving transistor 214.

Connections of the second control lines 231, the first control lines 232, the scanning lines 233, the first signal lines 251, and the second signal lines 252 among the pixels will be described below.

Figure 16:
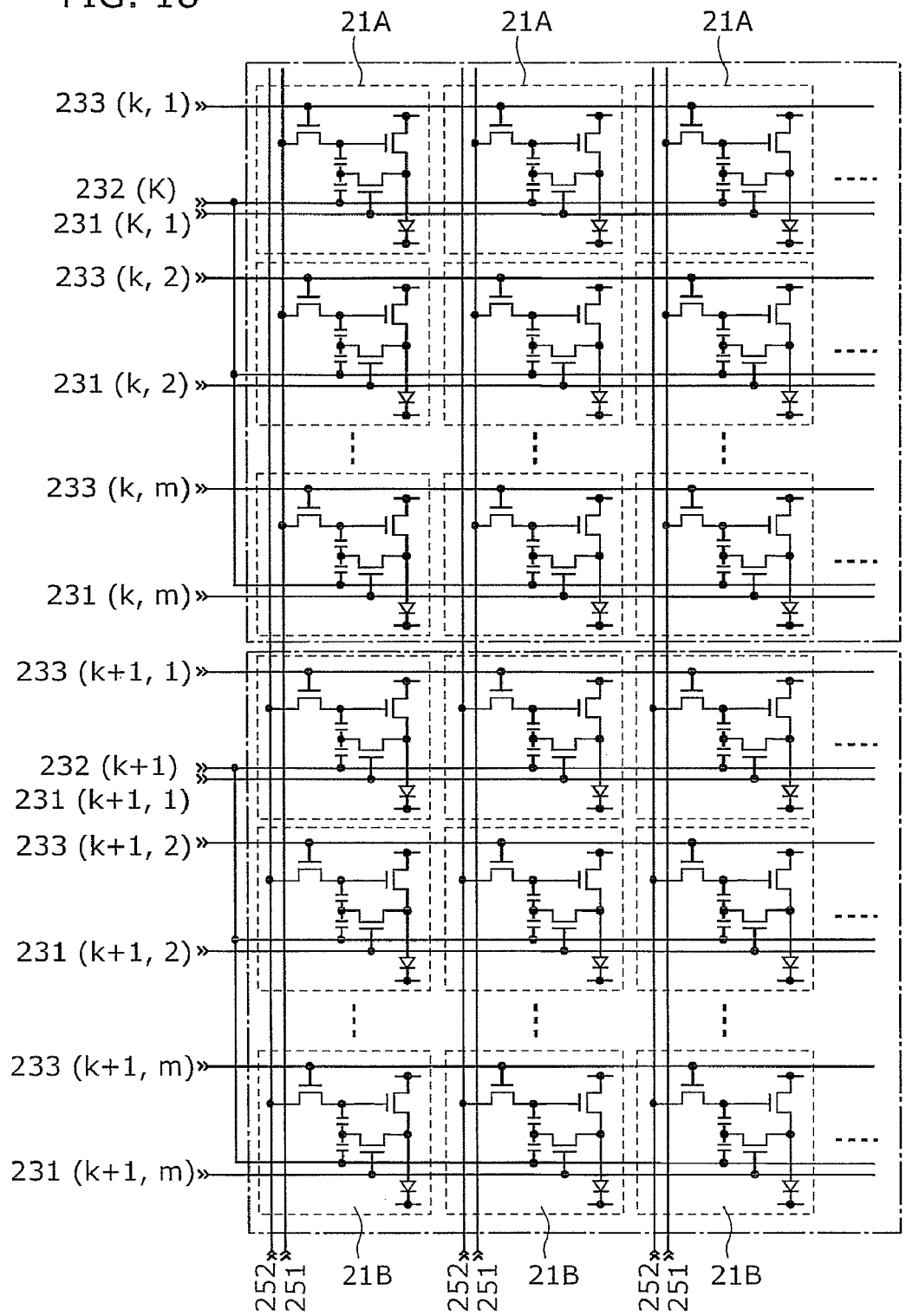
FIG. 16 is a circuit diagram illustrating a portion of a display panel of the display device according to the third embodiment of the present invention.

FIG. 16 is a circuit diagram illustrating a portion of the display panel of the display device according to the third embodiment of the present invention. FIG. 16 illustrates two adjacent driving blocks, control lines, scanning lines, and signal lines. The control lines, the scanning lines, and the signal lines are denoted by a reference numeral followed by (block number, row number in the block) or a reference numeral followed by (block number) in the figure and the following description.

As described earlier, a driving block is made up of a plurality of pixel rows and two or more driving blocks exist in the display panel 10. For example, each of the driving blocks depicted in FIG. 16 is made up of m pixel rows.

In the k-th driving block illustrated in the upper part of FIG. 16, second control lines 231 (k, 1) to 231 (k, m) are disposed in each pixel row in the driving block and are each individually connected to the gate of the switching transistor 216 of each pixel 21A. A first control line 232 (k) is connected to holding capacitors 218 of all pixels 21A in the driving block in common. On the other hand, scanning lines 233 (k, 1) to 233 (k, m) are each individually connected to each pixel row.

In the (k+1)-th driving block illustrated in the lower part of FIG. 16, connections similar to those of the k-th driving block are made. However, the first control line 232 (k+1) connected to the (k+1)-th driving block is a control line different from the first control line 232 (k) connected to the k-th driving block and individual control signals are outputted from the scanning/control line driving circuit 14 to first control lines 232 (k) and (k+1).

In the k-th driving block, a first signal line 251 is connected to one of a source and a drain of a switching transistor 215 of every pixel 21A in the diving block. On the other hand, in the (k+1)-th driving block, a second signal line 252 is connected to one of a source and a drain of a switching transistor 215 of every pixel 21B in the driving block.

As described earlier, grouping into driving blocks reduces the number of first control lines 232 which control $V_{th}$ detection circuits.

Accordingly, size of the scanning/control line driving circuit 14 which outputs driving signals to the control lines is reduced. Furthermore, a longer $V_{th}$ detection time can be ensured to increase the accuracy of detection of $V_{th}$, increasing the quality of display.

A method for controlling the display device according to this embodiment will be described below with reference to FIG. 17. Here, the control method for the display device having the specific circuit configuration illustrated in FIGS. 15A and 15B will be described in detail.

Figure 17:
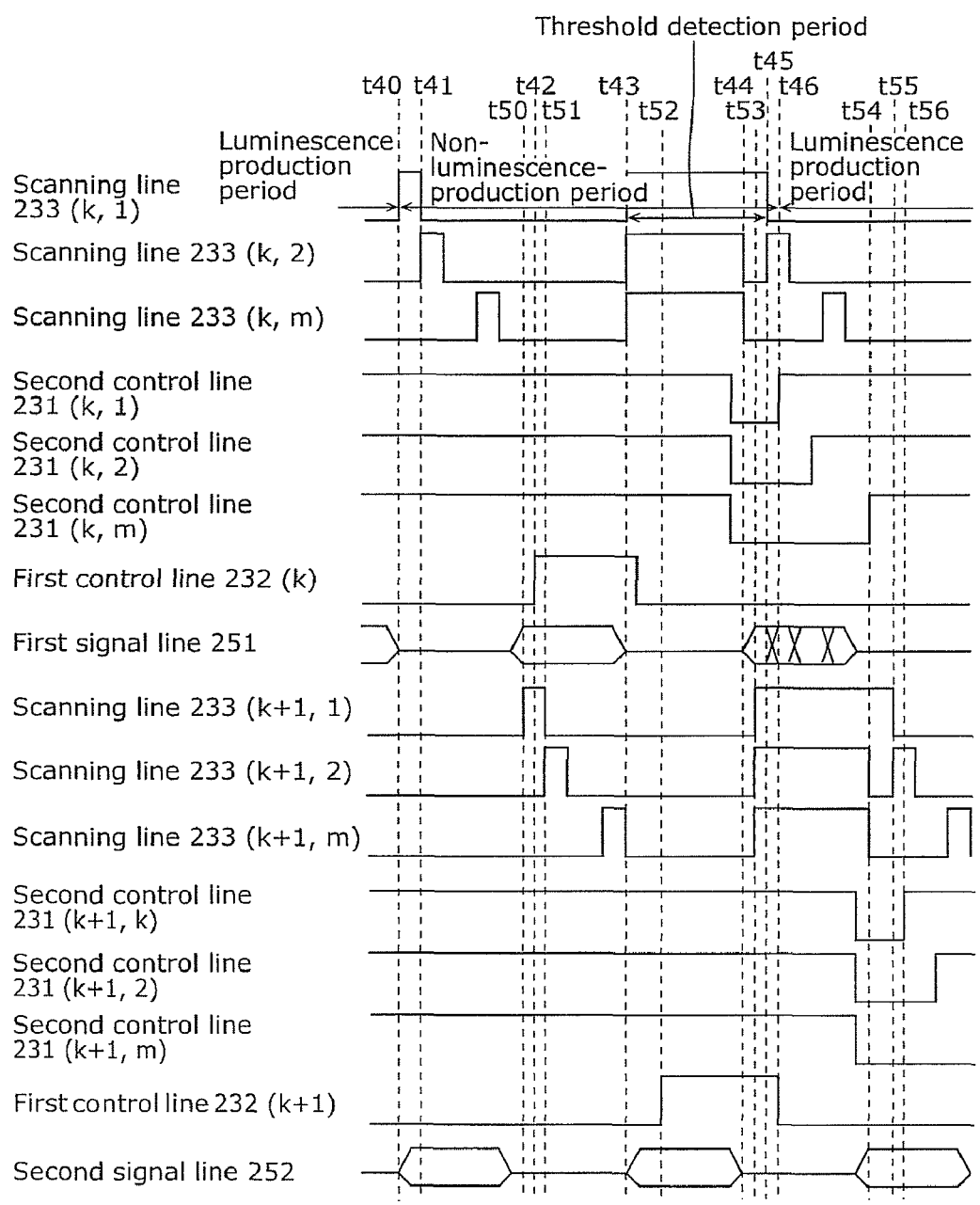
FIG. 17 is a timing chart of an operation of a method for driving the display device according to the third embodiment of the present invention.

FIG. 17 is a timing chart of an operation of a display device driving method according to the third embodiment of the present invention. The horizontal axis of the timing chart represents time. Shown in FIG. 17 in rows are, in order from top, waveforms of voltages appearing on the scanning lines 233 (k, 1), 233 (k, 2), and 233 (k, m), the second control lines

231 (k, 1), 231 (k, 2) and 231 (k, m), the first control line 232 (k), and the first signal line 251 in the K-th driving block. Following these are waveforms of voltages appearing on the scanning lines 233 (k+1, 1), 233 (k+1, 2), and 233 (k+1, m), the second control lines 231 (k+1, 1), 231 (k+1, 2) and 231 (k+1, m), the first control line 232 (k+1), and the second signal line 252 in the (k+1)-th driving block.

Figure 18:
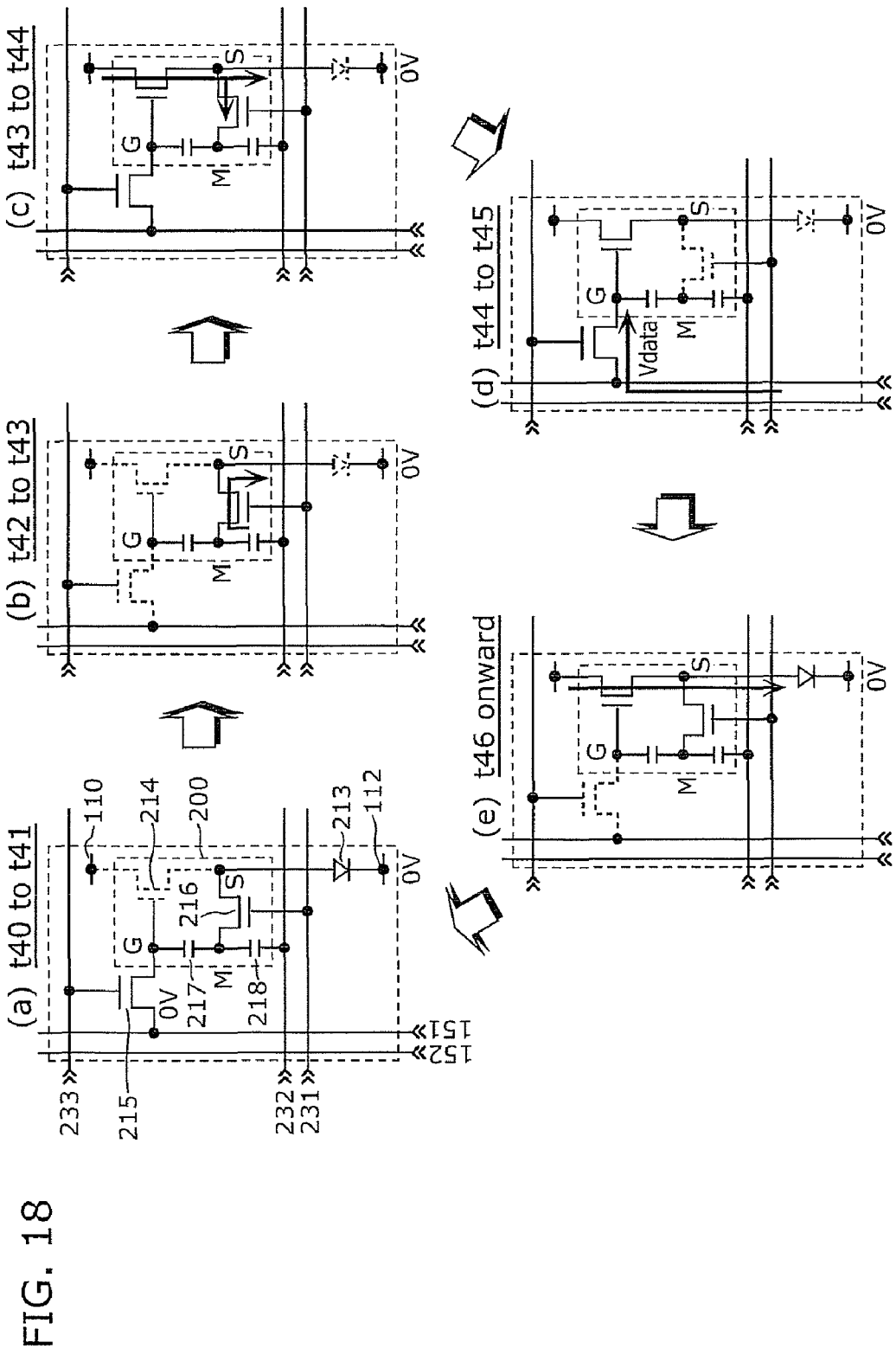
FIG. 18 is a state transition diagram of a pixel of the display device according to the third embodiment of the present invention.
Figure 19:
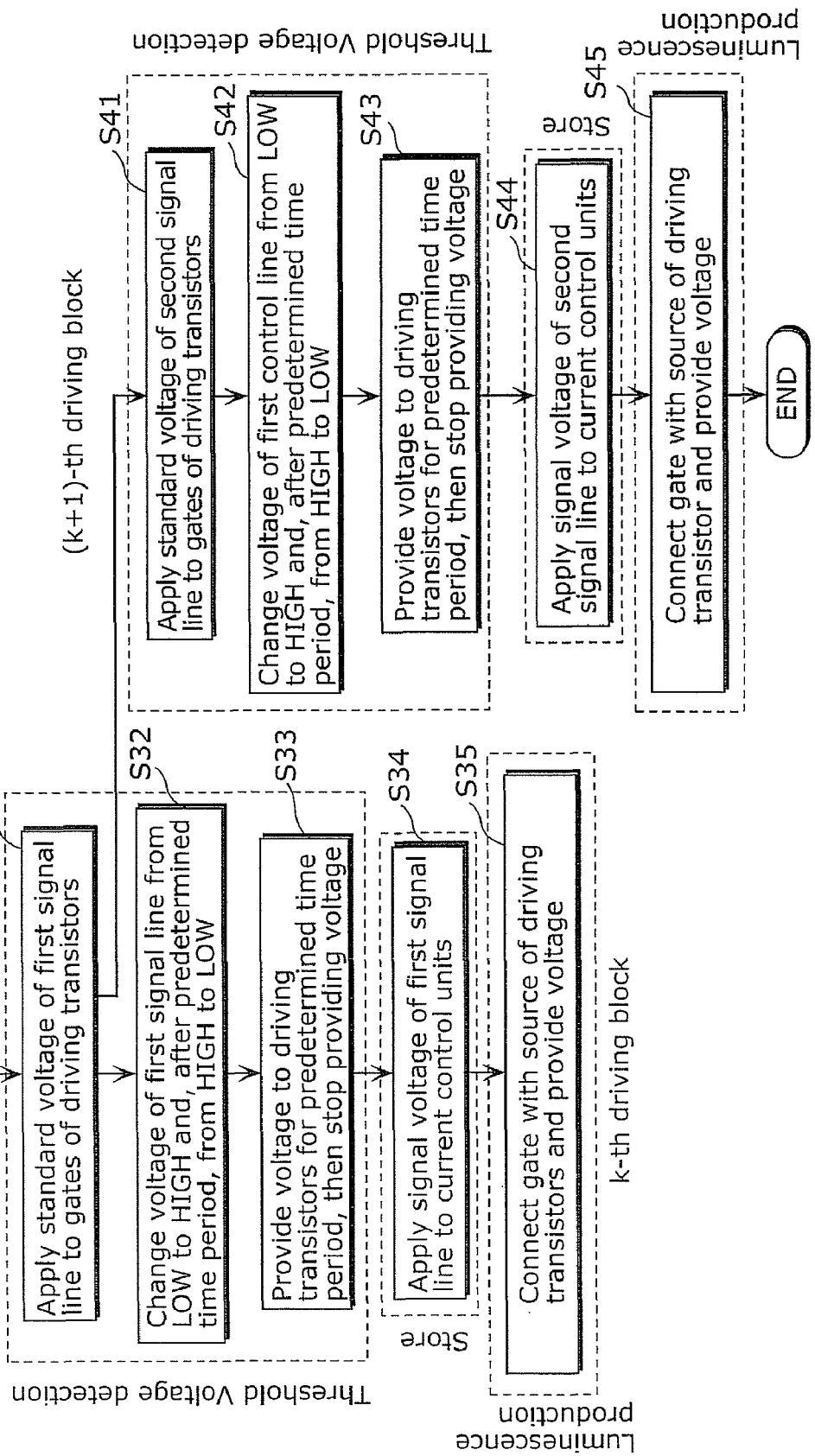
FIG. 19 is a flowchart of an operation of the display device according to the third embodiment of the present invention.

FIG. 18 is a state transition diagram of a pixel of the display device according to third embodiment of the present invention. FIG. 19 is a flowchart of an operation of the display device according to the third embodiment of the present invention.

First, at time t40, the voltage level of the scanning line 233 (k, 1) is changed to HIGH to apply a standard voltage from the first signal line 251 to the gate of the driving transistor 214 (S31 of FIG. 19). At this point in time, the signal line driving circuit 15 changes the voltage of the first signal line 251 from a signal voltage to a standard voltage.

Here, a method for using the selector circuit 16 to change a voltage of the first signal line 251 from the signal voltage to the standard voltage will be described.

Figure 20:
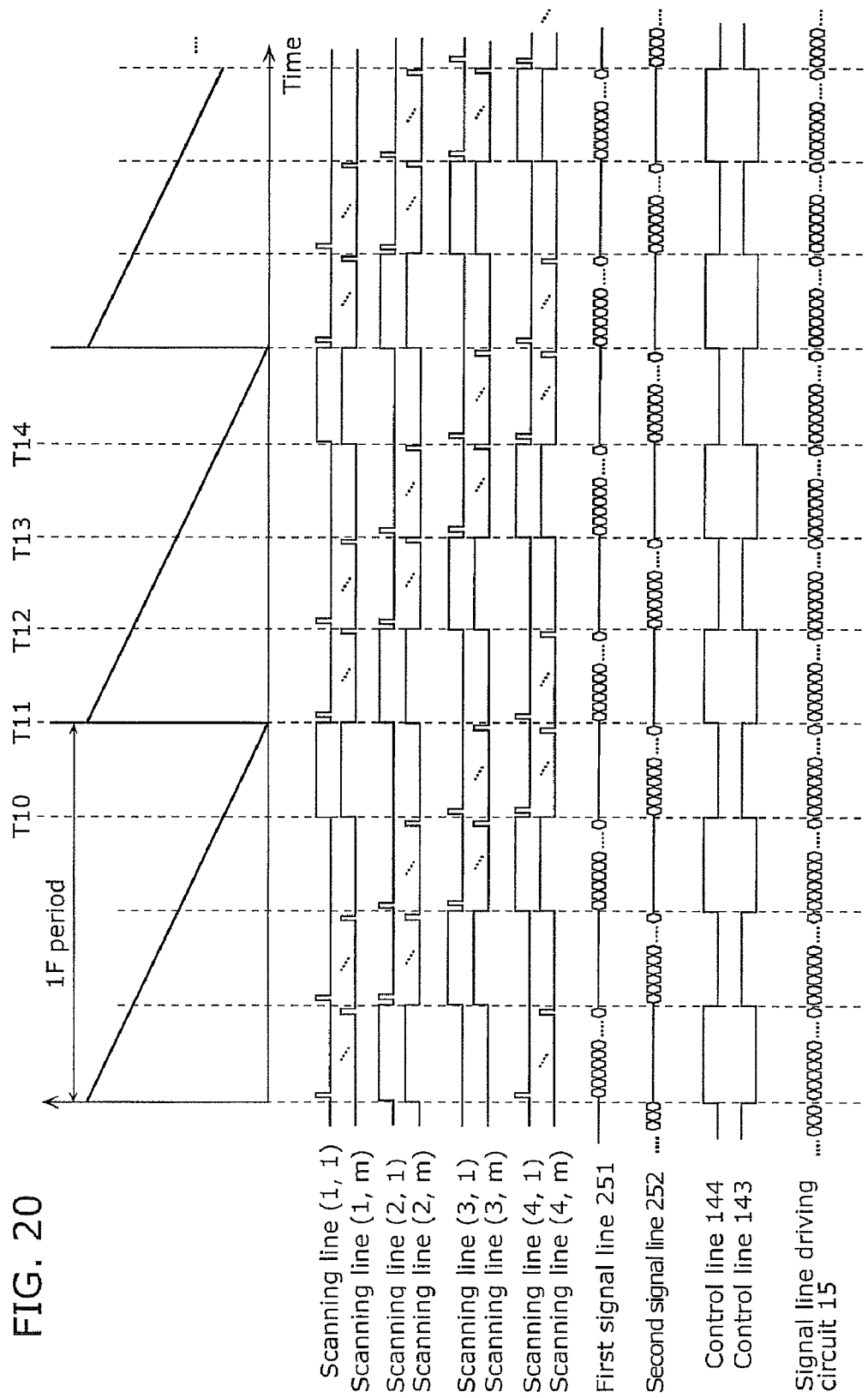
FIG. 20 is a timing chart of an operation for driving a selector circuit according to the third embodiment of the present invention.

FIG. 20 is a timing chart of an operation for driving the selector circuit according to the third embodiment of the present invention.

The horizontal axis of the timing chart represents time. Shown in FIG. 20 in rows are, in order from top, waveforms of voltages appearing on scanning lines 233 (1, 1) and 233 (1, m) in a first driving block, scanning lines 233 (2, 1) and 233 (2, m) in a second driving block, scanning lines 233 (3, 1) and 233 (3, m) in a third driving block, scanning lines 233 (4, 1) and 233 (4, m) in a fourth driving block, a first signal line 251, a second signal line 252, a control line 143, a control line 144, and a signal line driving circuit 15. FIG. 9A represents a state transition diagram of the selector circuit in the period from T10 to T11 and the period from T12 to T13 in FIG. 20. FIG. 9B is a state transition diagram of the selector circuit in the period from T11 to T12 and the period from T13 to T14 in FIG. 20. For the sake of making the operation of the selector circuit clearly understandable, it is assumed in FIG. 20 that there are four driving blocks.

The period from T10 to T11 in FIG. 20 corresponds to a threshold voltage detection period in the first driving block, the period from T11 to T12 corresponds to a threshold voltage detection period in the second driving block, the period from T12 to T13 corresponds to a threshold voltage detection period in the third driving block, and the period from T13 to T14 corresponds to a threshold voltage detection period in the fourth driving block. Accordingly, the voltage level of the scanning lines 233 (1, 1) to 233 (1, m) is HIGH in the period from T10 to T11, the voltage level of the scanning line 233 (2, 1) to 233 (2, m) is HIGH in the period T11 to T12, the voltage level of the scanning lines 233 (3, 1) to 233 (3, m) in the period from T12 to T13 is HIGH, and the voltage level of the scanning lines 233 (4, 1) to 233 (4, m) in the period from T13 to T14 is HIGH. In parallel with this, the control line 144 is at a LOW level and the control line 143 is at a HIGH level in the period from T10 to T11 and the period from T12 to T13 to allow the first signal line 251 carry a standard voltage. In the period from T11 to T12 and the period from T13 to T14, on the other hand, the control line 144 is HIGH and the control line 143 is LOW to allow the second signal line 252 to carry the standard voltage. It should be noted that the signal line driving circuit 15 is constantly outputting a signal voltage.

Times T12 and T14 in FIG. 20 correspond to time t40 in FIG. 17. In the period from time T12 to time T13, the voltage level of the scanning lines 233 (1, 1) to 233 (1, m) is changed in sequence from LOW to HIGH to LOW. After time T14, the voltage level of the scanning lines 233 (3, 1) to 233 (3, m) is changed in sequence from LOW to HIGH to LOW. At times T12 and T14, the scanning/control line driving circuit 14 changes the voltage level of the control line 144 from HIGH to LOW and changes the voltage level of the control line 143 from LOW to HIGH. The changes of the voltage levels at times T12 and T14 place the selector circuit 16 at one pixel column in a circuit state as illustrated in FIG. 9B. Specifically, switching transistors 162 and 163 whose gates are connected to the control line 143 turn on and switching transistors 161 and 164 whose gates are connected to the control line 144 turn off. As a result, the voltage of the first signal line 251 to which the pixels 21A in the first driving block and the third driving block are connected changes to a standard voltage at times T12 and T14, whereas the voltage of the second signal line 252 changes to a signal voltage.

As a result, the standard voltage is applied to the gates of all the driving transistors 214 of the k-th driving block at time t40 in FIG. 17. Here, the standard voltage is 0 V, for example, as shown in FIG. 18(a). The driving block is in luminescence production mode immediately before time t40. The source potential Vs of the driving transistor 214 in this steady state is denoted by $V_{EL}$. Because of this state and because the voltage level of the second control line 231 (k, 1) is HIGH to keep the switching transistor 216 in conduction, $V_{gs}=-V_{EL}<VT$ (TFT). Therefore, the driving transistor 214 turns off.

Then, at time t41, the voltage level of the scanning line 233 (k, 1) is changed to LOW. Then, while the first signal line 251 in the k-th driving block is held at the standard voltage, the voltage level of the scanning line 233 is changed from LOW to HIGH to LOW in sequence one pixel row after another to optically quench the organic EL elements 213 in one pixel row at a time in order of pixel row. That is, luminescence production in the pixels in the k-th driving block ends in order, one pixel row after another, while at the same time non-luminescence-production in the k-th driving block starts, one pixel row after another.

Then, at time t42, the scanning/control line driving circuit 14 changes the voltage level of the first control line 232 (k) from LOW to HIGH and, after a predetermined time period has elapsed, changes the voltage level to LOW (S32 of FIG. 19). During this time, the voltage level of the second control lines 231 (k, 1) to 231 (k, m) is held HIGH. Here, assume that the voltage of the first control line 232 (k) is changed by $\Delta V_{reset}$ (>0) while the switching transistor 215 is off, and the capacitance value of the holding capacitor 218 is C2, the capacitance and threshold voltage of the organic EL element 213 are $C_{EL}$ and $V_T(EL)$, respectively. Then, at the instant when the voltage level of the first control line 232 (k) is changed to HIGH, the potential Vs at the source electrode S (M) of the driving transistor 214 becomes equal to the sum of the voltage divided by C2 and $C_{EL}$ plus $V_T(EL)$:

[Math. 11]

$$V_S = \frac{C_2}{C_2 + C_{EL}} \Delta V_{reset} + V_{T(EL)} \qquad \text{(Formula 11)}$$

Then, the organic EL element 213 starts self-discharge as illustrated in FIG. 18(b) and accordingly Vs gradually approaches $V_T(EL)$ in a steady state.

Then, at time t43, the scanning/control line driving circuit 14 simultaneously changes the voltage level of the scanning lines 233 (k, 1) to 233 (k, m) to HIGH. At this point in time, the signal line driving circuit 15 changes the voltage of the first signal line 251 from the signal voltage to the standard voltage. The method for using the selector circuit 16 to change the voltage of the first signal line 251 from the signal voltage to the standard voltage is the same as the method for changing the voltage of the first signal line 251 from the signal voltage to the standard voltage at time t40 and therefore description of the method will be omitted here.

Then, the scanning/control line driving circuit 14 changes the voltage level of the first control line 232 (k) from HIGH to LOW to bias Vs as:

[Math. 12]

$$V_S = V_{T(EL)} - \frac{C_2}{C_1 + C_2 + C_{EL}} \Delta V_{reset} \quad \text{(Formula 12)}$$

The change from HIGH to LOW of the first control line 232 (k) causes a gate-source voltage Vgs higher than the threshold voltage $V_{th}$ of the driving transistor 214 to appear between the gate and source of the driving transistor 214. That is, a potential difference that enables the threshold voltage of the driving transistor 114 to be detected is caused to appear at the holding capacitor 217. Thus, preparation for a threshold voltage detection stage is completed. At the same time, the driving transistor 214 turns on as illustrated in FIG. 18(c) to allow a drain-source current to flow into the holding capacitors 217 and 218 and the organic EL element 213. At this point in time, Vs defined by Formula 12 starts to gradually approach $-V_{th}$. As a result, $V_{th}$ of the driving transistor 214 is held in the holding capacitors 217 and 218. Note that the current flowing into the organic EL element 213 at this time is not a current for causing the organic EL element 213 to produce luminescence because the anode potential is lower than $-V_{th}$, the cathode potential is 0 V, and therefore the organic EL element 213 is reverse biased.

In the period from time t43 to t44, the circuits of the pixels 21A are in the steady state and a voltage equivalent to the threshold voltage $V_{th}$ of the driving transistor 214 is held in the holding capacitors 217 and 218. Note that since current flowing to cause the holding capacitors 117 and 118 to hold the voltage equivalent to the threshold voltage $V_{th}$ is small, it takes time for the circuit to be placed in the steady state. The longer the time, the more stabilized the voltage held in the holding capacitor 117 becomes. By providing a sufficiently long time for this period, accurate voltage compensation can be achieved.

Then, at time t44, the scanning/control line driving circuit 14 simultaneously changes the voltage level of the scanning lines 233 (k, 1) to 233 (k, m) from HIGH to LOW (S33 of FIG. 19). This completes the storing of $V_{th}$ of the driving transistor 214 in the holding capacitors 217 and 218. At this point in time, a voltage equivalent to the threshold voltage $V_{th}$ of the driving transistor 214 is simultaneously held in the holding capacitors 217 and 218 of all the pixels 21A in the k-th driving block. Note that immediately before time t44, the second control lines 231 (k, 1) to 231 (k, m) have been simultaneously changed to LOW to turn off the switching transistor 216. This prevents a leak current of the driving transistor 214 into the holding capacitors 217 and 218 to change the value of the threshold voltage $V_{th}$ of the driving transistor 214 held in the holding capacitors 217 and 218 after the threshold voltage $V_{th}$ has been detected.

In this way, the threshold voltages of the driving transistors 214 are corrected at the same time in the k-th driving block in the period from time t43 to time t44.

Then, after time t44, the scanning/control line driving circuit 14 changes the voltage level of the scanning lines 233 (k, 1) to 233 (k, m) from LOW to HIGH to LOW in sequence to turn on the switching transistors 215, one pixel row after another. During this time, the signal line driving circuit 15 changes the signal voltage of the first signal line 251 to a signal voltage Vdata according to the luminance value for each pixel (S34 of FIG. 19).

A method for using the selector circuit 16 to change the voltage of the first signal line 251 from the standard voltage to the signal voltage will be descried below.

Times T11 and T13 in FIG. 20 correspond to time t44 in FIG. 17. In the period from time T11 to T12, the voltage level of the scanning lines 233 (1, 1) to 233 (1, m) is changed from LOW to HIGH to LOW in sequence. In the period from time T13 to T14, the voltage level of the scanning lines 233 (3, 1) to 233 (3, m) is changed from LOW to HIGH to LOW in order of pixel row. At times T11 and T13, the scanning/control line driving circuit 14 changes the voltage level of the control line 144 from LOW to HIGH and the voltage level of the control line 143 from HIGH to LOW. The changes of voltage level at times T11 and T13 place the selector circuit 16 at one pixel column in a circuit state as illustrated in FIG. 9A. Specifically, switching transistors 162 and 163 whose gates are connected to the control line 143 are turned off and switching transistors 161 and 164 whose gates are connected to the control line 144 are turned on. As a result, the voltage of the first signal line 251 to which the pixels 21A in the first driving block and the third driving block are connected changes to the signal voltage at times T11 and T13, whereas the voltage of the second signal line 252 changes to the standard voltage.

As a result, the signal voltage Vdata is applied to the gates of the driving transistors 214 as illustrated in FIG. 18(d) at time t44 depicted in FIG. 17. At this point in time, the potential $V_M$ at a contact M between the holding capacitors 217 and 218 is equal to Vdata divided by C1 and C2 plus $-V_{th}$ which is Vs potential at time t44:

[Math. 13]

$$V_M = \frac{C_1}{C_1 + C_2} \Delta V_{data} - V_{th} = \quad \text{(Formula 13)}$$
$$\frac{C_1}{C_1 + C_2}(V_{data} - 0) - V_{th} = \frac{C_1}{C_1 + C_2} V_{data} - V_{th}$$

Specifically, the potential difference $V_{gM}$ held in the holding capacitor 217 is the difference between Vdata and the potential defined by Formula 13:

[Math. 14]

$$V_{gM} = \frac{C_2}{C_1 + C_2} V_{data} + V_{th} \quad \text{(Formula 14)}$$

That is, a sum voltage that is the sum of a voltage according to the signal voltage $V_{data}$ and a voltage equivalent to the threshold voltage $V_{th}$ of the driving transistor 214 held previously is held in the holding capacitor 217.

After time t46, the scanning/control line driving circuit 14 changes the voltage level of the control lines 231 (k, 1) to 231 (k, m) from LOW to HIGH in sequence to turn on the switching transistors 216 in one pixel row at a time in order of pixel row (S35 of FIG. 19). As a result, the voltage defined by Formula 13 is applied between the gate and source of the driving transistor 214 and a drain current shown in FIG. 18(e) flows to cause luminescence production according to the threshold-corrected signal voltage in one pixel row at a time.

In this way, store of the corrected signal voltage and luminescence production are performed in one pixel row at a time in order of pixel row in the k-th driving block after time t46.

Here, the drain current id flowing through the driving transistor 214 can be expressed using the voltage that is equal to $V_{gM}$ defined by Formula 14 minus the threshold voltage $V_{th}$ of the driving transistor 214 as follows:

[Math. 15]

$$i_d = \frac{\beta}{2}\left(\frac{C_2}{C_1+C_2}V_{data}\right) \quad \text{(Formula 15)}$$

Here, β is a characteristic parameter relating to mobility. It can be seen from Formula 15 that the drain current id for causing the organic EL element 213 to produce luminescence is independent of the threshold voltage $V_{th}$ of the driving transistor 214 and is not related to a capacitive component of the organic EL element 213.

As described above, since the pixel rows are grouped into driving blocks, the threshold voltages $V_{th}$ of the driving transistors 214 in the same driving block are compensated for at the same time. Accordingly, control of current paths of the driving current from the sources onward can be synchronized in the same driving block. Thus, the first control line 232 can be shared in the same driving block.

While the scanning lines 233 (k, 1) to 233 (k, m) are individually connected to the scanning/control line driving circuit 14, these scanning lines are driven by a driving pulse at the same timing in the threshold voltage compensation period. Therefore, increase of the frequency of the pulse signal outputted from the scanning/control line driving circuit 14 can be minimized and output load on the driving circuit can be reduced accordingly.

Furthermore, since the selector circuit 16 changes mutually exclusively the voltage level of the control signal provided to the control line 144 and the voltage level of the control signal provided to the control line 143 to mutually exclusively turn on/off the switching transistors 161 and 164 and the switching transistors 162 and 163, the signal voltage and the standard voltage are mutually exclusively provided to the first signal line 151 and the second signal line 152. Therefore, only one output line of the signal line driving circuit 15 needs to be provided for two signal lines disposed in each pixel column. Accordingly, the size of the signal line driving circuit 15 can be reduced. The reduction of the number of data drivers 153 and the number of output lines reduces the cost for mounting of the driving circuit and improves manufacturing yield.

For the same reason as described in the first embodiment, this embodiment has the advantage that a longer luminescence production duty cycle can be ensured than the conventional display device using two signal lines described in Japanese Unexamined Patent Application Publication No. 2008-122633.

Accordingly, a long-life display device with a sufficiently high luminance and a lower output load on the driving circuit can be implemented.

It can be appreciated that when the same luminescence production duty cycle is set for the conventional display device that uses two signal lines and the display device that incorporates block driving according to the present invention, the display device in the present invention can provide a longer threshold detection period.

Operation of the (k+1)-th driving block in the period from time t50 to time t56 is the same as that of the k-th driving block and therefore description of the operation will be omitted.

The operation described above is performed on the (k+2)-th and the subsequent driving blocks in the display panel 10 in sequence.

State transitions of driving blocks producing luminescence by the control method according to this embodiment are the same as in the state transition diagram in FIG. 14 and therefore the description of the state transitions will be omitted.

In the third embodiment, as in the first and second embodiments, pixel circuits in each of which the switching transistor 216 and the holding capacitor 218 are disposed, the selector circuit disposed between the signal line driving circuit 15 and the signal line group 12, the disposition of the control lines, scanning lines and signal lines in the pixels grouped into driving blocks, and the control method described above enable the threshold voltage of the driving transistors 214 in the same driving block to be corrected in the same period and at the same timing. Moreover, the provision of the selector circuit can reduce the number of outputs from the signal line driving circuit 15. The reduction of the number of outputs reduces loads on the scanning/control line driving circuit 14 which outputs a signal controlling conduction and non-conduction of the switch elements and a signal controlling current paths, and loads on the signal line driving circuit 15 which controls a signal voltage, as well as the costs of the driving circuit, and improves panel manufacturing yield. Furthermore, grouping into driving blocks and the two signal lines disposed for each pixel row enable a larger part of one frame time Tf in which all pixels are refreshed to be allocated to a threshold voltage correction period for the driving transistors 114. This is because a threshold voltage correction period for the (k+1)-th driving block is provided in a period during which a luminance signal is being sampled in the k-th driving block. Thus, the threshold voltage correction period is divided among the driving blocks, rather than being divided among the pixel rows. Accordingly, as the display area is increased, the threshold voltage correction period can be increased relative to one frame time without decreasing the luminescence production duty cycle. Consequently, a driving current based on an accurately corrected signal voltage flows into the luminescence elements, thereby improving display quality.

For example, if the display panel 10 is divided into N driving blocks, the threshold voltage correction period that is provided for each pixel is Tf/N at the maximum.

Fourth Embodiment

Another embodiment of the present invention will be described below with reference to drawings.

An electrical configuration of a display device according to this embodiment is similar to the configuration illustrated in FIG. 1 with the only difference being the circuit configuration of each pixel.

Specifically, the display device according to this embodiment includes a display panel 10 and a control circuit 20. The display panel 10 includes a plurality of pixels 31A and 31B, which will be described later, a signal line group 12, a set of control lines 13, a scanning/control line driving circuit 14, a signal line driving circuit 15, and a selector circuit 16.

The set of control lines 13 includes scanning lines, control lines, and power source lines that are disposed in each pixel.

A scanning/control line driving circuit 14 outputs a scanning signal to each scanning line in the set of control lines 13, a control signal to each of the control line in the set of control lines 13, and a variable voltage to each of power source lines to drive the circuit elements of the pixels.

The pixels 31A and 31B are arranged in a matrix on the display panel 10. Here, the pixels 31A and 31B make up two or more driving blocks each including a plurality of pixel rows. The pixels 31A make up an odd-numbered driving block and the pixels 31B make up an even-numbered driving block.

In the following, description of the same components as those of the first to third embodiments will be omitted and only components relating to the pixels 31A and 31B will be described.

Figure 21A:
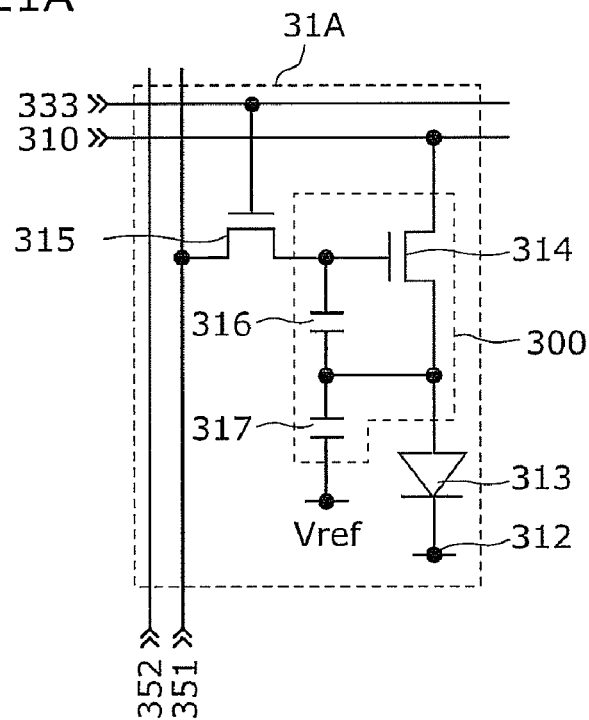
FIG. 21A is a circuit diagram specifically illustrating a pixel in an odd-numbered driving block in a display device according to a fourth embodiment of the present invention.
Figure 21B:
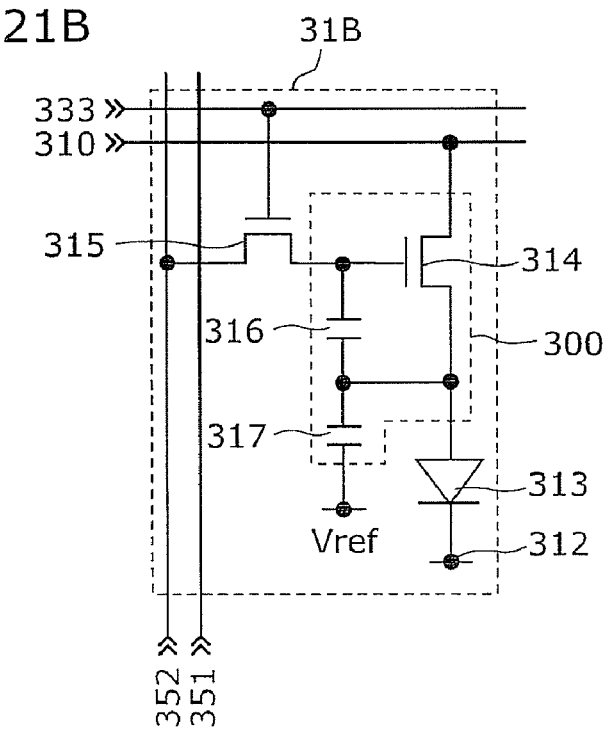
FIG. 21B is a circuit diagram specifically illustrating a pixel in an even-numbered driving block in the display device according to the fourth embodiment of the present invention.

FIG. 21A is a circuit diagram specifically illustrating a pixel in an odd-numbered driving block in the display device according to the fourth embodiment of the present invention. FIG. 21B is a circuit diagram specifically illustrating a pixel in an even-numbered driving block in the display device according to the fourth embodiment of the present invention. Each of the pixels 31A and 31B illustrated in FIGS. 21A and 21B includes an organic EL element 313, a driving transistor 314, a switching transistor 315, holding capacitors 316 and 317, a scanning line 333, a first signal line 351, and a second signal line 352. Here, the driving transistor 314 and the holding capacitors 316 and 317 make up a current control unit 300. The current control unit 300 has the function of converting a signal voltage provided through the first signal line 351 or the second signal line 352 to a signal current, which is a source-drain current of the driving transistor 314. The pixel circuits illustrated in FIGS. 21A and 21B differ from the pixel circuits illustrated in FIGS. 2A and 2B in that the switching transistor 116 is not disposed in the pixels 21A and 21B. Description of the same components as those of the display device illustrated in FIGS. 2A and 2B will be omitted below.

Each organic EL element 313 is a luminescence element for example having a cathode connected to the power source line 312, which is a second power source line, and an anode connected to a source of the driving transistor 314, and produces luminescence when a driving current of the driving transistor 314 flows through the organic EL element 313.

The driving transistor 314 has a drain connected to a power source line 310 and a gate connected to a first electrode of the holding capacitor 316. When a voltage corresponding to a signal voltage is applied to the gate of the driving transistor 314, the driving transistor 314 converts the voltage to a drain current corresponding to the voltage. The drain current is provided to the organic EL element 313 as a driving current. The driving transistor 314 is implemented by an n-type thin-film transistor (n-type TFT).

The switching transistor 315 has a gate connected to a scanning line 333. One of the source and drain of the switching transistor 315 is connected to the gate of the driving transistor 314. The other of the source and drain of the switching transistor 315 in an odd-numbered driving block is connected to the first signal line 351, so that the switching transistor 315 functions as a first switching transistor; in an even-numbered driving block, the other of the source and the drain is connected to the second signal line 352, so that the switching transistor 315 functions as a second switching transistor.

One terminal of the holding capacitor 316 is a sixth capacitive element one terminal of which is connected to the gate of the driving transistor 314 and the other terminal is connected to the source of the driving transistor 314. The holding capacitor 316 has the function of holding charge corresponding to a signal voltage provided through the first signal line 351 or the second signal line 352 and, after the switching transistor 115 is turned off, for example, controlling a driving current provided from the driving transistor 314 to the organic EL element 313.

The holding capacitor 316 is connected to the gate of the driving transistor 314 and to the switching transistor 315 and has the function of detecting a threshold voltage of the driving transistor 314.

The holding capacitor 317 is a holding capacitive element which is connected between the other terminal of the holding capacitor 316 and a reference voltage source (which is illustrated as reference voltage $V_{ref}$ in FIGS. 21A and 21B but may be the power source line 312). In a steady state, the holding capacitor 317 first holds a source potential of the driving transistor 314 so that information on the source potential remains at a node between the holding capacitors 316 and 317 after a signal voltage is applied from the switching transistor 115. It should be noted that the source potential at this timing is the threshold voltage of the driving transistor 314. When subsequently the timing between the holding of the threshold voltage and luminescence production varies among pixel rows, a gate voltage of the driving transistor 314 is fixed because the potential at the other terminal of the holding capacitor 316 is fixed. On the other hand, the source potential of the driving transistor 314 is already in a steady state. Thus, the holding capacitor 317 has the function of holding the source potential of the driving transistor 314 in effect.

It should be noted that the holding capacitor 317 does not necessarily need to be attached as an independent circuit element; the holding capacitor 317 may be a parasitic capacitance of the organic EL element 313.

The power source line 310 provides a first voltage or a second voltage to the drain of the driving transistor 314. The first voltage is lower than a standard voltage provided through the first signal line 351 and the second signal line 352. Application of the first voltage to the drain of the driving transistor 314 can reset the source potential of the driving transistor 314. The second voltage is higher than the standard voltage. Application of the second voltage to the drain of the driving transistor 314 can cause the holding capacitor 316 to hold a voltage corresponding to the threshold voltage or can provide a driving current corresponding to a signal voltage to cause the organic EL element 313 to produce luminescence. The control circuit 20 makes up a control unit and a selector control unit that control operation of each pixel in conjunction with the scanning/control line driving circuit 14 and the signal line driving circuit 15 to control timings of turning on and off the switching transistors of the selector circuit 16.

The control circuit 20 also controls the timings of providing the first and second voltages.

A display device control method according to this embodiment will be described with reference to FIG. 22. Here, a method for controlling a display device having the specific configuration illustrated in FIGS. 21A and 21B will be described. It is assumed here that each driving block includes m pixel rows.

Figure 22:
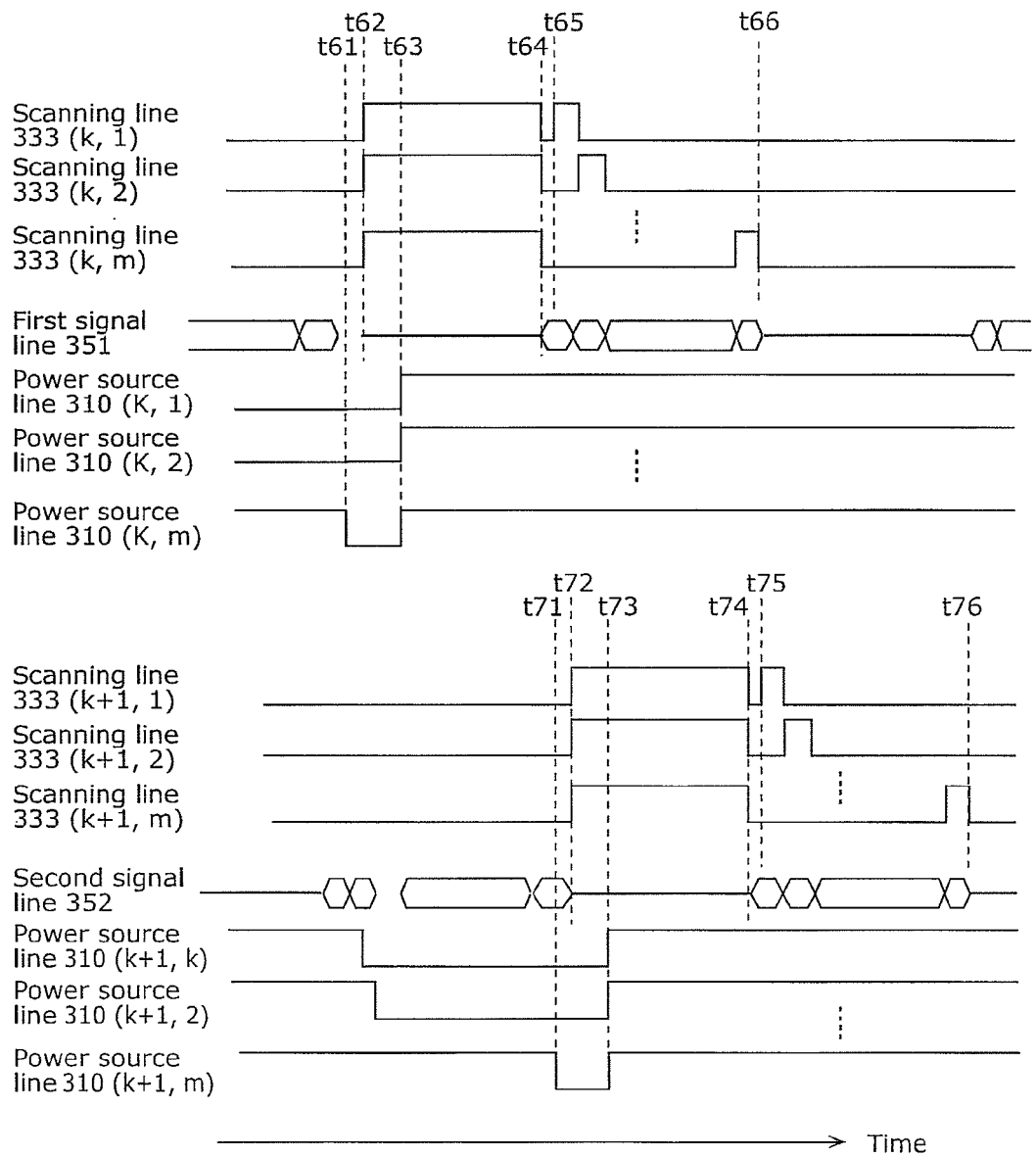
FIG. 22 is a timing chart of an operation of a method for driving the display device according to the fourth embodiment of the present invention.
Figure 23:
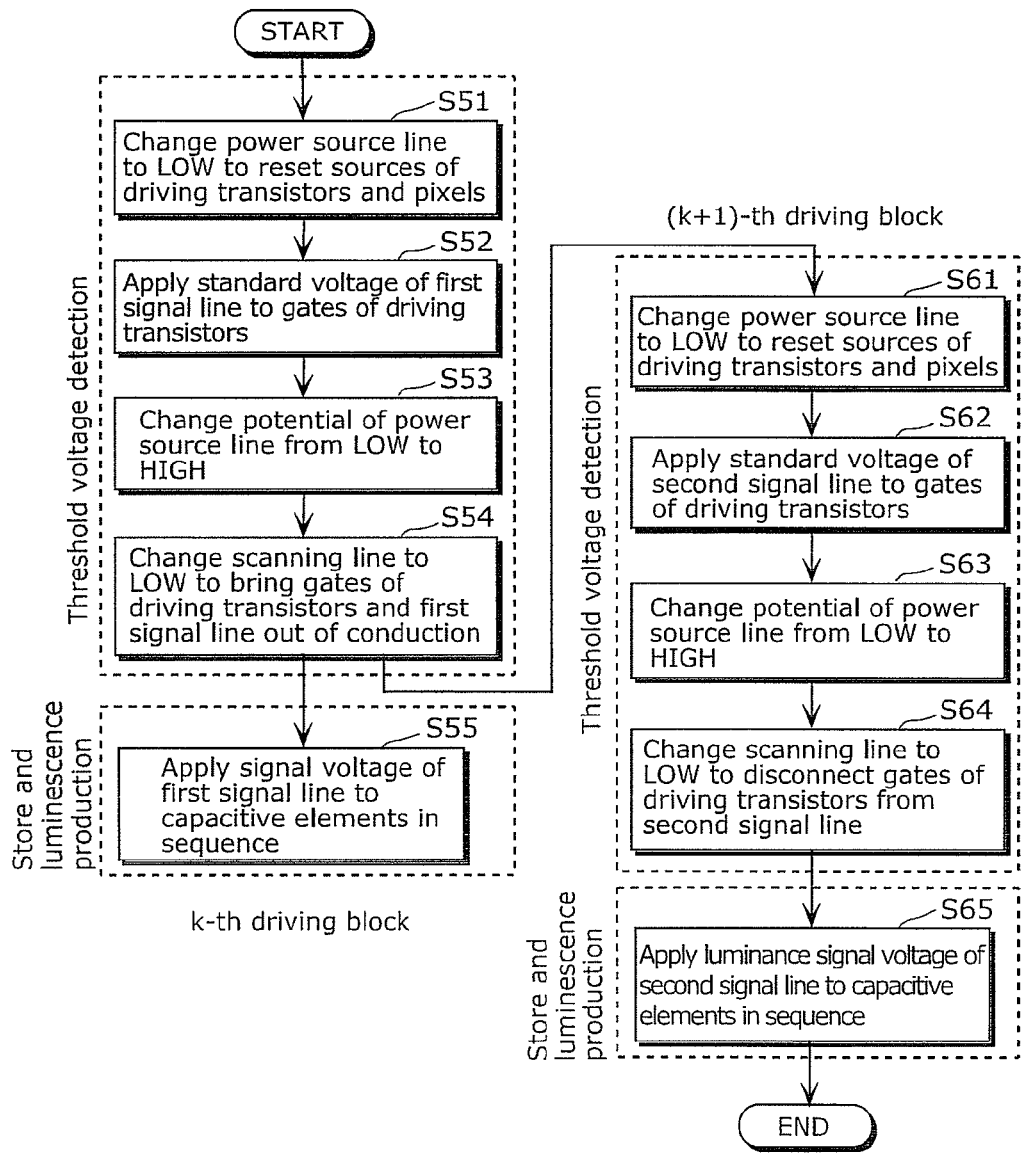
FIG. 23 is a flowchart of an operation of the display device according to the fourth embodiment of the present invention.

FIG. 22 is a timing chart of an operation of the display device driving method according to the fourth embodiment of the present invention. The horizontal axis of the timing chart represents time. Shown in FIG. 22 in rows are, in order from top, waveforms of voltages appearing on a scanning line 333 (k, m) disposed in the first row of the k-th driving block, a scanning line 330 (k, 2) disposed in the second row, and a scanning line 333 (k, m) disposed in the m-th row, a first signal line 351, a power source line 310 (k, 1) disposed in the first row of the k-th driving block, a power source line 310 (k, 2) disposed in the second row, and a power source line 310 (k, m) disposed in the m-th row. Following these are waveforms of voltages appearing on a scanning line 333 (k+1, 1) disposed in the first row of the (k+1)-th driving block, a scanning line 333 (k+1, 2) disposed in the second row, and a scanning line 333 (k+1, m) disposed in the m-th row, a second signal line 352, a power source line 310 (k+1, 1) disposed in the first row of the (k+1)-th driving block, a power source line 310 (k+1, 2) disposed in the second row, and a power source line 310 (k+1, m) disposed on the m-th row. FIG. 23 is a flowchart of an operation of the display device according to the fourth embodiment of the present invention.

First, by time t61, the control circuit 20 sets the voltage level of the power source lines 310 (k, 1) to 310 (k, m) to LOW, which is the first voltage lower than the standard voltage, in sequence to reset the source potentials of the driving transistors 314 (S51 of FIG. 23). Here, the first voltage is −10 V, for example, and the source potential of the driving transistor 314 is reset to −10 V.

Then, at time t62, the control circuit 20 simultaneously changes the voltage level of the scanning lines 333 (k, 1) to 333 (k, m) from LOW to HIGH to turn on the switching transistors 315 (S52 of FIG. 23). At this point in time, the control circuit 20 has changed the voltage level of the first signal line 351 from the signal voltage to the standard voltage.

Here, changes of the voltage levels of the first signal line 351 and the second signal line 352 will be described.

FIG. 8 is a timing chart of an operation for driving the selector circuit according to the fourth embodiment of the present invention.

Times T0 and T2 in FIG. 8 correspond to time t62 in FIG. 22. At time T0, the voltage level of the scanning lines 333 (1, 1) to 333 (1, m) is simultaneously changed from LOW to HIGH. At time T2, the voltage level of the scanning lines 333 (3, 1) to 333 (3, m) is simultaneously changed from LOW to HIGH. At these points in time, the scanning/control line driving circuit 14 changes the voltage level of the control line 144 from HIGH to LOW and changes the voltage level of the control line 143 from LOW to HIGH. The changes of the voltage levels at times T0 and T2 place the selector circuit 16 at one pixel column in a circuit state as illustrated in FIG. 9B. Specifically, switching transistors 162 and 163 whose gates are connected to the control line 143 turn on and switching transistors 161 and 164 whose gates are connected to the control line 144 turn off. As a result, the voltage of the first signal line 351 to which the pixels 31A in the first driving block and the third driving block are connected changes to the standard voltage at times T0 and T2, whereas the voltage of the second signal line 352 changes to the signal voltage.

As a result, the standard voltage is applied to the gates of all the driving transistors 314 of the k-th driving block at time t62 in FIG. 22. Here, the standard voltage is 0 V, for example.

Then, at time t63, the control circuit 20 changes the voltage level of the power source lines 310 (k, 1) to 310 (k, m) from the first voltage to the second voltage, which is higher than the standard voltage (S53 of FIG. 23). Here, the second voltage is 10 V, for example. Thus, preparation for a threshold voltage detection stage is completed.

In the period from time t63 to time t64, the circuit of each pixel 31A is placed in a steady state, and a voltage equivalent to the threshold voltage of the driving transistor 314 is held in the holding capacitor by time t64. It should be noted that since current flowing to cause the holding capacitor 316 to hold the voltage equivalent to the threshold voltage $V_{th}$ is small, it takes time for the circuits to be placed in the steady state. The longer the time, the more stabilized the voltage held in the holding capacitor 316 becomes. By providing a sufficiently long time for this period, accurate voltage compensation can be achieved.

Then, at time t64, the control circuit 20 simultaneously changes the voltage level of the scanning lines 333 (k, 1) to 333 (k, m) from HIGH to LOW to turn off the switching transistors 315 (S54 of FIG. 23). This discontinues the application of the standard voltage to the driving transistor 314. At this point in time, a voltage equivalent to the threshold voltage $V_{th}$ of the driving transistor 314 is simultaneously held in the holding capacitors 316 of all the pixels 31A in the k-th driving block and the threshold voltage $V_{th}$ of the driving transistor 314 that is to be compensated for is determined.

In this way, correction of the threshold voltage $V_{th}$ of the driving transistors 314 in the k-th driving block is simultaneously performed in the period from time t61 and time t64.

Then, at time t15, the control circuit 20 changes the voltage level of the first signal line 351 from the standard voltage to the signal voltage.

Here, changes of the voltage levels of the first signal line 151 and the second signal line 152 will be described.

Times T1 and T3 in FIG. 8 correspond to time t64 in FIG. 22. At time T1, the voltage level of the scanning lines 333 (1, 1) to 333 (1, m) is simultaneously changed from HIGH to LOW. At time T3, the voltage level of the scanning lines 333 (1, 1) to 333 (3, m) is simultaneously changed from HIGH to LOW. At these points in time, the scanning/control line driving circuit 14 changes the voltage level of the control line 144 from LOW to HIGH and changes the voltage level of the control line 143 from HIGH to LOW. The changes of the voltages at times T1 and T3 place the selector circuit 16 at one pixel column in a circuit state as illustrated in FIG. 9A. Specifically, the switching transistors 162 and 163 whose gates are connected to the control line 143 are turned off and the switching transistors 161 and 164 whose gates are connected to the control line 144 are turned on. As a result, the voltage of the first signal line 351 to which the pixels 31A in the first driving block and the third driving block are connected changes to the signal voltage at times T1 and T3, whereas the voltage of the second signal line 352 changes to the standard voltage.

As a result, the signal voltage is applied to the gates of all the driving transistors 314 in the k-th driving block at time t64 in FIG. 22. Here, the signal voltage is in the range of 0 V to 5 V, for example.

In the period from time t65 to time t66, the control circuit 20 changes the voltage level of the scanning lines 333 (k, 1) to 333 (k, m) from LOW to HIGH to LOW in sequence to turn on the switching transistors 315 in one pixel row at a time in order of pixel row (S55 of FIG. 23). As a result, the signal voltage is applied to the gate of each driving transistor 314. At this point in time, the sum voltage that is equal to the sum of a voltage according to the signal voltage plus a voltage equivalent to the threshold voltage $V_{th}$ of the driving transistor 314 previously held is held in the holding capacitor 316. At the same time, a driving current of the driving transistor 314 flows into the organic EL elements 313 to cause the organic EL elements 313 to produce luminescence in order of pixel row.

In this way, store of an accurately corrected signal voltage and luminescence production are performed in the k-th driving block in order of pixel row in the period from time t65 to t66.

After time t16, the control circuit 20 changes the voltage level of the power source lines 310 (k, 1) to 310 (k, m) in the k-th driving block from the second voltage to the first voltage in order of pixel row to optically quench the pixels in one pixel row at a time in order of pixel row.

As has been described above, by grouping the pixel rows into driving blocks, detection of the threshold voltages of the driving transistors 314 in the same driving block is performed at the same time and accordingly a time period equal to one frame time divided by the number of driving blocks can be allocated as a threshold voltage detection period at the maximum. Consequently, an accurately corrected driving current flows into the organic EL elements 313, improving the image display quality. Furthermore, the control circuit 20 can perform simultaneous control in the same driving block in the threshold voltage detection period, that is, can output the same control signal to the same driving block.

Furthermore, since the selector circuit 16 changes mutually exclusively the voltage level of the control signal provided to the control line 144 and the voltage level of the control signal provided to the control line 143 to mutually exclusively turn on/off the switching transistors 161 and 164 and the switching transistors 162 and 163, the signal voltage and the standard voltage are mutually exclusively provided to the first signal line 351 and the second signal line 352. Therefore, only one output line of the signal line driving circuit 15 needs to be provided for two signal lines disposed in each pixel column. Accordingly, the size of the signal line driving circuit 15 can be reduced. The reduction of the number of data drivers 153 and the number of output lines reduces the cost for mounting of the driving circuit and improves manufacturing yield.

For the same reason as described in the first embodiment, this embodiment has the advantage that a longer luminescence production duty cycle can be ensured than the conventional display device using two signal lines described in Japanese Unexamined Patent Application Publication No. 2008-122633.

Accordingly, a long-life display device with a sufficiently high luminance and a lower output load on the driving circuit can be implemented.

It can be appreciated that when the same luminescence production duty cycle is set for the conventional display device that uses two signal lines and the display device that incorporates block driving according to the present invention, the display device in the present invention can provide a longer threshold detection period.

Operation of the (k+1)-th driving block in the period from time t71 to t76 is the same as that of the k-th driving block and therefore description of the operation will be omitted.

The operation described above is performed on the (k+2)-th and the subsequent driving blocks in the display panel 10 in sequence.

Since state transitions of driving blocks producing luminescence by the control method according to this embodiment is the same as in state transition diagram in FIG. 14 and therefore the description of the state transitions will be omitted.

In this way, in the fourth embodiment, as in the embodiments described earlier, the pixel circuits in each of which the holding capacitor 316 is disposed, the selector circuit 16 disposed between the signal line driving circuit 15 and the signal line group 12, the disposition of the scanning lines, the power source lines, and the signal lines in the pixels grouped into driving blocks, and the control method described above enable the threshold voltage of the driving transistors 314 in the same driving block to be corrected in the same period and at the same timing. Moreover, the provision of the selector circuit can reduce the number of outputs from the signal line driving circuit 15. The reduction of the number of outputs reduces loads on the scanning/control line driving circuit 14 which outputs a signal controlling current paths, and loads on the signal line driving circuit 15 which controls a signal voltage, as well as the costs of the driving circuit, and improves panel manufacturing yield. Furthermore, grouping into driving blocks and the two signal lines disposed for each pixel row enable a larger part of one frame time Tf in which all pixels are refreshed to be allocated to a threshold voltage correction period for the driving transistors 314. This is because a threshold voltage correction period for the (k+1)-th driving block is provided in a period during which a luminance signal is being sampled in the k-th driving block. Thus, the threshold voltage correction period is divided among the driving blocks, rather than being divided among the pixel rows. Accordingly, as the display area is increased, the threshold voltage correction period can be increased relative to one frame time without decreasing the luminescence production duty cycle. Consequently, a driving current based on an accurately corrected signal voltage flows into the luminescence elements, thereby improving display quality.

For example, if the display panel 10 is divided into N driving blocks, the threshold correction period that is provided for each pixel is Tf/N at the maximum.

Fifth Embodiment

Another embodiment of the present invention will be described below with reference to drawings.

An electrical configuration of a display device according to this embodiment is similar to the configuration illustrated in FIG. 1 with the only difference being the circuit configuration of each pixel. Specifically, the display device according to this embodiment includes a display panel 10 and a control circuit 20. The display panel 10 includes a plurality of pixels 41A and 41B, which will be described later, a signal line group 12, a set of control lines 13, a scanning/control line driving circuit 14, a signal line driving circuit 15, and a selector circuit 16.

In the following, description of the same components as those of the first and second embodiments will be omitted and only components relating to the pixels 41A and 41B will be described.

The pixels 41A and 41B are arranged in a matrix on the display panel 10. Here, the pixels 41A and 41B make up two or more driving blocks each including a plurality of pixel rows. The pixels 41A make up an odd-numbered driving block and the pixels 41B make up an even-numbered driving block.

In the following, description of the same components as those of the first to third embodiments will be omitted and only components relating to the pixels 41A and 41B will be described.

Figure 24A:
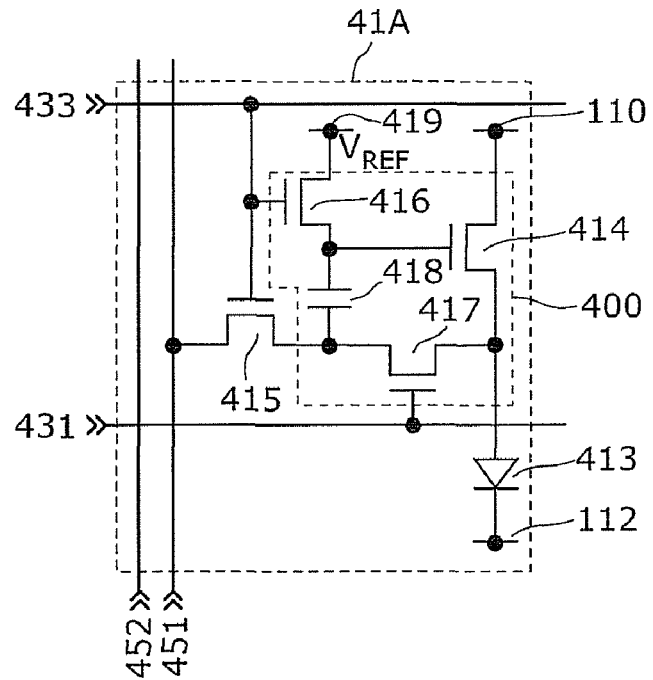
FIG. 24A is a circuit diagram specifically illustrating a pixel in an odd-numbered driving block in a display device according to a fifth embodiment of the present invention.
Figure 24B:
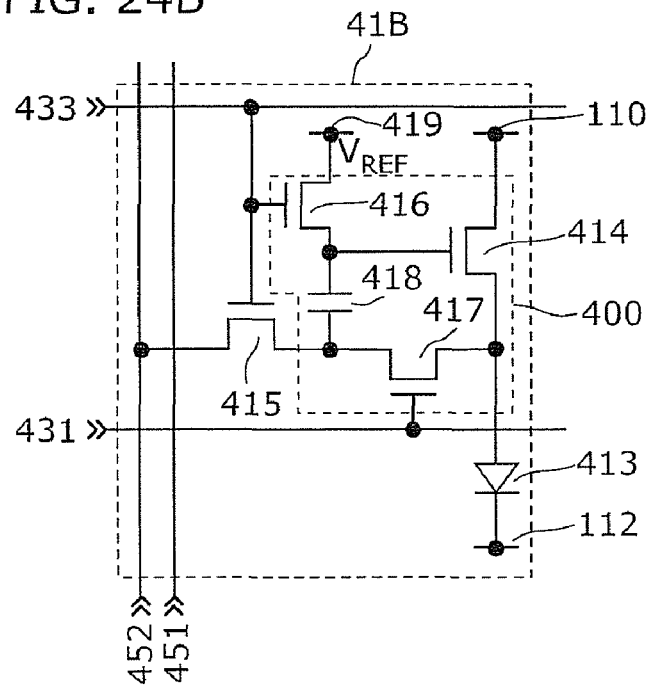
FIG. 24B is a circuit diagram specifically illustrating a pixel in an even-numbered driving block in the display device according to the fifth embodiment of the present invention.

FIG. 24A is a circuit diagram specifically illustrating a pixel in an odd-numbered driving block in the display device according to the fifth embodiment of the present invention. FIG. 24B is a circuit diagram specifically illustrating a pixel in an even-numbered driving block in the display device according to the fifth embodiment of the present invention. Each of the pixels 41A and 41B depicted in FIGS. 24A and 24B includes an organic EL element 413, a driving transistor 414, switching transistors 415, 416, and 417, a holding capacitor 418, a control line 431, a scanning line 433, a first signal line 451, and a second signal line 452. Here, the driving transistors 414, the switching transistors 415, 416, and 417, and the holding capacitor 418 make up a current control unit 400. The current control unit 400 has the function of converting a signal voltage provided through the first signal line 451 or the second signal line 452 to a signal current, which is a source-drain current of the driving transistor 414.

Each of the switching transistors 416 in FIGS. 24A and 24B is a fifth switching transistor having a gate connected to a scanning line 433. One of a source and a drain of the switching transistor 416 is connected to a gate of the driving transistor 414 and a first electrode which is one terminal of the holding capacitor 418. The other of the source and the drain is connected to a reference power source line 419. The switching transistor 416 has the function of determining the timing of applying a reference voltage $V_{REF}$ of the reference power source line 419 to the gate of the driving transistor 414.

The switching transistor 417 is a sixth switching transistor having a gate connected to the control line 431. One of a source and a drain of the switching transistor 417 is connected to the other terminal of the holding capacitor 418, which is a fifth capacitive element, and the other of the source and the drain is connected to the source of the driving transistor 414. The switching transistor 417 is in the off state in a period in which a signal voltage provided through a signal line is stored, thereby preventing a leak current from the holding capacitor 418 to the source of the driving transistor 414 in the period. Thus, the switching transistor 417 has the function of allowing the holding capacitor 418 to hold a voltage accurately corresponding to a signal voltage. In an initialization period, on the other hand, the switching transistor 417 turns on and thus has the function of setting an initial potential at the source of the driving transistor 414, thereby instantaneously resetting the driving transistor 414 and the organic EL element 413. The switching transistors 415, 416, and 417 are implemented by n-type thin-film transistors (n-type TFTs), for example.

Here, the initialization period is a period for resetting the gate and source potentials of the driving transistor 414 to their initial potentials before a voltage corresponding to a signal voltage is held in the holding capacitor 418. The initialization period is set immediately before a threshold voltage detection period described with respect to the first to fourth embodiments or is set in place of a threshold voltage detection period.

The control line 431 is connected to the scanning/control line driving circuit 14 and to the pixels belonging to a pixel row including the pixels 41A and 41B. Thus, the control line 431 has the function of producing a state for bringing the source of the driving transistor 414 and a second electrode of the holding capacitor 418 into or out of conduction.

The first signal line 451 and the second signal line 452 are connected to the signal line driving circuit 15 and to pixels belonging to pixel rows including the pixels 41A and 41B, respectively, and have the function of providing a standard voltage for resetting driving transistors and a signal voltage that determines luminance.

Power source lines 110 and 112, which are a positive power source line and a negative power source line, respectively, are also connected to other pixels and to voltage sources, not shown in FIGS. 24A and 24B. The reference power source line 419 is also connected to other pixels and to a voltage source with a potential of $V_{REF}$.

Connections of the control lines 431, the scanning lines 433, the first signal lines 451, and the second signal lines 452 among the pixels will be described below.

Figure 25:
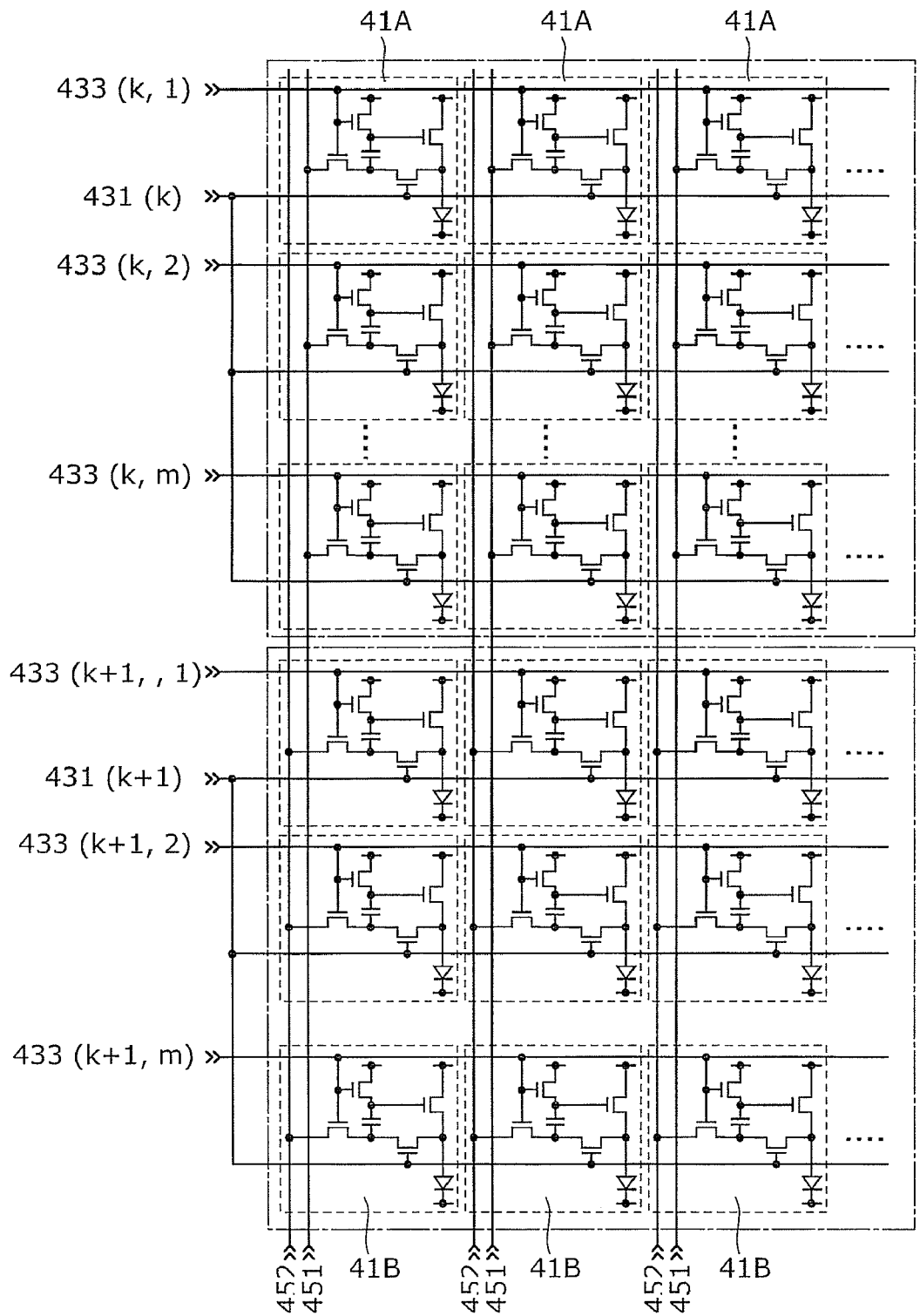
FIG. 25 is a circuit diagram illustrating a portion of a display panel of the display device according to the fifth embodiment of the present invention.

FIG. 25 is a circuit diagram illustrating a portion of the display panel of the display device according to the fifth embodiment of the present invention. FIG. 25 illustrates two adjacent driving blocks, control lines, scanning lines, and signal lines. The control lines, the scanning lines, and the signal lines are denoted by a reference numeral followed by (block number, row number in the block) or a reference numeral followed by (block number) in the figure and the following description.

As described earlier, a driving block is made up of a plurality of pixel rows and two or more driving blocks exist in the display panel 10. For example, each of the driving blocks depicted in FIG. 25 is made up of m pixel rows.

In the k-th driving block illustrated in the upper part of FIG. 25, a control line 431 (k) is connected to the gates of the switching transistors 417 of all the pixels 41A in the driving block in common. On the other hand, scanning lines 433 (k, 1) to 433 (k, m) are each individually connected to each pixel row.

In the (k+1)-th driving block illustrated in the lower part of FIG. 25, connections similar to those in the k-th driving block are made. However, the control line 431 (k+1) connected to the (k+1)-th driving block differs from the control line 431 (k) connected to the k-th driving block and individual control signals are outputted from the scanning/control line driving circuit 14 to the control lines 431 (k) and 431 (k+1).

In the k-th driving block, a first signal line 451 is connected to one of a source or a drain of a switching transistor 415 of every pixel 41A in the diving block. On the other hand, in the (k+1)-th driving block, a second signal line 452 is connected to one of a source and a drain of a switching transistor 415 of every pixel 41B in the driving block.

Grouping into driving blocks described above reduces the number of control lines 431 that control connection between the sources of the driving transistors 414 and the second electrodes of the holding capacitors 418. Accordingly, the number of outputs of the scanning/control line driving circuit 14 that output driving signals to the control lines is reduced and the circuit size can be reduced.

A method for controlling the display device according to this embodiment will be described below with reference to FIG. 26. Here, the control method for the display device having the specific circuit configuration illustrated in FIGS. 24A and 24B will be described in detail.

Figure 26:
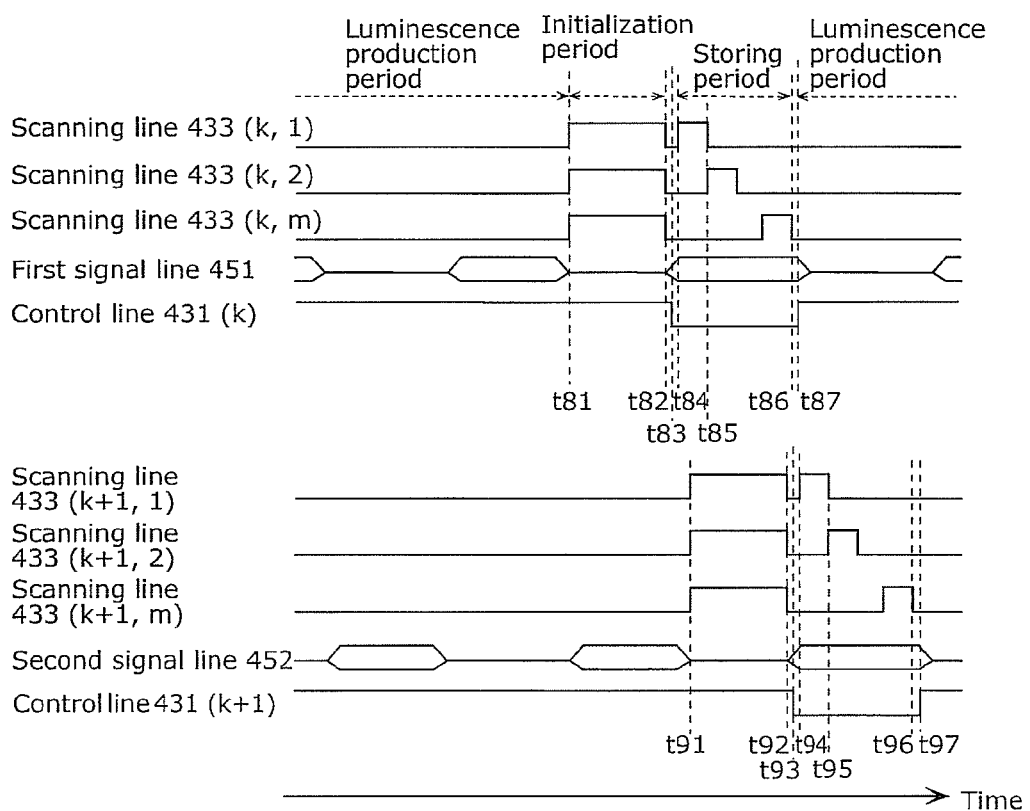
FIG. 26 is a timing chart of an operation of a method for driving the display device according to the fifth embodiment of the present invention.
Figure 27:
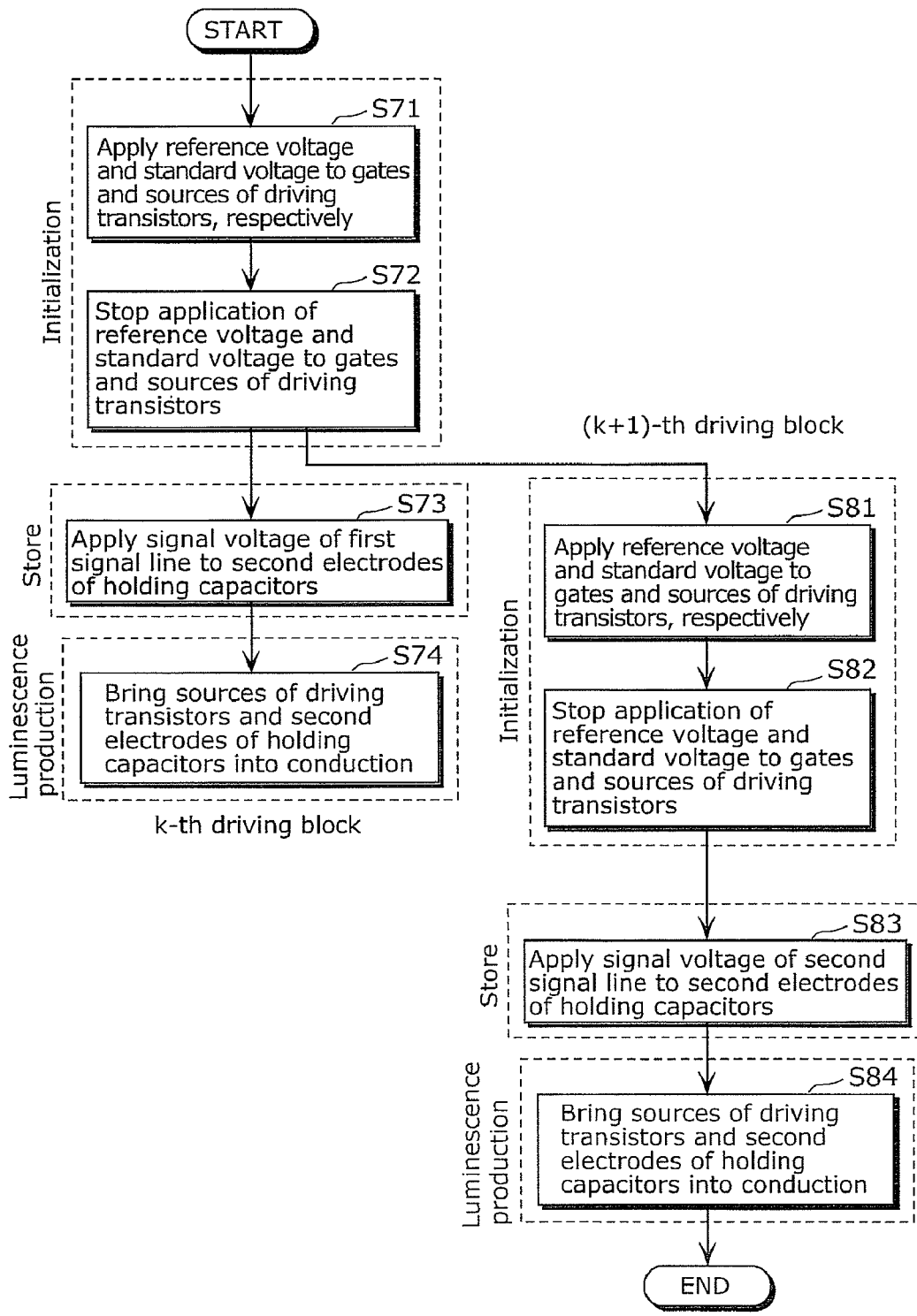
FIG. 27 is a flowchart of an operation of a display device according to an embodiment of the present invention.

FIG. 26 is a timing chart of an operation of a display device driving method according to the fifth embodiment of the present invention. The horizontal axis of the timing chart represents time. Shown in FIG. 26 in rows are, in order from top, waveforms of voltages appearing on scanning lines 433 (k, 1), 433 (k, 2), and 433 (k, m), the first signal line 451, and the control line 431 (k) in the K-th driving block. Following these are waveforms of voltages appearing on scanning lines 433 (k+1, 1), 433 (k+1, 2), and 433 (k+1, m), the second signal line 452, and the control line 431 (k+1) in the (k+1)-th driving block. FIG. 27 is a flowchart of an operation of the display device according to this embodiment of the present invention.

First, at time t81, the scanning/control line driving circuit 14 simultaneously changes the voltage level of scanning lines 433 (k, 1) to 433 (k, m) from LOW to HIGH to turn on the switching transistors 415 of the pixels 41A that belong to the k-th driving block. The changes of the voltage level of the scanning lines 433 (k, 1) to 433 (k, m) simultaneously turn on the switching transistors 416 (S71 of FIG. 27). At this point in time, the voltage level of the control line 431 (k) is already HIGH and the switching transistors 417 are in the on state. The signal line driving circuit 15 changes the voltage of the first signal line 451 from a signal voltage to a standard voltage VR1.

Here, changes of the voltage levels of the first signal line 451 and the second signal line 452 will be described.

FIG. 8 is a timing chart of an operation for driving the selector circuit according to the fifth embodiment of the present invention. Times T0 and T2 in FIG. 8 correspond to time t81 in FIG. 26. At time T0, the voltage level of the scanning lines 433 (1, 1) to 433 (1, m) is simultaneously changed from LOW to HIGH. At time T2, the voltage level of the scanning lines 433 (3, 1) to 433 (3, m) is simultaneously changed from LOW to HIGH. At these points in time, the scanning/control line driving circuit 14 changes the voltage level of the control line 144 from HIGH to LOW and changes the voltage level of the control line 143 from LOW to HIGH. The changes of the voltage levels at times T0 and T2 place the selector circuit 16 at one pixel column in a circuit state as illustrated in FIG. 9B. Specifically, switching transistors 162 and 163 whose gates are connected to the control line 143 turn on and switching transistors 161 and 164 whose gates are connected to the control line 144 turn off. As a result, the voltage of the first signal line 451 to which the pixels 41A in the first driving block and the third driving block are connected changes to the standard voltage at times T0 and T2, whereas the voltage of the second signal line 452 changes to the signal voltage.

As a result, at time t81 in FIG. 26, the reference voltage $V_{REF}$ of the reference power source line 419 is applied to the gate of the driving transistor 414 and the first electrode of the holding capacitor 418 and, through the conduction of the switching transistor 417, the standard voltage VR1 of the first signal line 451 is applied to the source of the driving transistor 414 and the second electrode of the holding capacitor 418. That is, the gate potential and the source potential of the driving transistor 414 are initialized by $V_{REF}$ and VR1.

In order to cause the organic EL elements 413 to stop producing luminescence at time t81, the reference voltage $V_{REF}$ and the standard voltage VR1 are preset so as to satisfy relationships expressed by Formulas 16 and 17, respectively.

$$V_{REF} - V_{CAT} < V_{th} + Vt(EL) \quad \text{(Formula 16)}$$

$$VR1 - V_{CAT} < Vt(EL) \quad \text{(Formula 17)}$$

An exemplary value that satisfy Formulas 16 and 17 is $V_{REF} = V_{CAT} = VR1 = 0$ V.

Here, $V_{th}$ and Vt (EL) are threshold voltages of the driving transistor 414 and the organic EL element 413, respectively, and $V_{CAT}$ is a cathode voltage of the organic EL element 413. Formula 16 given above represents a condition under which no current flows through a current path from the reference source line 419 to the driving transistor 414 to the organic EL element 413 to the power source line 112 at time t81. On the other hand, Formula 17 represents a condition under which no current flows through a current path from the first signal line 451 to the switching transistor 415 to the switching transistor 417 to the organic EL element 413 to the power source line 112.

In this way, at time t81, luminescence production by the organic EL elements 413 of the pixels 41A that belong to the k-th driving block is discontinued and the operation for initializing the driving transistors 414 is started.

Then, at time t82, the scanning/control line driving circuit 14 simultaneously changes the voltage level of the scanning lines 433 (k, 1) to 433 (k, m) from HIGH to LOW to turn off the switching transistors 415 of the pixels 41A that belong to the k-th driving block (S72 of FIG. 27). The changes of the voltage level of the scanning lines 433 (k, 1) to 433 (k, m) simultaneously turn off the switching transistors 416. This completes the reset operation of the driving transistor 414 which has started at time t81.

It should be noted that since characteristics of the gate-source voltage and the drain current applied to the driving transistors 414 have hysteresis, the reset period described above needs to be sufficiently long to accurately initialize the gate potential and the source potential. If a threshold correction or storing operation is started before a sufficient initialization time period has elapsed, a previous change in threshold voltage or mobility in each pixel may remain for a long time due to the hysteresis or other effects. Consequently, unevenness in the luminance of an image is not sufficiently minimized and display degradation such as an image lag cannot be reduced. By providing a sufficiently long initialization time period, the gate and source potentials of the driving transistors 414 can also be stabilized and an accurate initialization operation can be accomplished.

As has been described above, in the period from time t81 to time t82, the operation for initializing the driving transistors 414 is simultaneously performed in the k-th driving block to set stable initialization voltages, $V_{REF}$ and VR1, at the gate and the source of the driving transistor 414 of every pixel 41a in the k-th driving block.

Then, at time t83, the scanning/control line driving circuit 14 changes the voltage level of the control line 431 (k) from HIGH to LOW to turn off the switching transistors 417 of the pixels 41A that belong to the k-th driving block. As a result, the switching transistors 417 are out of conduction in the signal voltage storing period which starts at time t84, which prevents a leak current from the holding capacitor 418 to the source of the driving transistor 414 to enable a voltage accurately corresponding to a signal voltage to be held in the holding capacitor 418 in the period.

Then, in the period from time t84 to time t85, the scanning/control line driving circuit 14 changes the voltage level of the scanning line 433 (k, 1) from LOW to HIGH to LOW to turn on the switching transistors 415 of the pixels in the first row (S73 of FIG. 27). The changes of the voltage level of the scanning line 433 (k, 1) simultaneously turn on the switching transistors 416. At this point in time, the signal line driving circuit 15 has changed the signal voltage of the first signal line 451 from the standard voltage to the signal voltage Vdata.

Here, changes of the voltage levels of the first signal line 451 and the second signal line 452 will be described.

Times T1 and T3 in FIG. 8 correspond to time t82 in FIG. 26. At time T1, the voltage level of the scanning lines 433 (1, 1) to 433 (1, m) is simultaneously changed from HIGH to LOW. At time T3, the voltage level of the scanning lines 433 (3, 1) to 433 (3, m) is simultaneously changed from HIGH to LOW. At these points in time, the scanning/control line driving circuit 14 changes the voltage level of the control line 144 from LOW to HIGH and changes the voltage level of the control line 143 from HIGH to LOW. The changes of the voltages at times T1 and T3 place the selector circuit 16 at one pixel column in a circuit state as illustrated in FIG. 9A. Specifically, the switching transistors 162 and 163 whose gates are connected to the control line 143 are turned off and the switching transistors 161 and 164 whose gates are connected to the control line 144 are turned on. As a result, the voltage of the first signal line 451 to which the pixels 41A in the first driving block and the third driving block are connected changes to the signal voltage at times T1 and T3, whereas the voltage of the second signal line 452 changes to the standard voltage.

As a result, at time t84 in FIG. 26, the signal voltage Vdata is applied to the second electrode of the holding capacitor 418 and the reference voltage $V_{REF}$ of the reference power source line 419 is applied to the gate of the driving transistor 414. An exemplary value of $V_{data}$ is in the range of −5 V to 0 V.

It should be noted that because the switching transistor 417 is out of conduction in the period from t84 to t85 and the potential at the source of the driving transistor 414 remains at VR1 which is the potential from the initialization period, no luminescence production current flows in a forward direction in the organic EL element 413

Accordingly, after both electrodes are accurately initialized, a voltage according to the signal voltage $V_{data}$ is held in the holding capacitor 418. The voltage storing operation described above corresponds to the holding of the voltage corresponding to the signal voltage in the k-th driving block.

Then, by time t86, the storing operation in the period from time t84 to time t85 described above is performed on the pixels in the second to m-th rows that belong to the k-th driving block in order of pixel row.

Then, at time t87, the scanning/control line driving circuit 14 changes the voltage level of the control line 431 (k) from LOW to HIGH to turn on the switching transistors 417 of the pixels 41A that belong to the k-th driving block (S74 of FIG. 27). At this point in time, the voltage level of the scanning lines 433 (k, 1) to 433 (k, m) has already simultaneously changed from HIGH to LOW and therefore the switching transistors 415 and 416 are out of conduction. Accordingly, the voltage held in the holding capacitor 418 in the period from time t84 to t86 becomes the gate-source voltage $V_{gs}$ of the driving transistor 414, which can be expressed by Formula 18:

$$V_{gs}=(V_{REF}-V_{data}) \quad \text{(Formula 18)}$$

Here, $V_{gs}$ is in the range of 0 V to 5 V, for example. Accordingly the driving transistors 414 turn on and a drain current flows into the organic EL elements 413 to cause the organic EL elements 413 in the pixels 41A that belong to the k-th driving block to simultaneously produce luminescence according to $V_{gs}$ defined by Formula 18 given above.

At this point in time, the potential at the source of the driving transistor 414 is higher than the potential $V_{CAT}$ at the cathode of the organic EL element 413 by Vt (EL) and can be expressed by Formula 19:

$$V_s=Vt(EL)+V_{CAT} \quad \text{(Formula 19)}$$

From $V_{gs}$ defined by Formula 18 and the source potential defined by Formula 19, the potential at the gate of the driving transistor 414 can be expressed by Formula 20:

$$V_G=(V_{REF}-V_{data})Vt(EL)+V_{CAT} \quad \text{(Formula 20)}$$

As has been described above, grouping the pixel rows into driving blocks enable simultaneous initialization of the driving transistors 414 in the same driving block. Grouping the pixel rows into the driving blocks also can communize the control line 431 in the same driving block.

While the scanning lines 433 (k, 1) to 433 (k, m) are individually connected to the scanning/control line driving circuit 14, these scanning lines are driven by a driving pulse at the same timing in the reset period. Therefore, increase of the frequency of the pulse signal outputted from the scanning/control line driving circuit 14 can be minimized and output load on the driving circuit can be reduced accordingly.

As has been described above, in the pixels 41A and 41B of the display device in the present invention, the switching transistor 416 is attached between the gate of the driving transistor 414 and the reference power source line 419 and the switching transistor 417 is attached between the source of the driving transistor 414 and the second electrode of the holding capacitor 418. Since this arrangement stabilizes the potentials at the gate and source of the driving transistor 414, the time from completion of initialization to storing of a signal voltage and the time from the storing of the signal voltage to luminescence production can be arbitrarily set for each individual pixel row. This circuit configuration enables grouping into driving blocks, which enables the threshold voltage correction in the same driving block to occur in the same period and luminescence production in the same driving block to occur in the same period.

Furthermore, since the selector circuit 16 changes mutually exclusively the voltage level of the control signal provided to the control line 144 and the voltage level of the control signal provided to the control line 143 to mutually exclusively turn on/off the switching transistors 161 and 164 and the switching transistors 162 and 163, the signal voltage and the standard voltage are mutually exclusively provided to the first signal line 451 and the second signal line 452. Therefore, only one output line of the signal line driving circuit 15 needs to be provided for two signal lines disposed in each pixel column. Accordingly, the size of the signal line driving circuit 15 can be reduced. The reduction of the number of data drivers 153 and the number of output lines reduces the cost for mounting of the driving circuit and improves manufacturing yield.

For the same reason as described in the first embodiment, this embodiment has the advantage that a longer luminescence production duty cycle can be ensured than the conventional display device using two signal lines described in Japanese Unexamined Patent Application Publication No. 2008-122633.

Accordingly, a long-life display device with a sufficiently high luminance and a lower output load on the driving circuit can be implemented.

It can be appreciated that when the same luminescence production duty cycle is set for the conventional display device that uses two signal lines and the display device that incorporates block driving according to the present invention, the display device in the present invention can provide a longer threshold detection period.

Operation of the (k+1)-th driving block in the period from time t91 to t97 is the same as that of the k-th driving block and therefore description of the operation will be omitted.

The operation described above is performed on the (k+2)-th and the subsequent driving blocks in the display panel 10 in sequence.

Since state transitions of driving blocks producing luminescence by the control method according to this embodiment is the same as in state transition diagram in FIG. 14 and therefore the description of the state transitions will be omitted.

In this way, in the fifth embodiment, the pixel circuits in each of which the switching transistors 416 and 417 is disposed, the selector circuit 16 disposed between the signal line driving circuit 15 and the signal line group 12, the disposition of the control lines, the scanning lines, and the signal lines in the pixels grouped into driving blocks, and the control method described above enable the driving transistors 414 in the same driving block to be corrected in the same period and at the same timing. Moreover, the provision of the selector circuit can reduce the number of outputs from the signal line driving circuit 15. The reduction of the number of outputs reduces loads on the scanning/control line driving circuit 14 which outputs a signal controlling current paths, and loads on the signal line driving circuit 15 which controls a signal voltage, as well as the costs of the driving circuit, and improves panel manufacturing yield. Furthermore, grouping into driving blocks and the two signal lines disposed for each pixel row enable a larger part of one frame time Tf in which all pixels are refreshed to be allocated to an initialization period for the driving transistors 414. This is because an initialization period for the (k+1)-th driving block is provided in a period during which a luminance signal is being sampled in the k-th driving block. Thus, the initialization period is divided among the driving blocks, rather than being divided among the pixel rows. Accordingly, even the display area is increased, a long initialization period can be set relative to one frame time without substantially increasing the number of outputs of the scanning/control line driving circuit 14 and without decreasing the luminescence production duty cycle. Consequently, a driving current based on an accurately corrected signal voltage flows into the luminescence elements, thereby improving display quality.

For example, if the display panel 10 is divided into N driving blocks, the initialization period that is provided for each pixel is Tf/N at the maximum. In contrast, if initialization periods are set at different timings for M different pixel rows (M>>N), the initialization period that is provided for each pixel is Tf/M at the maximum. If two signal lines as those described in Japanese Unexamined Patent Application Publication No. 2008-122633 are disposed for each pixel row, the initialization period provided is 2Tf/M at the maximum.

Furthermore, grouping into driving blocks enables the control line which controls conduction between the source of the driving transistor 414 and the second electrode of the holding capacitor 418 to be communized in the same driving block. Accordingly, the number of control lines from the scanning/control line driving circuit 14 is reduced and therefore load on the driving circuit is reduced.

For example, in the conventional display device 500 described in Japanese Unexamined Patent Application Publication No. 2008-122633, two control lines (a power supply line and a scanning line) are disposed for each pixel row. If the display device 500 includes M pixel rows, a total of 2M control lines are provided.

In contrast, in the display device 1 according to this embodiment of the present invention, one scanning line per pixel row and one control line per driving block are provided from the scanning/control line driving circuit 14. Accordingly, if the display device 1 includes M pixel rows, a total of (M+N) control lines (including scanning lines) are provided.

When the display area is increased and the number of pixel rows increases accordingly, M will be much greater than N. In that case, the number of control lines of the display device 1 according to the present invention can be reduced to about half the number of control lines of the conventional display device 500.

While the first to fifth embodiments have been described above, display devices according to the present invention are not limited to the embodiments described above. The present invention includes other embodiments implemented by combining any of the components of first to fifth embodiments, modifications to the first to fifth embodiments that may occur to those skilled in the art without departing from the spirit of the present invention, and various apparatuses incorporating a display device according to the present invention.

While switching transistors in the embodiments described above have been described as n-type transistors which turn on when the gate voltage level is HIGH, grouping into driving blocks described in the embodiments can also be applied to pixels in which the switching transistors are implemented by p-type transistors, and the same effects as those of any of the embodiments described above can be achieved.

For example, in the fifth embodiment, the driving transistor 414 and the switching transistors 415, 416, and 417 in the pixel 41A illustrated in FIG. 24A may be implemented by p-type transistors, the power source line 110 may be negative-voltage power source line, the power source line 112 may be positive-voltage power source line, and an organic EL element may be connected between the drain of the driving transistor and the power source line 110, instead of the organic EL element 413, so that the direction from the driving transistor toward the power source line 110 becomes the forward direction. The same applies to the pixel 41B illustrated FIG. 24B. In the operation timing chart in FIG. 26, the polarity of the scanning lines may be reversed. Such a display device has the same effects as that of the fifth embodiment.

Figure 28:
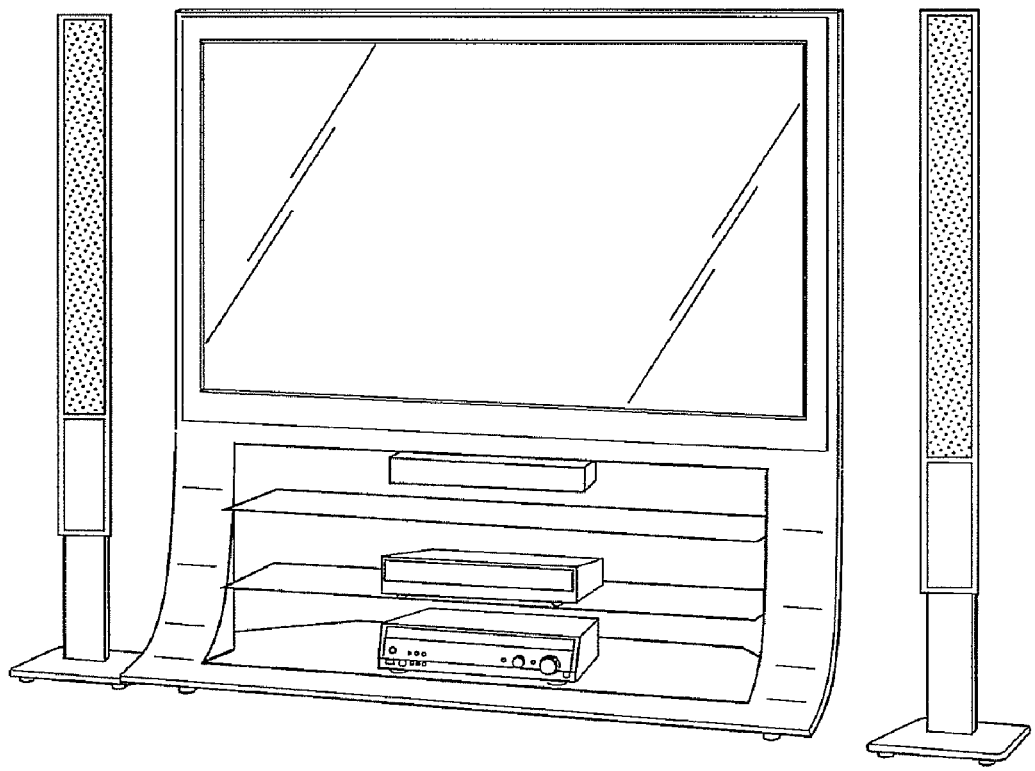
FIG. 28 is an external view of a thin flat TV incorporating a display device of the present invention.
Figure 29:
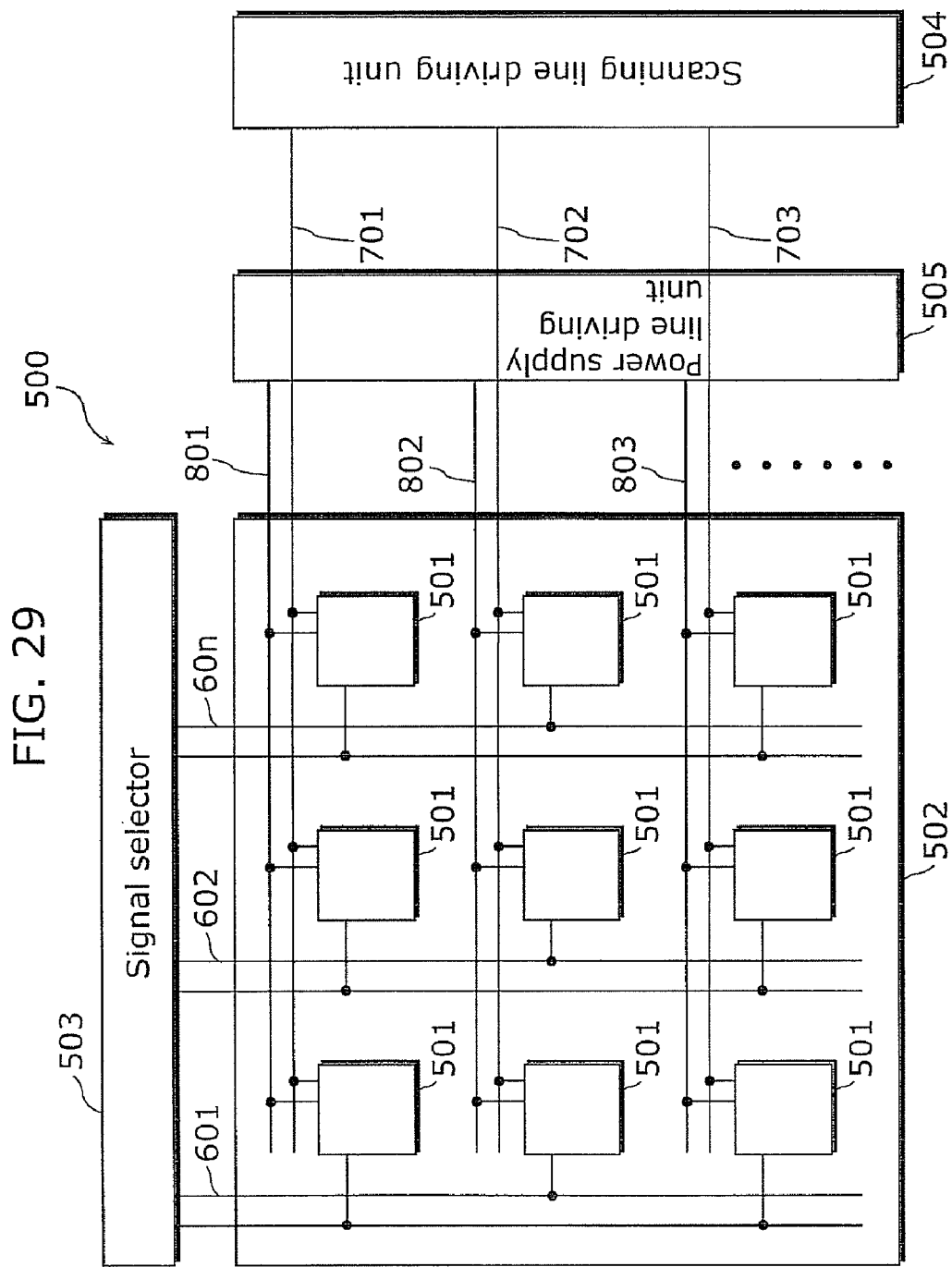
FIG. 29 is a block diagram illustrating a configuration of a conventional display device described in Japanese Unexamined Patent Application Publication No. 2008-122633.

A display device according to the present invention may be incorporated in a thin, flat TV as the one illustrated in FIG. 28. Incorporation of the display device according to the present invention enables implementation of a thin, flat TV capable of displaying high-resolution images reflecting video signals.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The display device and the method of controlling the same according to the present invention are particularly useful as an active-type organic EL flat panel display which causes luminance to fluctuate by controlling pixel luminescence production intensity according to a pixel signal current, and as a method of controlling the active-type organic EL flat panel display.

What is claimed is:

1. A display device including pixels arranged in rows and columns, the display device comprising:
   a signal line driving circuit that outputs, to an output line disposed in each of the columns, a signal voltage that determines luminance of the pixels;
   a first signal line and a second signal line that are disposed in each of the columns, for applying the signal voltage to the pixels;
   a first selector disposed in each of the columns and configured to apply the signal voltage outputted from the output line to one of the first signal line and the second signal line;
   a second selector disposed in each of the columns and configured to apply a standard voltage supplied from a standard voltage source, to one of the first signal line and the second signal line;
   a selector control unit configured to control the first selector and the second selector so that the signal voltage and the standard voltage are applied mutually exclusively to the first signal line and the second signal line;
   a first power source line and a second power source line; and
   a scanning line disposed in each of the rows,
   wherein the pixels compose at least two driving blocks each of which includes at least two of the rows,
   each of the pixels includes:
      a luminescence element that includes terminals, one of the terminals being connected to the second power source line, and the luminescence element producing luminescence according to a flow of a signal current corresponding to the signal voltage; and
      a current control unit connected to the first power source line and the other of the terminals of the luminescence element, and configured to convert the signal voltage applied to the current control unit into the signal current, and hold an initializing voltage or a voltage corresponding to a threshold voltage when the standard voltage is applied to the current control unit, each of the pixels in a k-th driving block of the driving blocks further includes a first switching transistor that includes a gate connected to the scanning line, one of a source and drain connected to the first signal line, and the other of the source and the drain connected to the current control unit, and switchably interconnects the first signal line and the current control unit, k being a positive integer, each of the pixels in a (k+1)-th driving block of the driving blocks further includes a second switching transistor that includes a gate connected to the scanning line, one of a source and a drain connected to the second signal line, and the other of the source and the drain connected to the current control unit, and switchably interconnects the second signal line and the current control unit, and at least one of a threshold voltage detection period and an initialization period is provided in common for the pixels in a same one of the driving blocks, and at least one of the threshold voltage detection period and the initialization period provided in common in the same one of the driving blocks is provided independently for the pixels in different ones of the driving blocks, the threshold voltage detection period being a period during which the threshold voltage is detected when the standard voltage is applied to the current control unit, and the initialization period being a period during which the current control unit is initialized.

2. The display device according to claim 1,
wherein the first selector includes: a first switch element that switchably interconnects the output line and the first signal line; and a second switch element that switchably interconnects the output line and the second signal line,
the second selector includes: a third switch element that switchably interconnects the standard voltage source and the first signal line; and a fourth switch element that switchably interconnects the standard voltage source and the second signal line, and
the selector control unit is configured to control the first selector and the second selector by turning, ON or OFF, the first switch element, the second switch element, the third switch element, and the fourth switch element.

3. The display device according to claim 2,
wherein the selector control unit is configured to cause the turning ON and OFF of the first switch element and the fourth switch element to be synchronized, cause the turning ON and OFF of the second switch element and the third switch element to be synchronized, and cause the turning ON and OFF of the first switch element and the fourth switch element and the turning ON and OFF of the second switch element and the third switch element to be performed mutually exclusively, by having a common control line serving as a control line for turning the first switch element ON or OFF and a control line for turning the fourth switch element ON or OFF, and having a common control line serving as a control line for turning the second switch element ON or OFF and a control line for turning the third switch element ON or OFF.

4. The display device according to claim 1, further comprising
a first control line disposed in each of the rows, and connected to the current control unit,
wherein the first control line is connected to the pixels in the same one of the driving blocks and not connected to the pixels in the different ones of the driving blocks.

5. The display device according to claim 4, further comprising
a second control line disposed in each of the rows, and connected to the current control unit,
wherein the current control unit includes:
a driving transistor that includes a gate, a source, and a drain, one of the source and the drain being connected to the other of the terminals of the luminescence element, and the driving transistor converting the signal voltage applied between the gate and the source of the driving transistor into the signal current which is a drain current of the driving transistor;
a first capacitive element that includes terminals, one of the terminals being connected to the gate of the driving transistor, and the other of the terminals being connected to the source of the driving transistor;
a second capacitive element that includes terminals, one of the terminals being connected to the source of the driving transistor, and the other of the terminals being connected to the first control line; and
a third switching transistor that includes a gate connected to the second control line, and a source and a drain that are inserted between the first power source line and the other of the terminals of the luminescence element, and switches between ON and OFF states of the drain current of the driving transistor,
the other of the source and the drain of the first switching transistor is connected to the gate of the driving transistor, and
the other of the source and the drain of the second switching transistor is connected to the gate of the driving transistor.

6. The display device according to claim 5,
wherein the second control line is connected to the pixels in the same one of the driving blocks and not connected to the pixels in the different ones of the driving blocks.

7. The display device according to claim 4, further comprising
a second control line disposed in each of the rows,
wherein the current control unit includes:
a driving transistor that includes a gate, a source, and a drain, one of the source and the drain being connected to the other of the terminals of the luminescence element, and the driving transistor converting the signal voltage applied between the gate and the source of the driving transistor into the signal current which is a drain current of the driving transistor;
a third capacitive element that includes terminals, one of the terminals being connected to the gate of the driving transistor, and the other of the terminals being connected to the source of the driving transistor;
a fourth capacitive element that includes terminals, one of the terminals being connected to the source of the driving transistor, and the other of the terminals being connected to the first control line; and
a fourth switching transistor that includes a gate connected to the second control line, one of a source and a drain connected to the other of the terminals of the third capacitive element, and the other of the source and drain connected to the source of the driving transistor,
the other of the source and the drain of the first switching transistor is connected to the gate of the driving transistor, and
the other of the source and the drain of the second switching transistor is connected to the gate of the driving transistor.

8. The display device according to claim 4,
wherein the current control unit includes:
- a driving transistor that includes a gate, a source, and a drain, one of the source and the drain being connected to the first power source line, the other of the source and the drain being connected to the other of the terminals of the luminescence element, and the driving transistor converting the signal voltage applied between the gate and the source of the driving transistor into the signal current;
- a fifth capacitive element that includes terminals, one of the terminals being connected to the gate of the driving transistor;
- a fifth switching transistor that includes a gate connected to the scanning line, one of a source and a drain connected to the one of the terminals of the fifth capacitive element, and the other of the source and drain connected to a reference power source line; and
- a sixth switching transistor that includes a gate connected to the first control line, one of a source and a drain connected to the other of the terminals of the fifth capacitive element, and the other of the source and drain connected to the source of the driving transistor, the one of the source and the drain of the first switching transistor is connected to the other of the terminals of the fifth capacitive element, and the other of the source and the drain of the first switching transistor is connected to the first signal line, and the one of the source and the drain of the second switching transistor is connected to the other of the terminals of the fifth capacitive element, and the other of the source and the drain of the second switching transistor is connected to the second signal line.

9. The display device according to claim 1,
wherein the first power source line is disposed in each of the rows, and applies a first voltage and a second voltage, the first voltage being a voltage lower than the standard voltage, and the second voltage being a voltage higher than the standard voltage, the current control unit includes:
- a driving transistor that includes a gate, a source, and a drain, one of the source and the drain being connected to the other of the terminals of the luminescence element, the other of the source and the drain being connected to the first power source line, and the driving transistor converting the signal voltage applied between the gate and the source of the driving transistor into the signal current which is a drain current of the driving transistor;
- a sixth capacitive element that includes terminals, one of the terminals being connected to the gate of the driving transistor, the other of the terminals being connected to the one of the source and the drain of the driving transistor, the sixth capacitive element holding at least a voltage corresponding to the signal voltage or the standard voltage, the other of the source and the drain of the first switching transistor is connected to the gate of the driving transistor, the other of the source and the drain of the second switching transistor is connected to the gate of the driving transistor, the display device further comprising
a control unit configured to control application of the first voltage and the second voltage in at least one of the threshold voltage detection period and the initialization period with a first timing which is the same for the pixels in the same one of the driving blocks, and control the application of the first voltage and the second voltage with a second timing different from the first timing for the pixels in different ones of the driving blocks.

10. The display device according to claim 1,
wherein the luminescence element is an electroluminescence (EL) element that produces the luminescence according to the signal voltage.

* * * * *